(12) United States Patent
Park et al.

(10) Patent No.: US 12,369,418 B2
(45) Date of Patent: Jul. 22, 2025

(54) IMAGE SENSOR

(71) Applicant: SAMSUNG ELECTRONICS CO., LTD., Suwon-si (KR)

(72) Inventors: Jong Hoon Park, Seoul (KR); Yun Ki Lee, Hwaseong-si (KR); Bum Suk Kim, Hwaseong-si (KR); Bo Mi Kim, Yeongju-si (KR); Tae Sung Lee, Hwaseong-si (KR); Yoon Gi Joung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 600 days.

(21) Appl. No.: 17/698,273

(22) Filed: Mar. 18, 2022

(65) Prior Publication Data

US 2022/0384507 A1  Dec. 1, 2022

(30) Foreign Application Priority Data

May 31, 2021 (KR) .................. 10-2021-0069965
Aug. 11, 2021 (KR) .................. 10-2021-0106135

(51) Int. Cl.
  *H10F 39/00* (2025.01)
  *H10F 39/18* (2025.01)
(52) U.S. Cl.
  CPC ......... *H10F 39/8063* (2025.01); *H10F 39/18* (2025.01); *H10F 39/8037* (2025.01); *H10F 39/8053* (2025.01); *H10F 39/811* (2025.01)
(58) Field of Classification Search
  CPC ......... H01L 27/14643; H01L 27/14621; H01L 27/14636; H01L 27/14627; H01L 27/14612; H01L 27/14685; H01L 27/14641; H01L 27/14629; H01L 27/1462; H01L 27/14607; H01L 27/14605; H01L 27/1463; H01L 27/1464; H01L 27/14645; H01L 27/14609; H01L 27/14625; H01L 27/14623; H01L 27/14603; H04N 25/11; H04N 25/704; H04N 25/589; H04N 25/585; H04N 25/46; H04N 25/134; H04N 25/42; H04N 25/583; H04N 25/13; H04N 25/533; H04N 25/58; H04N 25/702; H04N 23/67; (Continued)

(56) References Cited

U.S. PATENT DOCUMENTS 7,745,779 B2   6/2010  Conners
10,510,787 B2  12/2019 Borthakur et al.
10,910,423 B2  2/2021  Nakamoto et al.
(Continued)

*Primary Examiner* — Mouloucoulaye Inoussa
(74) *Attorney, Agent, or Firm* — Sughrue Mion, PLLC

(57) ABSTRACT

An image sensor, including a substrate having a first surface, and a second surface opposite to the first surface; a first focus pixel; a first merged pixel; a second merged pixel; a first color filter; a second color filter; a third color filter; a grid pattern separating the first to third color filters, but not overlapped by the first to third color filters; a first micro-lens disposed on the first color filter; and a second micro-lens disposed on the second and third color filters, wherein a first-third unit pixel, the first focus pixel, and a second-third unit pixel are continuously arranged along the first direction, and wherein a width of the grid pattern between the first color filter and the second color filter is greater than a width of the grid pattern between the second color filter and the third color filter.

18 Claims, 35 Drawing Sheets

(58) Field of Classification Search
CPC .............. H04N 25/745; H04N 23/672; H04N 25/7795; H04N 25/75; G09G 2300/0443
See application file for complete search history.

(56) References Cited

U.S. PATENT DOCUMENTS

| | | | |
|---|---|---|---|
| 10,950,642 B2 | 3/2021 | Lee | |
| 2008/0224246 A1* | 9/2008 | Lee | ................... H01L 27/14636 |
| | | | 438/70 |
| 2017/0077163 A1* | 3/2017 | Chou | ................. H01L 27/14605 |
| 2017/0301718 A1* | 10/2017 | Chou | ...................... G03B 13/36 |
| 2019/0214419 A9* | 7/2019 | Tayanaka | .......... H01L 27/14656 |
| 2019/0319060 A1* | 10/2019 | Do | ....................... H01L 27/1463 |
| 2020/0043962 A1 | 2/2020 | Cho | |
| 2020/0045223 A1* | 2/2020 | Pang | ................. H01L 27/14623 |
| 2020/0119072 A1* | 4/2020 | Lim | .................... H01L 27/1463 |
| 2020/0135783 A1 | 4/2020 | Lee et al. | |
| 2020/0144316 A1* | 5/2020 | Kim | .................. H01L 27/14689 |
| 2020/0235149 A1 | 7/2020 | Shiraishi et al. | |
| 2020/0258928 A1* | 8/2020 | Seo | ................... H01L 27/14627 |
| 2020/0403025 A1* | 12/2020 | Kim | .................. H01L 27/14621 |
| 2021/0120198 A1* | 4/2021 | Kim | .................. H01L 27/14685 |
| 2021/0193720 A1* | 6/2021 | Seo | ................... H01L 27/14627 |
| 2021/0327930 A1* | 10/2021 | Lim | .................. H01L 27/14636 |
| 2021/0391363 A1* | 12/2021 | Ai | ........................... H04N 25/70 |
| 2022/0013566 A1* | 1/2022 | Kim | .................. H01L 27/14636 |
| 2022/0037385 A1* | 2/2022 | Bang | ................... H01L 27/1462 |
| 2022/0038663 A1* | 2/2022 | Hoshino | ........... H01L 27/14643 |
| 2022/0165766 A1* | 5/2022 | Jeong | ............... H01L 27/14685 |
| 2022/0246659 A1* | 8/2022 | Inoue | ................ H01L 27/14623 |
| 2022/0293659 A1* | 9/2022 | Cho | ........................ H04N 25/62 |
| 2022/0377262 A1* | 11/2022 | Moon | .................. H01L 27/1463 |
| 2022/0392939 A1* | 12/2022 | Inoue | ................ H01L 27/14627 |
| 2023/0005977 A1* | 1/2023 | Yang | .................... H01L 27/1463 |
| 2023/0016604 A1* | 1/2023 | Cho | .................. H01L 27/14621 |

* cited by examiner

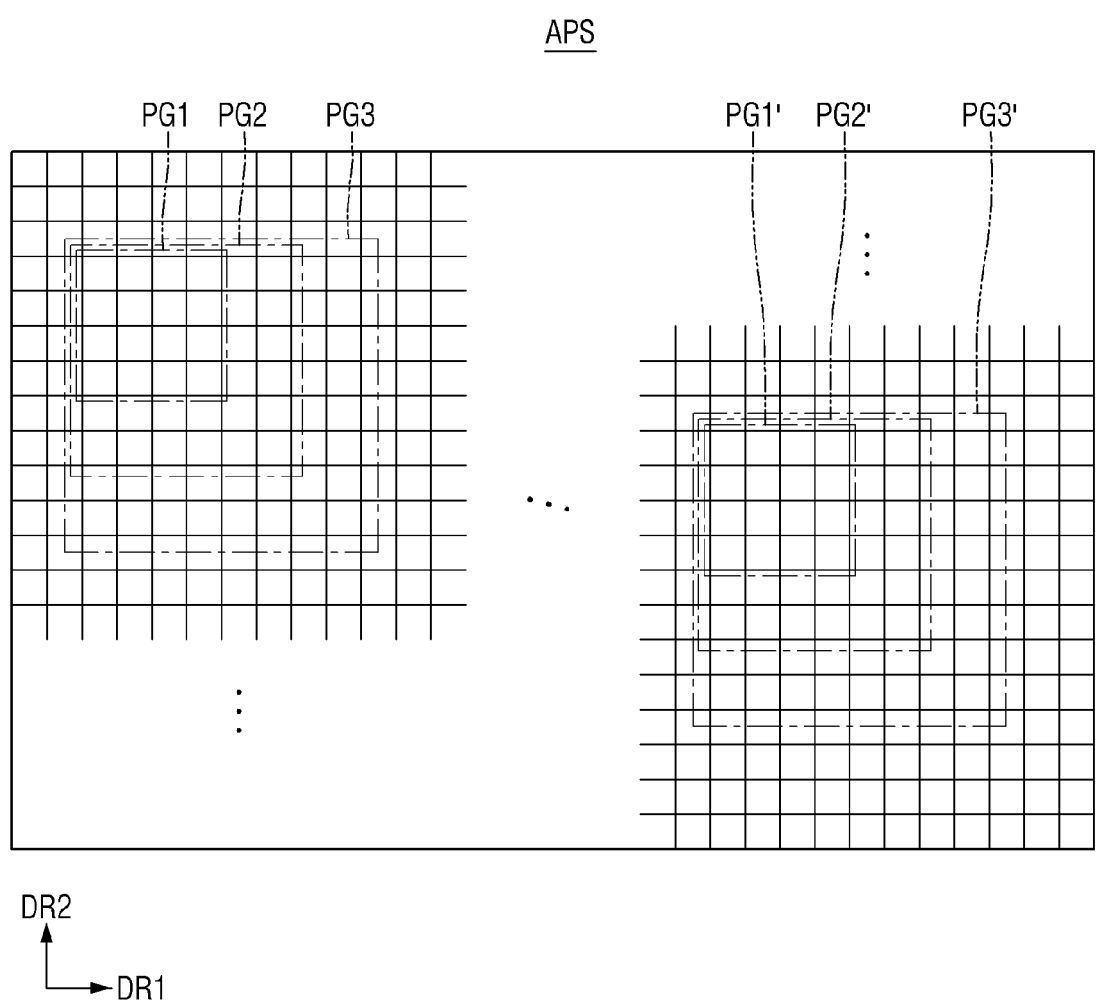

IMAGE SENSOR

CROSS-REFERENCE TO RELATED APPLICATION

This application claims priority under 35 U.S.C. § 119 to Korean Patent Application No. 10-2021-0069965 filed on May 31, 2021 and Korean Patent Application No. 10-2021-0106135 filed on Aug. 11, 2021 in the Korean Intellectual Property Office, the disclosures of which are incorporated by reference in their entireties.

BACKGROUND

1. Field

The disclosure relates to an image sensor.

2. Description of Related Art

An image sensor is a semiconductor element converting optical information into an electrical signal. Such an image sensor may include a charge coupled device (CCD) image sensor and a complementary metal-oxide semiconductor (CMOS) image sensor.

The image sensor may be configured in the form of a package. In this case, the package may be configured in a structure in which light may be incident on a photo receiving surface or a sensing area of the image sensor while protecting the image sensor.

Recently, there has been study of backside illumination (BSI) image sensors, in which incident light is illuminated through a backside of a semiconductor substrate so that pixels formed in the image sensor have improved photo receiving efficiency and light sensitivity.

SUMMARY

Provided are an image sensor with improved product reliability.

Additional aspects will be set forth in part in the description which follows and, in part, will be apparent from the description, or may be learned by practice of the presented embodiments.

In accordance with an aspect of the disclosure, an image sensor includes a substrate having a first surface, and a second surface opposite to the first surface; a first focus pixel including a first-first sub-pixel and a first-second sub-pixel arranged continuously with the first-first sub-pixel along a first direction in the substrate; a first merged pixel including a first-first unit pixel, a first-second unit pixel arranged continuously with the first-first unit pixel along the first direction, and a first-third unit pixel arranged continuously with the first-first unit pixel along a second direction perpendicular to the first direction, in the substrate; a second merged pixel including a second-first unit pixel arranged continuously with the first-second unit pixel along the first direction, a second-second unit pixel arranged continuously to the second-first unit pixel along the first direction, and a second-third unit pixel arranged continuously to the second-second unit pixel along the second direction, in the substrate; a first color filter disposed on the first surface of the substrate and overlapping the first focus pixel; a second color filter disposed on the first surface of the substrate and overlapping the first merged pixel; a third color filter disposed on the first surface of the substrate and overlapping the second merged pixel; a grid pattern disposed on the first surface of the substrate and separating the first to third color filters, but not overlapped by the first to third color filters; a first micro-lens disposed on the first color filter, and covering the first-first sub-pixel and the first-second sub-pixel; and a second micro-lens disposed on the second and third color filters, and covering the first-first unit pixel, the first-second unit pixel, the first-third unit pixel, the second-first unit pixel, the second-second unit pixel, and the second-third unit pixel, wherein the first-third unit pixel, the first focus pixel, and the second-third unit pixel are continuously arranged along the first direction, and wherein a width of the grid pattern between the first color filter and the second color filter is greater than a width of the grid pattern between the second color filter and the third color filter.

In accordance with an aspect of the disclosure, an image sensor includes a substrate having a first surface, and a second surface opposite to the first surface; a first merged pixel including a first-first unit pixel arranged continuously with a first-second unit pixel along a first direction in the substrate; a first focus pixel including a first-first sub-pixel, and a first-second sub-pixel arranged continuously with the first-first sub-pixel along the first direction, wherein the first focus pixel is arranged continuously with the first merged pixel along a second direction perpendicular to the first direction, in the substrate; a second merged pixel including second unit pixels in a first arrangement pattern having two rows and two columns, and arranged continuously with the first merged pixel and the first focus pixel along the first direction, in the substrate; a third merged pixel including third unit pixels arranged in the first arrangement pattern, and arranged continuously with the first focus pixel along the second direction, in the substrate; a fourth merged pixel including fourth unit pixels arranged in the first arrangement pattern, and arranged continuously with the third merged pixel along the first direction, in the substrate; a pixel separation pattern separating the first-first and first-second sub-pixels, the first-first and first-second unit pixels, and the second to fourth unit pixels in the substrate; a first color filter disposed on the first surface of the substrate, and overlapping the first focus pixel; a second color filter disposed on the first surface of the substrate, and overlapping the first merged pixel; a third color filter disposed on the first surface of the substrate, and overlapping the second merged pixel; a fourth color filter disposed on the first surface of the substrate, and overlapping the third merged pixel; a fifth color filter disposed on the first surface of the substrate, and overlapping the fourth merged pixel; a grid pattern disposed on the first surface of the substrate, wherein the grid pattern at least partially overlaps the pixel separation pattern and separates the first to fifth color filters, and is not overlapped by the first to fifth color filters; a first micro-lens disposed on the first color filter and covering the first-first and first-second sub-pixels; and a second micro-lens disposed on the second to fifth color filters and covering the first-first and first-second unit pixels, the third unit pixels, and the fourth unit pixels, wherein a color of the first color filter is same as a color of the second and fifth color filters or a color of the third and fourth color filters.

In accordance with an aspect of the disclosure, an image sensor includes a substrate having a first surface, and a second surface opposite to the first surface; a first merged pixel including a first-first unit pixel and a first-second unit pixel continuously arranged along a first direction, and a first-third unit pixel and a first-fourth unit pixel continuously arranged along the first direction, in the substrate; a second merged pixel including a second-first unit pixel and a second-second unit pixel continuously arranged along the first direction, and a second-third unit pixel and a second-fourth unit pixel continuously arranged along the first direction, and arranged continuously with the first merged pixel along the first direction, in the substrate; a third unit pixel, a first focus pixel, and a fourth unit pixel continuously arranged along the first direction in the substrate; a fifth unit pixel, a second focus pixel, and a sixth unit pixel continuously arranged along the first direction in the substrate; a plurality of color filters formed on the first surface of the substrate, wherein a first color filter of the plurality of color filters overlaps the first focus pixel, a second color filter of the plurality of color filters overlaps the second focus pixel, a third color filter of the plurality of color filters overlaps the first merged pixel, a fourth color filter of the plurality of color filters overlaps the second merged pixel, a fifth color filter of the plurality of color filters overlaps the third unit pixel, a sixth color filter of the plurality of color filters overlaps the fourth unit pixel, a seventh color filter of the plurality of color filters overlaps the fifth unit pixel, and an eighth color filter of the plurality of color filters overlaps the sixth unit pixel; a grid pattern formed on the first surface of the substrate and separating the first to eighth color filters, but not overlapped by the first to eighth color filters; and micro-lenses formed on the first to eighth color filters and covering each of the first focus pixel, the first-first to first-fourth unit pixels, the second-first to second-fourth unit pixels, the third unit pixel, the first focus pixel, the fourth unit pixel, the fifth unit pixel, the second focus pixel, and the sixth unit pixel; wherein the first focus pixel includes first-first sub-pixel and a first-second sub-pixel continuously arranged along the first direction, wherein the second focus pixel includes a second-first sub-pixel and a second-second sub-pixel continuously arranged along the first direction, wherein the fifth unit pixel, the third unit pixel, the first-third unit pixel, and the first-first unit pixel are continuously arranged along a second direction perpendicular to the first direction, wherein the sixth unit pixel, the fourth unit pixel, the second-fourth unit pixel, and the second-second unit pixel are continuously arranged along the second direction, and wherein a color of the first and second color filters is same as a color of the fourth, fifth, and seventh color filters, or a color of the third, sixth, and eighth color filters.

In accordance with an aspect of the disclosure, an image sensor includes a substrate having a first surface, and a second surface opposite to the first surface; a first focus pixel including a plurality of first sub-pixels; a first merged pixel included in the substrate, the first merged pixel including a plurality of first unit pixels; a second merged pixel included in the substrate, the second merged pixel including a plurality of second unit pixels; a first color filter disposed on the first surface of the substrate and overlapping the first focus pixel; a second color filter disposed on the first surface of the substrate and overlapping the first merged pixel; a third color filter disposed on the first surface of the substrate and overlapping the second merged pixel; a grid pattern disposed on the first surface of the substrate, wherein the grid pattern separates the first color filter from the second color filter, separates the first color filter from the third color filter, and separates the second color filter from the third color filter, and wherein the grid pattern is not overlapped by the first color filter, the second color filter, or the third color filters; a first plurality of micro-lenses disposed on the first color filter, and covering the plurality of first sub-pixels; and a second plurality of micro-lenses disposed on the second color filter, and covering the plurality of first unit pixels, a third plurality of micro-lenses disposed on the third color filter, and covering the plurality of second unit pixels, wherein a width of the grid pattern between the first color filter and the second color filter is greater than a width of the grid pattern between the second color filter and the third color filter.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects, features, and advantages of certain embodiments of the present disclosure will be more apparent by from the following description taken in conjunction with the accompanying drawings, in which:

FIG. 3 is a schematic layout diagram for describing a photo receiving region of the image sensor according to an embodiment;

DETAILED DESCRIPTION OF THE EMBODIMENTS

Figure 1:
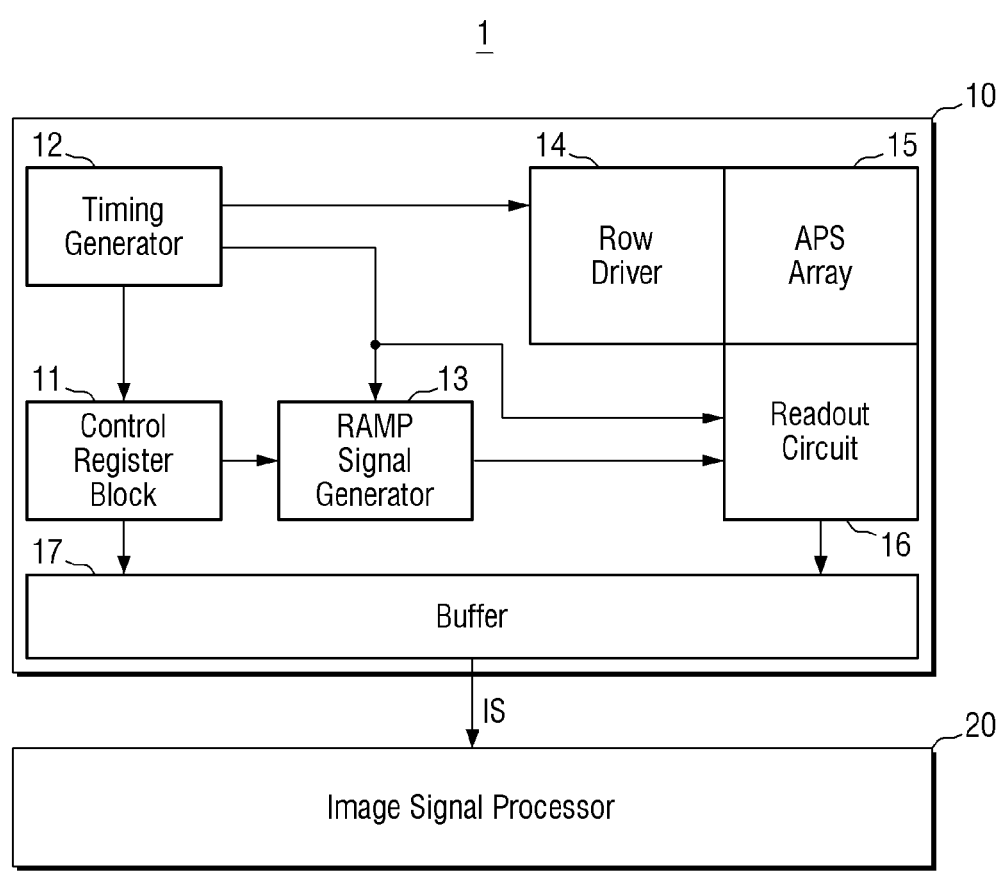
FIG. 1 is a block diagram for describing an image sensing device according to an embodiment.

As is traditional in the field, embodiments may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a block diagram for describing an image sensing device according to some exemplary embodiments.

Referring to FIG. 1, an image sensing device 1 according to some exemplary embodiments may include an image sensor 10 and an image signal processor 20.

The image sensor 10 may sense an image of a target to be sensed using light to generate an image signal IS. In some exemplary embodiments, the generated image signal IS may be, for example, a digital signal, but an exemplary embodiment of the present disclosure is not limited thereto.

The image signal IS may be provided to and processed by the image signal processor 20. The image signal processor 20 may receive the image signal IS output from a buffer 17 of the image sensor 10, and process the received image signal IS so as to be easily displayed.

In some exemplary embodiments, the image signal processor 20 may perform digital binning on the image signal IS output from the image sensor 10. In this case, the image signal IS output from the image sensor 10 may be a raw image signal from an active pixel sensor (APS) array 15 without analog binning or may be an image signal IS on which analog binning has already been performed.

In some exemplary embodiments, the image sensor 10 and the image signal processor 20 may be disposed to be separated from each other as illustrated in FIG. 1. For example, the image sensor 10 and the image signal processor 20 may be mounted on a first chip and a second chip, respectively, and communicate with each other through a predetermined interface. However, exemplary embodiments are not limited thereto, and the image sensor 10 and the image signal processor 20 may be implemented as one package, for example, a multi-chip package (MCP).

The image sensor 10 may include the active pixel sensor array 15, a control register block 11, a timing generator 12, a row driver 14, a readout circuit 16, a ramp signal generator 13, and the buffer 17.

The control register block 11 may generally control an operation of the image sensor 10. In particular, the control register block 11 may directly transmit operation signals to the timing generator 12, the ramp signal generator 13, and the buffer 17.

The timing generator 12 may generate an operation timing reference signal for several components of the image sensor 10. The operation timing reference signal generated by the timing generator 12 may be transmitted to the ramp signal generator 13, the row driver 14, the readout circuit 16, and the like.

The ramp signal generator 13 may generate a ramp signal used for the readout circuit 16 and transmit the generated ramp signal to the readout circuit 16. For example, the readout circuit 16 may include a correlated double sampler (CDS), a comparator, and the like, and the ramp signal generator 13 may generate a ramp signal used for the correlated double sampler, the comparator, and the like, and transmit the generated ramp signal to the correlated double sampler, the comparator, and the like.

The row driver 14 may selectively activate rows of the active pixel sensor array 15.

The active pixel sensor array 15 may sense an external image. The active pixel sensor array 15 may include a plurality of pixels.

The readout circuit 16 may sample a pixel signal provided from the active pixel sensor array 15, compare the sampled pixel signal with the ramp signal, and then convert an analog image signal (data) into a digital image signal (data) based on a comparison result.

The buffer 17 may include, for example, a latch unit. The buffer 17 may temporarily store an image signal IS to be provided to the outside, and may transmit the image signal IS to an external memory or an external device.

Figure 2:
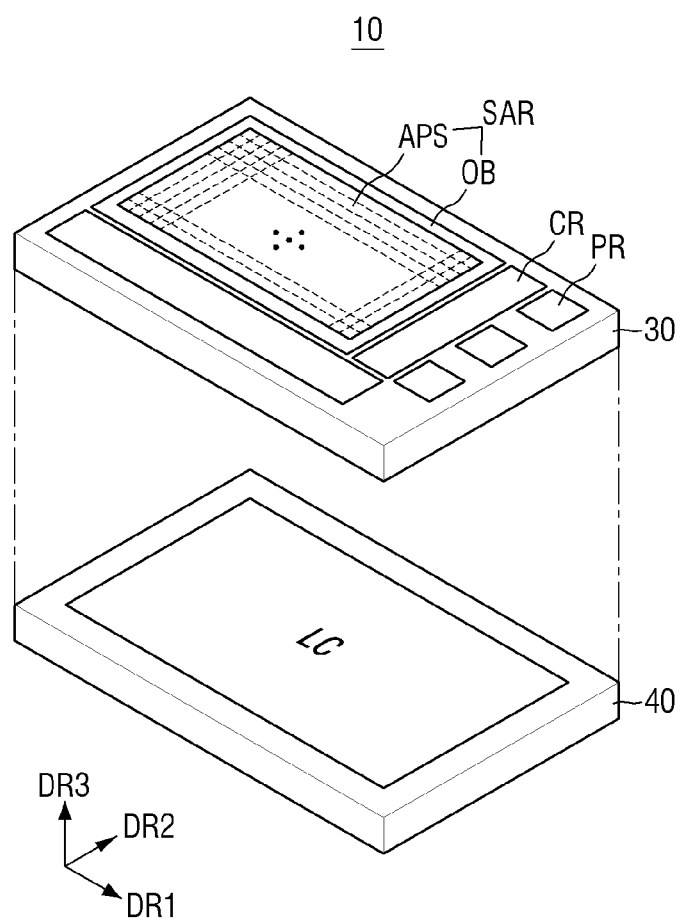
FIG. 2 is a block diagram for describing an image sensor according an embodiment.

FIG. 2 is a block diagram for describing an image sensor according to some exemplary embodiments.

Referring to FIG. 2, the image sensor 10 according to the present exemplary embodiment may include a first chip 30 and a second chip 40 that are stacked. The first chip 30 may be stacked on the second chip 40 in a third direction DR3, for example.

The first chip 30 may include a sensor array region SAR, a connection region CR, and a pad region PR.

The sensor array region SAR may include a region corresponding to the active pixel sensor array 15 of FIG. 1. For example, a plurality of pixels that are arranged two-dimensionally (e.g., in a matrix form) may be disposed in the sensor array region SAR. The sensor array region SAR may include a photo receiving region APS and a light blocking region OB. Active pixels receiving light to generate active signals may be arranged in the photo receiving region APS. Optical black pixels blocking light to generate optical black signals may be arranged in the light blocking region OB. The light blocking region OB may be formed, for example, along the periphery of the photo receiving region APS, but this is only an example.

In some exemplary embodiments, a photoelectric conversion layer may not be formed in a portion of the light blocking region OB. In addition, in some exemplary embodiments, dummy pixels may be formed in the photo receiving region APS adjacent to the light blocking region OB.

The connection region CR may be formed in the periphery of the sensor array region SAR. The connection region CR may be formed on one side of the sensor array region SAR, but this is only an example. Wirings may be formed in the connection region CR to transmit and receive electrical signals of the sensor array region SAR.

The pad region PR may be formed in the periphery of the sensor array region SAR. The pad region PR may be formed adjacent to an edge of the image sensor according to some exemplary embodiments, but this is only an example. The pad region PR may be connected to an external device or the like to transmit/receive electrical signals between the image sensor according to some exemplary embodiments and the external device.

It has been illustrated in FIG. 2 that the connection region CR is interposed between the sensor array region SAR and the pad region PR, but this is only an example. According to embodiments, the sensor array region SAR, the connection region CR, and the pad region PR may be disposed in various different arrangements.

The second chip 40 may be disposed under the first chip 30 and may include a logic circuit region LC. The second chip 40 may be electrically connected to the first chip 30. The logic circuit region LC of the second chip 18 may be electrically connected to the sensor array region SAR through, for example, the pad region PR of the first chip 30.

The logic circuit region LC may include a plurality of elements for driving the sensor array region SAR. The logic circuit region LC may include, for example, the control register block 11, the timing generator 12, the ramp signal generator 13, the row driver 14, the readout circuit 16, and the like of FIG. 1.

Figure 4A:
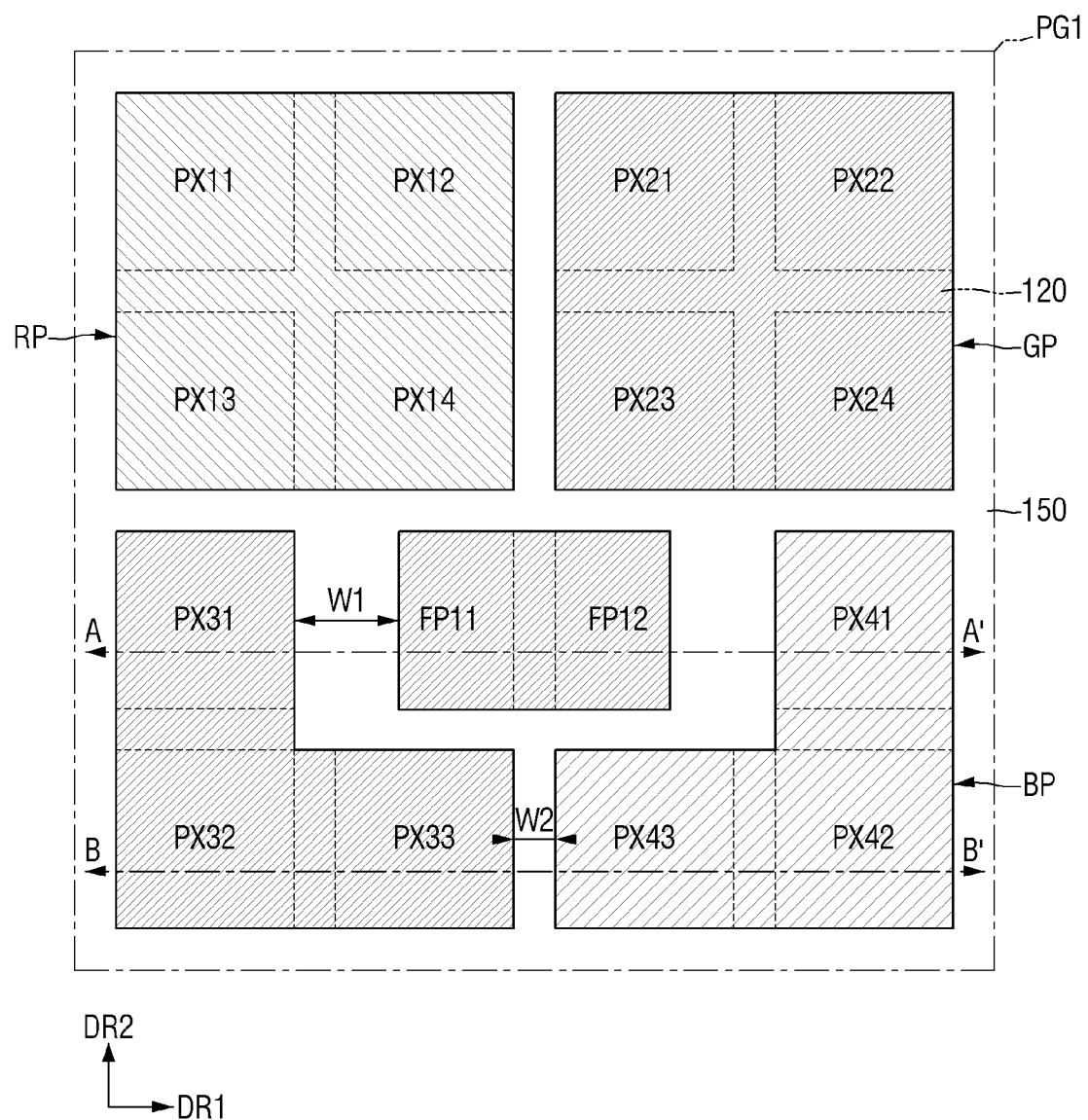
FIG. 4A is an exemplary partial layout diagram for describing a first pixel group disposed in a first region of FIG. 3, according to an embodiment.
Figure 4B:
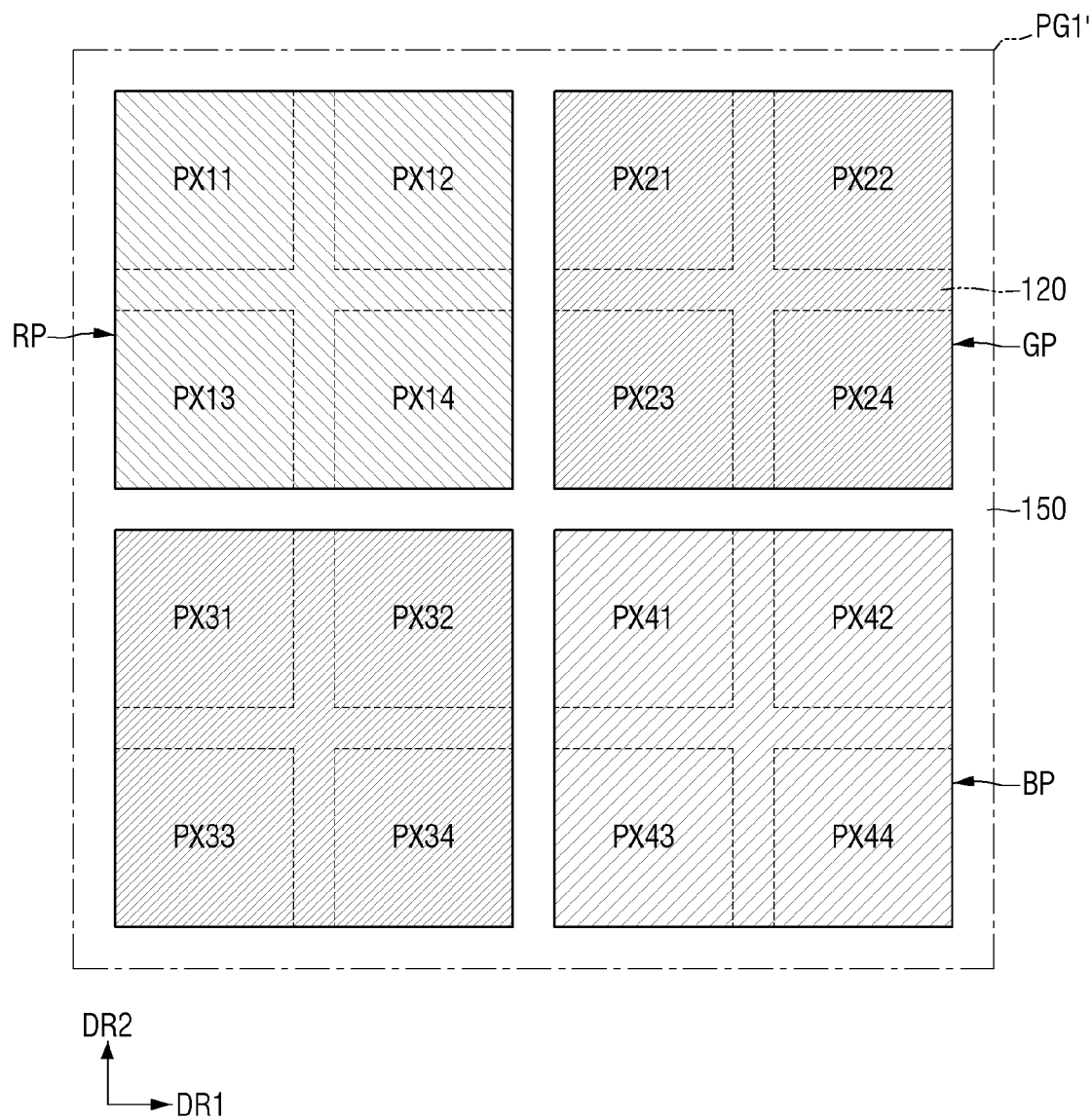
FIG. 4B is an exemplary partial layout diagram for describing a first pixel group disposed in a second region of FIG. 3, according to an embodiment.
Figure 5A:
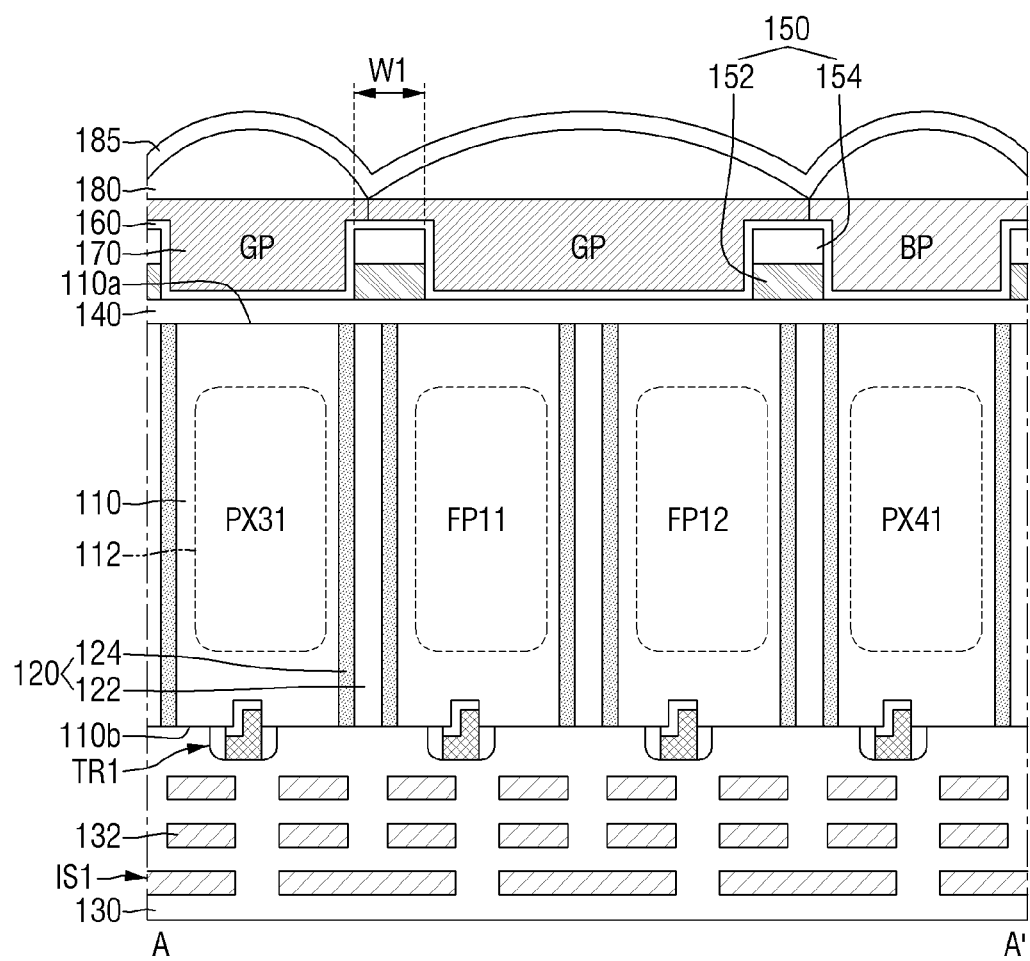
FIG. 5A is a cross-sectional view taken along line A-A' of FIG. 4A, according to an embodiment.
Figure 5B:
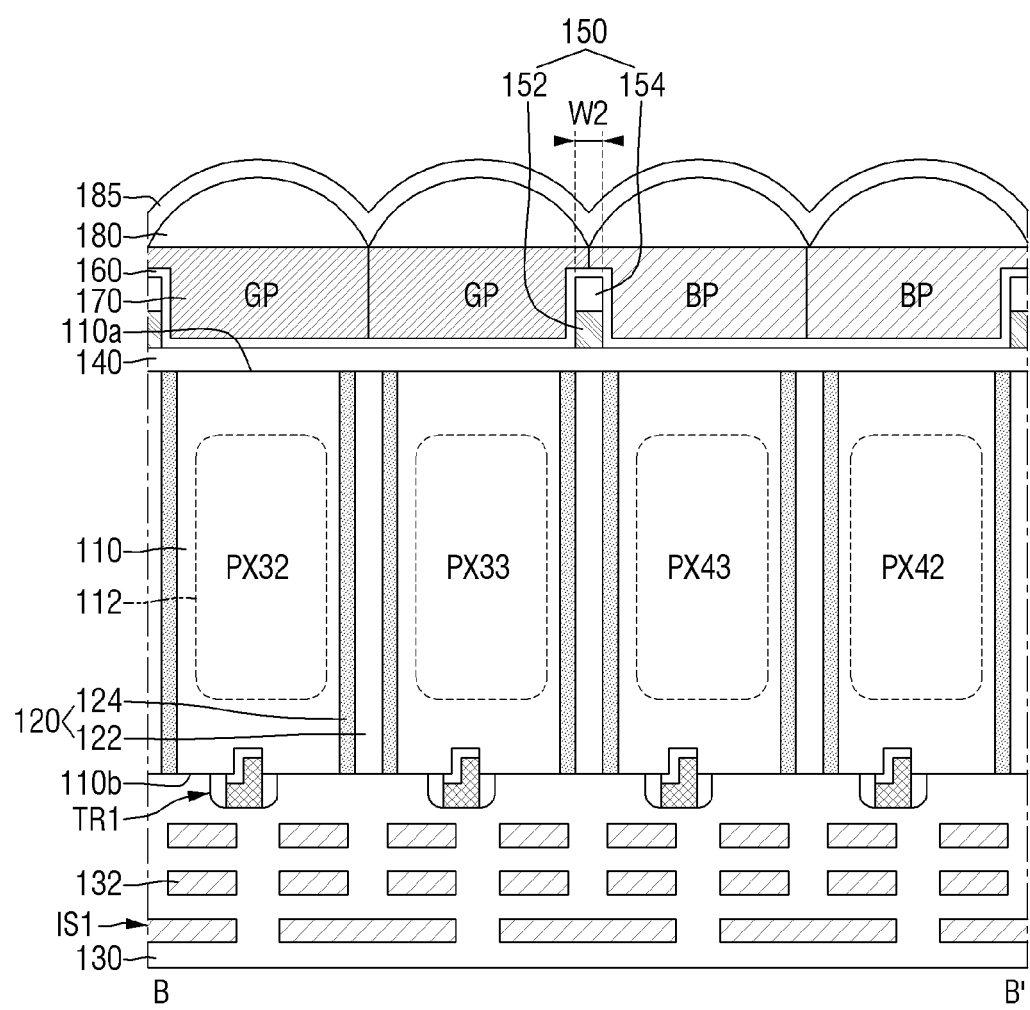
FIG. 5B is a cross-sectional view taken along line B-B' of FIG. 4A, according to an embodiment.

FIG. 3 is a schematic layout diagram for describing a photo receiving region of the image sensor according to some exemplary embodiments. FIG. 4A is an exemplary partial layout diagram for describing a first pixel group disposed in a first region of FIG. 3. FIG. 4B is an exemplary partial layout diagram for describing a first pixel group disposed in a second region of FIG. 3. FIG. 5A is a cross-sectional view taken along line A-A' of FIG. 4A. FIG. 5B is a cross-sectional view taken along line B-B' of FIG. 4A.

Referring to FIG. 3, a plurality of pixels receiving light to generate electrical signals may be disposed in the photo receiving region APS of the image sensor according to some exemplary embodiments. The plurality of pixels may be arranged two-dimensionally (e.g., in a matrix form) on a plane including a first direction DR1 and a second direction DR2.

The photo receiving region APS may include pixel groups PG1, PG2, and PG3 disposed in a first region and pixel groups PG1', PG2', and PG3' disposed in a second region different from the first region.

Referring to FIG. 4A, a first pixel group PG1 disposed in the first region may include first focus pixels FP11 and PF12, a first merged pixel PX11 to PX14, a second merged pixel PX21 to PX24, a third merged pixel PX31 to PX33, and a fourth merged pixel PX41 to PX43. That is, the first region may be a region including the first focus pixels FP11 and FP12.

The first merged pixel PX11 to PX14 may include first unit pixels PX11 to PX14 arranged in two rows and two columns. First-first unit pixel PX11 and first-second unit pixel PX12 may be continuously arranged along the first direction DR1, and first-third unit pixel PX13 and first-fourth unit pixel PX14 may be continuously arranged along the first direction DR1. The first-third and first-first unit pixels PX13 and PX11 may be continuously arranged along the second direction DR2, and the first-fourth and first-second unit pixels PX14 and PX12 may be continuously arranged along the second direction DR2. The first direction DR1 may be a row direction, and the negative direction along the second direction DR2 may be a column direction.

In embodiments, when two unit pixels are "continuously arranged" this may mean that there are no other unit pixels disposed between the two unit pixels.

The first merged pixel PX11 to PX14 may share a first color filter RP, and receive light passing through the first color filter RP to generate an electrical signal.

The first merged pixel PX11 to PX14 and the second merged pixel PX21 to PX24 may be continuously arranged along the first direction DR1. The second merged pixel PX21 to PX24 may include second unit pixels PX21 to PX24 arranged in two rows and two columns.

The second merged pixel PX21 to PX24 may share a second color filter GP, and receive light passing through the second color filter GP to generate an electrical signal.

The third merged pixel PX31 to PX33 and the first merged pixel PX11 to PX14 may be continuously arranged along the second direction DR2. The third merged pixel PX31 to PX33 may include third unit pixels PX31 to PX33. A third-first unit pixel PX31 and the first-third unit pixel PX13 may be continuously arranged in the second direction DR2. Third-second unit pixel PX32 and third-first unit pixel PX31 may be continuously arranged along the second direction DR2, and third-second unit pixel PX32 and third-third unit pixel PX33 may be continuously arranged along the first direction DR1.

The third merged pixel PX31 to PX33 may share a second color filter GP, and receive light passing through the second color filter GP to generate an electrical signal.

The fourth merged pixel PX41 to PX43 and the second merged pixel PX21 to PX24 may be continuously arranged along the second direction DR2. The fourth merged pixel PX41 to PX43 may include fourth unit pixels PX41 to PX43. A fourth-first unit pixel PX41 and a second-fourth unit pixel PX24 may be continuously arranged along the second direction DR2. Fourth-second unit pixel PX42 and fourth-first unit pixel PX41 may be continuously arranged along the second direction DR2, and fourth-third unit pixel PX43 and fourth-second unit pixel PX42 may be continuously arranged along the first direction DR1.

The fourth merged pixel PX41 to PX43 may share a third color filter BP, and receive light passing through the third color filter BP to generate an electrical signal.

The first focus pixels FP11 and FP12 may be disposed between the third merged pixel PX31 to PX33 and the fourth merged pixel PX41 to PX43 in the first direction DR1. The first focus pixels FP11 and FP12 may include first-first sub-pixel FP11 and first-second sub-pixel FP12 arranged in one row and two columns. The third-first unit pixel PX31, the first sub-pixels FP11 and FP12, and the fourth-first unit pixel PX41 may be continuously arranged along the first direction DR1.

A position and the number of first focus pixels FP11 and FP12 are not limited thereto. For example, the first focus pixels FP11 and FP12 may also be disposed at positions of the third-third and fourth-third unit pixels PX33 and PX43 in FIG. 4A, and the third-third and fourth-third unit pixels PX33 and PX43 may also be disposed at positions of the first focus pixels FP11 and FP12 in FIG. 4A.

The first focus pixels FP11 and FP12 may perform an auto focus (AF) function. The auto focus function may be performed using phase detection AF (PDAF) using the first sub-pixels FP11 and FP12.

The first focus pixels FP11 and FP12 may share the second color filter GP with each other, and receive light passing through the second color filter GP to generate electrical signals.

In some exemplary embodiments, the first color filter RP, the second color filter GP, and the third color filter BP may filter different colors. As an example, the first color filter RP may be a red color filter, the second color filter GP may be a green color filter, and the third color filter BP may be a blue color filter.

In some exemplary embodiments, the first color filter RP, the second color filter GP, and the third color filter BP may be arranged in the form of a Bayer pattern. For example, two second color filters GP may be arranged along a diagonal direction rather than the first direction DR1 and the second direction DR2. The first color filter RP may be arranged along the first direction DR1 together with one second color filter GP, and may be arranged along the second direction DR2 together with the other second color filter GP. In addition, the third color filter BP may be arranged along the second direction DR2 together with one second color filter GP, and may be arranged along the first direction DR1 together with the other second color filter GP. The first color filter RP and the third color filter BP may be arranged along a diagonal direction rather than the first direction DR1 and the second direction DR2.

In some exemplary embodiments, a grid pattern 150 may separate the second color filter GP disposed on the first focus pixels FP11 and FP12, and the first to third color filters RP, GP, and BP disposed on the first merged pixel PX11 to PX14, the second merged pixel PX21 to PX24, the third merged pixel PX31 to PX33, and the fourth merged pixel PX41 to PX44. Hereinafter, a detailed description will be provided with reference to FIGS. 4A, 5A and 5B.

Referring to FIGS. 4A, 5A and 5B, the image sensor according to some exemplary embodiments may include a first substrate 110, photoelectric conversion layers 112, a first pixel separation pattern 120, first electronic elements TR1, a first interconnection structure IS1, a surface insulating film 140, color filters 170, a grid pattern 150, and micro-lenses 180.

The first substrate 110 may be a semiconductor substrate. For example, the first substrate 110 may be bulk silicon or silicon-on-insulator (SOI). The first substrate 110 may be a silicon substrate or may include other materials, for example, silicon germanium, indium antimonide, lead tellurium compound, indium arsenide, indium phosphide, gallium arsenide, or gallium antimonide. In embodiments, the first substrate 110 may be a substrate in which an epitaxial layer is formed on a base substrate.

The first substrate 110 may have a first surface 110a and a second surface 110b that are opposite to each other. In exemplary embodiments to be described below, the first surface 110a may be referred to as a back side of the first substrate 110, and the second surface 110b may be referred to as a front side of the first substrate 110 In some exemplary embodiments, the first surface 110a of the first substrate 110 may be a photo receiving surface on which light is incident. That is, the image sensor according to some exemplary embodiments may be a backside illumination (BSI) image sensor.

The photoelectric conversion layers 112 may be formed in the first substrate 110. A plurality of photoelectric conversion layers 112 may be arranged to correspond to the pixels FP11, FP12, PX11 to PX14, PX21 to PX24, PX31 to PX33, and PX41 to PX43. For example, the photoelectric conversion layers 112 may be arranged two-dimensionally (e.g., in a matrix form) on a plane including the first direction DR1 and the second direction DR2 and be disposed in the pixels FP11, FP12, PX11 to PX14, PX21 to PX24, PX31 to PX33, and PX41 to PX43, respectively. The photoelectric conversion layer 112 may generate electric charges in proportion to an amount of light incident from the outside.

The photoelectric conversion layer 112 may be formed by doping the first substrate 110 with impurities. For example, the photoelectric conversion layer 112 may be formed by implanting n-type impurity ions into the first substrate 110, which is a p-type substrate. In some exemplary embodiments, the photoelectric conversion layer 112 may have a potential gradient on a surface (e.g., in a direction crossing the first surface 110a or the second surface 110b) of the first substrate 110. For example, a concentration of the impurities in the photoelectric conversion layer 112 may decrease from the second surface 110b toward the first surface 110a.

The photoelectric conversion layer 112 may include, for example, at least one of a photo diode, a photo transistor, a photo gate, a pinned photo diode, an organic photo diode, a quantum dot, and combinations thereof, but is not limited thereto.

The first pixel separation pattern 120 may be formed in the first substrate 110. The first pixel separation pattern 120 may define the first sub-pixels FP11 and FP12, the first unit pixels PX11 to PX14, the second unit pixels PX21 to PX24, the third unit pixels PX31 to PX33, and the fourth unit pixels PX41 to PX43 in the first substrate 110. For example, the first pixel separation pattern 120 may be formed in a grid shape in plan view and surround the first sub-pixels FP11 and FP12, the first unit pixels PX11 to PX14, the second unit pixels PX21 to PX24, the third unit pixels PX31 to PX33, and the fourth unit pixels PX41 to PX43 arranged in a matrix form.

In some exemplary embodiments, the first pixel separation pattern 120 may penetrate through the first substrate 110. For example, the first pixel separation pattern 120 may continuously extend from the second surface 110b of the first substrate 110 to the first surface 110a of the first substrate 110.

In some exemplary embodiments, a width of the first pixel separation pattern 120 in the first direction DR1 may be constant as the first pixel separation pattern 120 becomes distant from the second surface 110b of the first substrate 110. In embodiments, the terms "constant" or "same" mean completely the same, or also may mean similar, for example including some differences, such as a fine difference that may occur due to a margin in a process, or the like.

In exemplary embodiments, a width of the first pixel separation pattern 120 may decrease as the first pixel separation pattern 120 becomes distant from the second surface 110b of the first substrate 110. This may be due to characteristics of an etching process for forming the first pixel separation pattern 120. For example, a process of etching the first substrate 110 in order to form the first pixel separation pattern 120 may be performed on the second surface 110b of the first substrate 110.

In some exemplary embodiments, the first pixel separation pattern 120 may include a conductive filling pattern 122 and an insulating spacer film 124. The conductive filling pattern 122 may penetrate through the first substrate 110, and the insulating spacer film 124 may be disposed between the conductive filling pattern 122 and the first substrate 110.

For example, in the first substrate 110, an isolation trench defining the first sub-pixels FP11 and FP12, the first unit pixels PX11 to PX14, the second unit pixels PX21 to PX24, the third unit pixels PX31 to PX33, and the fourth unit pixels PX41 to PX43 may be formed. The insulating spacer film 124 may extend along a side surface of the isolation trench. The conductive filling pattern 122 may be formed on the insulating spacer film 124 to fill the remaining region of the isolation trench. The insulating spacer film 124 may electrically insulate the conductive filling pattern 122 from the first substrate 110.

The conductive filling pattern 122 may include, for example, polysilicon (poly-Si), but is not limited thereto. In some exemplary embodiments, a ground voltage or a negative voltage may be applied to the conductive filling pattern 122. In this case, an electrostatic discharge (ESD) bruise defect of the image sensor may be effectively prevented. Here, the ESD bruise defect refers to a phenomenon in which electric charges generated by ESD or the like are accumulated on the first substrate 110 to generate a mura such as a bruise in an image.

The insulating spacer film 124 may include, for example, at least one of silicon oxide, aluminum oxide, tantalum oxide, and combinations thereof, but is not limited thereto. In some exemplary embodiments, the insulating spacer film 124 may include a low refractive index material having a refractive index lower than that of the first substrate 110. In this case, the insulating spacer film 124 may refract or reflect light obliquely incident on the photoelectric conversion layer 112 to improve light condensing efficiency, thereby improving a quality of the image sensor. In addition, the insulating spacer films 124 may prevent photocharges generated in specific pixels FP11, FP12, PX11 to PX14, PX21 to PX24, PX31 to PX33, and PX41 to PX43 by incident light from moving to adjacent pixels FP11, FP12, PX11 to PX14, PX21 to PX24, PX31 to PX33, and PX41 to PX43 due to random drift.

The first electronic elements TR1 may be formed on the second surface 110b of the first substrate 110. The first electronic elements TR1 may configure various transistors for processing electrical signals generated from the pixels FP11, FP12, PX11 to PX14, PX21 to PX24, PX31 to PX33, and PX41 to PX43. For example, the first electronic elements TR1 may include transistors such as transfer transistors, reset transistors, source follower transistors, or selection transistors.

In some exemplary embodiments, the first electronic elements TR1 may include vertical transfer transistors. For example, portions of the first electronic elements TR1 including the transfer transistors may extend into the first substrate 110. Such transfer transistors TG may decrease areas of the pixels FP11, FP12, PX11 to PX14, PX21 to PX24, PX31 to PX33, and PX41 to PX43 to enable high integration of the image sensor.

The first interconnection structure IS1 may be formed on the second surface 110b of the first substrate 110. The first interconnection structure IS1 may include one or a plurality of wirings. For example, the first interconnection structure IS1 may include a first inter-wiring insulating film 130 and a plurality of first wirings 132 in the first inter-wiring insulating film 130. In FIGS. 5A and 5B, the number of layers, a disposition, and the like, of wirings included in the first interconnection structure IS1 are only an example, and embodiments are not limited thereto.

In some exemplary embodiments, the first wirings 132 may be electrically connected to the pixels FP11, FP12, PX11 to PX14, PX21 to PX24, PX31 to PX33, and PX41 to PX43. For example, the first wirings 132 may be connected to the first electronic elements TR1.

The surface insulating film 140 may be formed on the first surface 110a of the first substrate 110. The surface insulating film 140 may extend along the first surface 110a of the first substrate 110. The surface insulating film 140 may include, for example, at least one of silicon oxide, silicon nitride, silicon oxynitride, aluminum oxide, hafnium oxide, and combinations thereof, but embodiments are not limited thereto.

In some exemplary embodiments, the surface insulating film 140 may be formed as multiple films. As an example, the surface insulating film 140 may include an aluminum oxide film, a hafnium oxide film, a silicon oxide film, a silicon nitride film, and a hafnium oxide film sequentially stacked on the first surface 110a of the first substrate 110.

The surface insulating film 140 may function as an anti-reflection film to prevent reflection of light incident on the first substrate 110. Accordingly, a light reception rate of the photoelectric conversion layer 112 may be improved. In addition, the surface insulating film 140 may function as a planarization film, such that color filters 170 and microlenses 180 to be described later may be formed at uniform heights.

The color filters 170 may be formed on the first surface 110a of the first substrate 110. For example, the color filters 170 may be formed on the surface insulating film 140. A plurality of color filters 170 may be arranged two-dimensionally (e.g., in a matrix form) on a plane including the first direction DR1 and the second direction DR2. The first color filter RP may be disposed on the first merged pixel PX11 to PX14, the second color filters GP may be disposed on the first focus pixel FP11 and FP12, the second merged pixel PX21 to PX24, and the third merged pixel PX31 to PX33, and the third color filter BP may be disposed on the fourth merged pixel PX41 to PX44.

The grid pattern 150 may be formed on the first surface 110a of the first substrate 110. For example, the grid pattern 150 may be formed on the surface insulating film 140.

The grid pattern 150 may surround the first focus pixels FP11 and FP12 in plan view. The grid pattern 150 may surround the second color filter GP disposed on the first focus pixels FP11 and FP12. Accordingly, the second color filter GP disposed on the first focus pixels FP11 and FP12 may be separated from the peripheral color filters 170 by the grid pattern 150.

In some exemplary embodiments, the grid pattern 150 may be disposed between color filters neighboring to each other and having different color filters, and may not be disposed between color filters neighboring to each other and having the same color filter.

The grid pattern 150 may be formed in a grid shape in plan view to surround the first focus pixels FP11 and FP12, the first merged pixel PX11 to PX14, the second merged pixel PX21 to PX24, the third merged pixel PX31 to PX33, and the fourth merged pixel PX41 to PX43, and may not be disposed inside the first focus pixels FP11 and FP12, the first merged pixel PX11 to PX14, the second merged pixel PX21 to PX24, the third merged pixel PX31 to PX33, and the fourth merged pixel PX41 to PX43. For example, the grid pattern 150 may be formed to overlap the first pixel separation pattern 120 between the first focus pixels FP11 and FP12, the first merged pixel PX11 to PX14, the second merged pixel PX21 to PX24, the third merged pixel PX31 to PX33, and the fourth merged pixel PX41 to PX43. Accordingly, the first color filter RP on the first merged pixel PX11 to PX14, the second color filter GP on the first focus pixels FP11 and FP12, the second color filter GP on the second merged pixel PX21 to PX24, the second color filter GP on the third merged pixel PX31 to PX33, and the third color filter BP on the fourth merged pixel PX41 to PX44 may be separated or partially separated from each other.

In some exemplary embodiments, a width W1 between the first focus pixels FP11 and FP12 and the merged pixels PX11 to PX14, PX21 to PX24, PX31 to PX33, and PX41 to PX43 in the first direction DR1 may be greater than a width W2 between the merged pixels PX11 to PX14, PX21 to PX24, PX31 to PX33, and PX41 to PX43.

For example, a width W1 of the grid pattern 150 in the first direction DR1 between the first focus pixels FP11 and FP12 and the third merged pixel PX31 to PX33 may be greater than a width W2 of the grid pattern 150 in the first direction DR1 between the first focus pixels FP11 and FP12 and the fourth merged pixel PX41 to PX43. That is, a width W1 of the grid pattern 150 between a first-first sub-pixel FP11 and the third-first unit pixel PX31 may be greater than a width W2 of the grid pattern 150 between a first-second sub-pixel FP12 and the fourth-first unit pixel PX41. Accordingly, separation ratio characteristics of a phase difference of the first focus pixels FP11 and FP12 may be improved.

The first sub-pixels FP11 and FP12 may share the second color filter GP with each other, the first unit pixels PX11 to PX14 may share the first color filter RP with each other, the second unit pixels PX21 to PX24 may share the second color filter GP with each other, the third unit pixels PX31 to PX33 may share the second color filter GP with each other, and the fourth unit pixels PX41-PX43 may share the third color filter BP with each other.

In some exemplary embodiments, the grid pattern 150 may penetrate through a portion of the color filter 170, and an upper surface of the grid pattern 150 may be disposed on a level below an upper surface of the color filter 170. In embodiments, the grid pattern 150 penetrates through the color filter 170, such that an upper surface of the grid pattern 150 may be disposed on substantially the same plane as an upper surface of the color filter 170.

In some exemplary embodiments, the grid pattern 150 may include a metal pattern 152 and a low refractive index pattern 154. The metal pattern 152 and the low refractive index pattern 154 may be sequentially stacked on the surface insulating film 140.

The metal pattern 152 may include, for example, at least one of titanium (Ti), titanium nitride (TiN), tantalum (Ta), tantalum nitride (TaN), tungsten (W), aluminum (Al), copper (Cu), and combinations thereof, but is not limited thereto. In some exemplary embodiments, the metal pattern 152 may prevent electric charges generated by ESD or the like from accumulating on a surface (e.g., the first surface 110a) of the first substrate 110 to effectively prevent an ESD bruise defect.

The low refractive index pattern 154 may include a low refractive index material having a refractive index lower than that of silicon (Si). For example, the low refractive index pattern 154 may include at least one of silicon oxide, aluminum oxide, tantalum oxide, and combinations thereof, but is not limited thereto. The low refractive index pattern 154 may refract or reflect obliquely incident light to improve light condensing efficiency, thereby improving a quality of the image sensor.

In some exemplary embodiments, a first passivation film 160 may be further formed on the surface insulating film 140 and the grid pattern 150. For example, the first passivation film 160 may conformally extend along profiles of an upper surface of the surface insulating film 140 and side surfaces and an upper surface of the grid pattern 150. The first passivation film 160 may be interposed between the surface insulating film 140 and the color filters 170 and between the grid pattern 150 and the color filters 170.

The first passivation film 160 may prevent damage to the surface insulating film 140 and the grid pattern 150. The first passivation film 160 may include, for example, aluminum oxide, but is not limited thereto.

The micro-lenses 180 may be formed on the first surface 110a of the first substrate 110. For example, the micro-lenses 180 may be formed on the color filters 170. For example, a plurality of micro-lenses 180 may be arranged two-dimensionally (e.g., in a matrix form) on a plane including the first direction DR1 and the second direction DR2.

The plurality of micro-lenses 180 may be arranged to correspond to each of the first to fourth unit pixels PX11 to PX14, PX21 to PX24, PX31 to PX33, and PX41 to PX43. The plurality of micro-lenses 180 may be formed on the color filters 170 to cover the respective first to fourth unit pixels PX11 to PX14, PX21 to PX24, PX31 to PX33, and PX41 to PX43.

The micro-lens 180 may be disposed on the color filter 170 so as to correspond to the first focus pixels FP11 and FP12. The micro-lens 180 may cover both the first sub-pixels FP11 and FP12 on the color filter 170. For example, a width of the micro-lens 180 covering the first focus pixels FP11 and FP12 in the first direction DR1 may be greater than a width of the micro-lenses 180 covering the respective first to fourth unit pixels PX11 to PX14, PX21 to PX24, PX31 to PX33, and PX41 to PX43.

The micro-lens 180 may have a convex shape and may have a predetermined radius of curvature. Accordingly, the micro-lens 180 may condense light incident on the photoelectric conversion layer 112. The micro-lens 180 may include, for example, a light-transmitting resin, but is not limited thereto.

In some exemplary embodiments, a second passivation film 185 may be further formed on the micro-lenses 180. The second passivation film 185 may extend along surfaces of the micro-lenses 180. The second passivation film 185 may include inorganic oxide. For example, the second passivation film 185 may include at least one of silicon oxide, titanium oxide, zirconium oxide, hafnium oxide, and combinations thereof, but is not limited thereto. As an example, the second passivation film 185 may include low temperature oxide (LTO).

The second passivation film 185 may protect the micro-lenses 180 from an outside, for example an outside of image sensor 10. For example, the second passivation film 185 including the inorganic oxide may cover and protect the micro-lenses 180 including an organic material such as the light-transmitting resin. In addition, the second passivation film 185 may improve a quality of the image sensor by improving light condensing efficiency of the micro-lenses 180. For example, the second passivation film 185 may decrease reflection, refraction, scattering, and the like, of incident light arriving at spaces between the micro-lenses 180 by filling the spaces between the micro-lenses 180.

In embodiments, referring to FIG. 4B, a first pixel group PG1' disposed in the second region includes a first merged pixel PX11 to PX14, a second merged pixel PX21 to PX24, a third merged pixel PX31 to PX34, and a fourth merged pixel PX41 to PX44. That is, the first pixel group PG1' disposed in the second region may not include the first focus pixels FP11 and FP12 (as shown for example FIG. 4A).

The first merged pixel PX11 to PX14 may include first unit pixels PX11 to PX14 arranged in two rows and two columns. The second merged pixel PX21 to PX24 may include second unit pixels PX21 to PX24 arranged in two rows and two columns. The third merged pixel PX31 to PX34 may include third unit pixels PX31 to PX34 arranged in two rows and two columns. The fourth merged pixel PX41 to PX44 may include fourth unit pixels PX41 to PX44 arranged in two rows and two columns.

In plan view, the grid pattern 150 may surround the first merged pixel PX11 to PX14, the second merged pixel PX21 to PX24, the third merged pixel PX31 to PX34, and the fourth merged pixel PX41 to PX44, and may not be disposed inside the first merged pixel PX11 to PX14, the second merged pixel PX21 to PX24, the third merged pixel PX31 to PX34, and the fourth merged pixel PX41 to PX44.

In order to improve performance of the image sensor, merged pixels in which a plurality of unit pixels adjacent to each other share one color filter with each other are used. For example, such merged pixels may operate as one pixel in a dark place to provide a bright image, and may be re-mosaicked in a bright place to provide a detailed image.

In plan view, when the grid pattern 150 surrounds each unit pixel in one merged pixel, a photo receiving area of each of the unit pixels in one merged pixel may decrease due to the grid pattern 150. Accordingly, sensitivity of each of the unit pixels may decrease, and signal-to-noise ratio (SNR) characteristics of each of the unit pixels may be deteriorated.

However, in the image sensor 10 according to some exemplary embodiments, the grid pattern 150 surrounds each merged pixel and does not surround each of the unit pixels in one merged pixel, in plan view. Accordingly, sensitivity and/or an SNR of each unit pixel in one merged pixel may be improved.

In addition, in plan view, the grid pattern 150 surrounds a focus pixel even though merged pixels neighboring to the focus pixel have the same color filter. Accordingly, autofocus performance of the focus pixel may be maintained. Accordingly, an image sensor with an improved quality may be provided.

Figure 6:
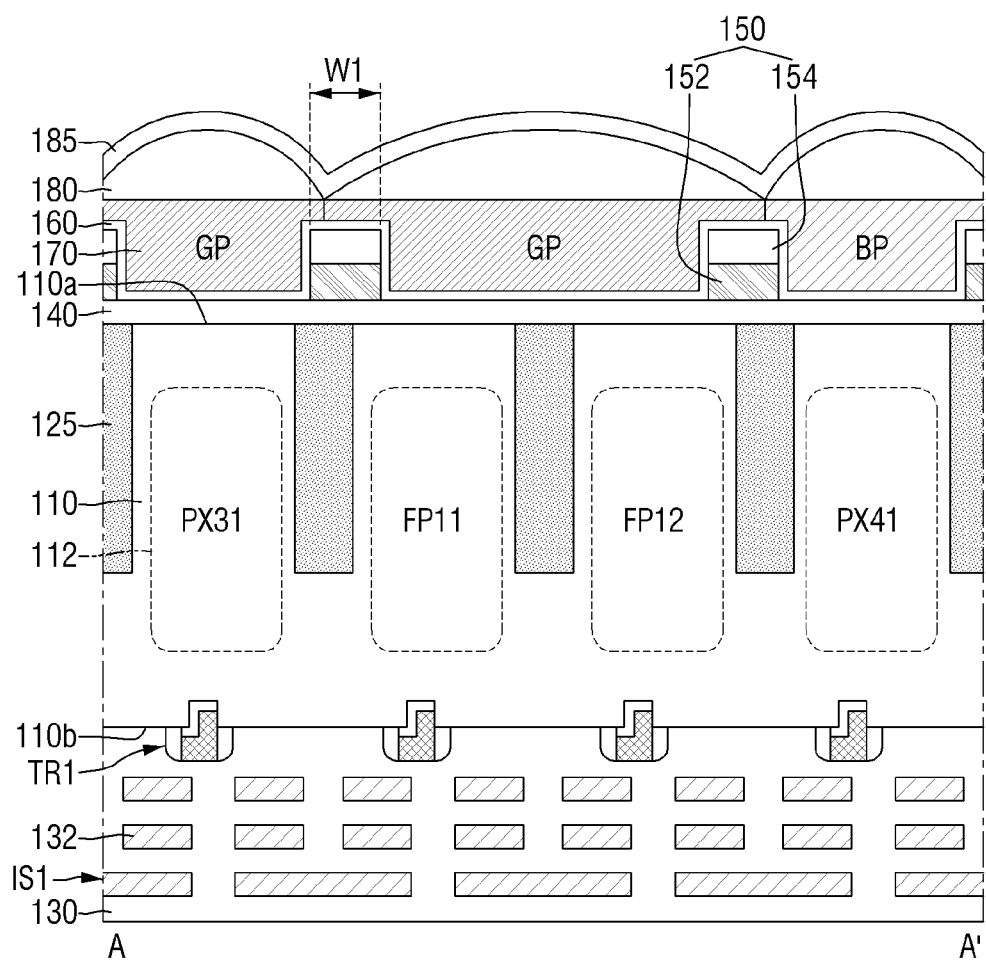
FIGS. 6 to 8 are cross-sectional views for describing an image sensor according to an embodiment.
Figure 7:
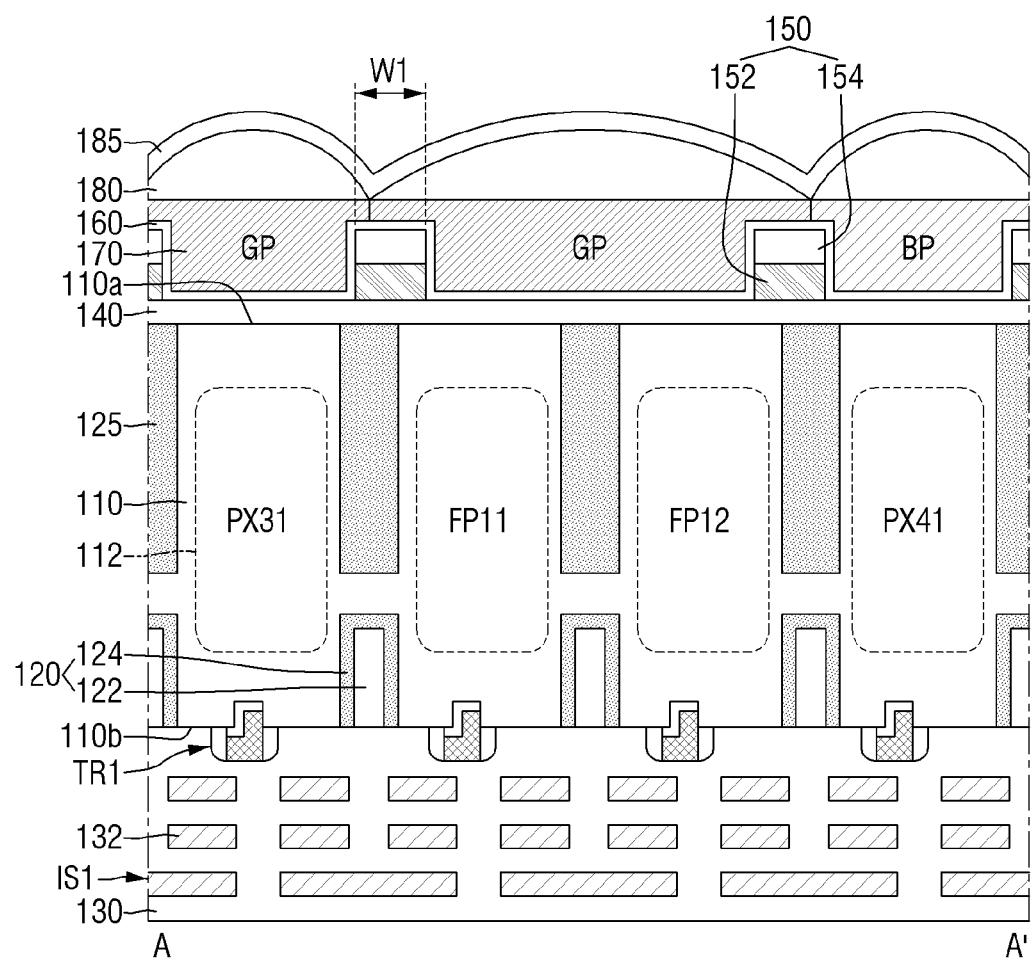
Figure 8:
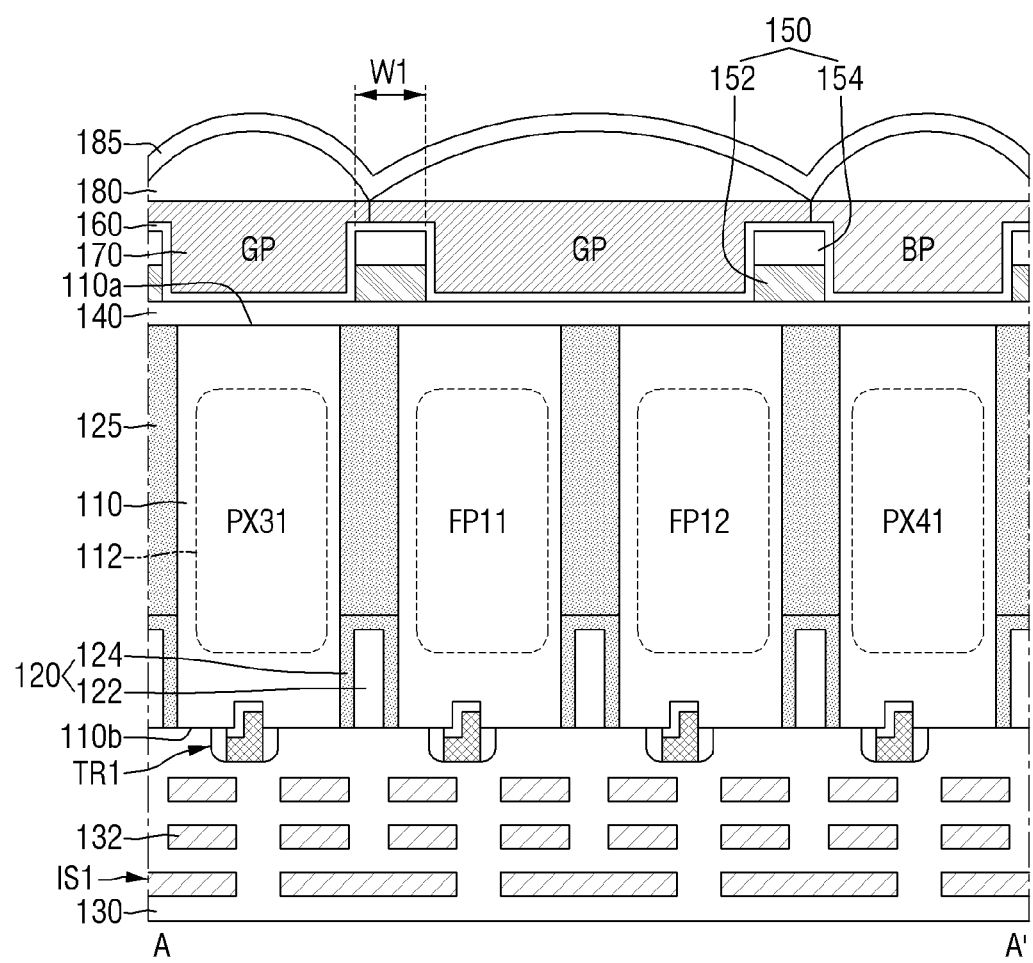

FIGS. 6 to 8 are cross-sectional views for describing an image sensor according to some exemplary embodiments. For reference, FIGS. 6 to 8 are cross-sectional views taken along line A-A' of FIG. 4A. For convenience of explanation, portions overlapping those described above with reference to FIGS. 1 to 5 will be briefly described or a description thereof will be omitted.

Referring to FIG. 6, in some exemplary embodiments, a second pixel separation pattern 125 may be formed in the first substrate 110. The second pixel separation pattern 125 may define the third-first unit pixel PX31, the first sub-pixels FP11 and FP12, and the fourth-first unit pixel PX41. For example, the second pixel separation pattern 125 may be formed in a grid shape in plan view and surround the first sub-pixels FP11 and FP12, the first unit pixels PX11 to PX14 (as shown for example in FIG. 4A), the second unit pixels PX21 to PX24 (as shown for example in FIG. 4A), the third unit pixels PX31 to PX33 (as shown for example in FIG. 4A), and the fourth unit pixels PX41 to PX43 (as shown for example in FIG. 4A) arranged in a matrix form.

The second pixel separation pattern 125 may penetrate through a portion of the first substrate 110. For example, the second pixel separation pattern 125 may partially penetrate through the first substrate 110 from the first surface 110a of the first substrate 110. A lower surface of the second pixel separation pattern 125 may be disposed in the first substrate 110.

In some exemplary embodiments, a width of the second pixel separation pattern 125 in the first direction DR1 may be constant as the second pixel separation pattern 125 becomes distant from the second surface 110b of the first substrate 110.

In some exemplary embodiments, a width of the second pixel separation pattern 125 may increase as the second pixel separation pattern 125 becomes distant from the second surface 110b of the first substrate 110. This may be due to characteristics of an etching process for forming the second pixel separation pattern 125. For example, a process of etching the first substrate 110 in order to form the second pixel separation pattern 125 may be performed on the first surface 110a of the first substrate 110.

The second pixel separation pattern 125 may include, for example, an insulating material. The second pixel separation pattern 125 may include, for example, at least one of silicon oxide, aluminum oxide, tantalum oxide, and combinations thereof, but is not limited thereto. In some exemplary embodiments, the second pixel separation pattern 125 may include a low refractive index material having a lower refractive index than that of the first substrate 110.

Referring to FIG. 7, in some exemplary embodiments, a first pixel separation pattern 120 and a second pixel separation pattern 125 may be formed in the first substrate 110. The first pixel separation pattern 120 and the second pixel separation pattern 125 may define the third-first unit pixel PX31, the first sub-pixels FP11 and FP12, and the fourth-first unit pixel PX41. For example, the first pixel separation pattern 120 and the second pixel separation pattern 125 may be formed in a grid shape in plan view and surround the first sub-pixels FP11 and FP12, the first unit pixels PX11 to PX14 (as shown for example in FIGS. 4A and 4B), the second unit pixels PX21 to PX24 (as shown for example in FIGS. 4A and 4B), the third unit pixels PX31 to PX33 (as shown for example in FIGS. 4A and 4B), and the fourth unit pixels PX41 to PX43 (as shown for example in FIGS. 4A and 4B) arranged in a matrix form.

The first pixel separation pattern 120 may penetrate through a portion of the first substrate 110. For example, the first pixel separation pattern 120 may partially penetrate through the first substrate 110 from the second surface 110b of the first substrate 110. An upper surface of the first pixel separation pattern 120 may be disposed in the first substrate 110.

The first pixel separation pattern 120 may include a conductive filling pattern 122 partially penetrating through the first substrate 110 from the second surface 110b of the first substrate 110 and an insulating spacer film 124 disposed between the conductive filling pattern 122 and the first substrate 110.

In some exemplary embodiments, the first pixel separation pattern 120 may be spaced apart from the second pixel separation pattern 125 in the first substrate 110. The first pixel separation pattern 120 may overlap at least a portion of the second pixel separation pattern 125 in a direction from the second surface 110b of the first substrate 110 toward the first surface 110a of the first substrate 110.

A material of the first pixel separation pattern 120 may be the same as that described above with reference to FIGS. 1 to 5. The second pixel separation pattern 125 may be the same as that described above with reference to FIG. 6.

Referring to FIG. 8, in some exemplary embodiments, at least a portion of the first pixel separation pattern 120 may be in contact with the second pixel separation pattern 125 in the first substrate 110.

In some exemplary embodiments, a width of a lower surface of the first pixel separation pattern 120 may be the same as a width of an upper surface of the second pixel separation pattern 125. In embodiments, a width of a lower surface of the first pixel separation pattern 120 may be different from a width of an upper surface of the second pixel separation pattern 125.

The first pixel separation pattern 120 and the second pixel separation pattern 125 may be the same as those described above with reference to FIG. 6.

FIGS. 9 to 17 are exemplary partial layout diagrams for describing a first pixel group disposed in a first region of FIG. 3. For convenience of explanation, portions overlapping those described above with reference to FIGS. 1 to 5 will be briefly described or a description thereof will be omitted.

Figure 9:
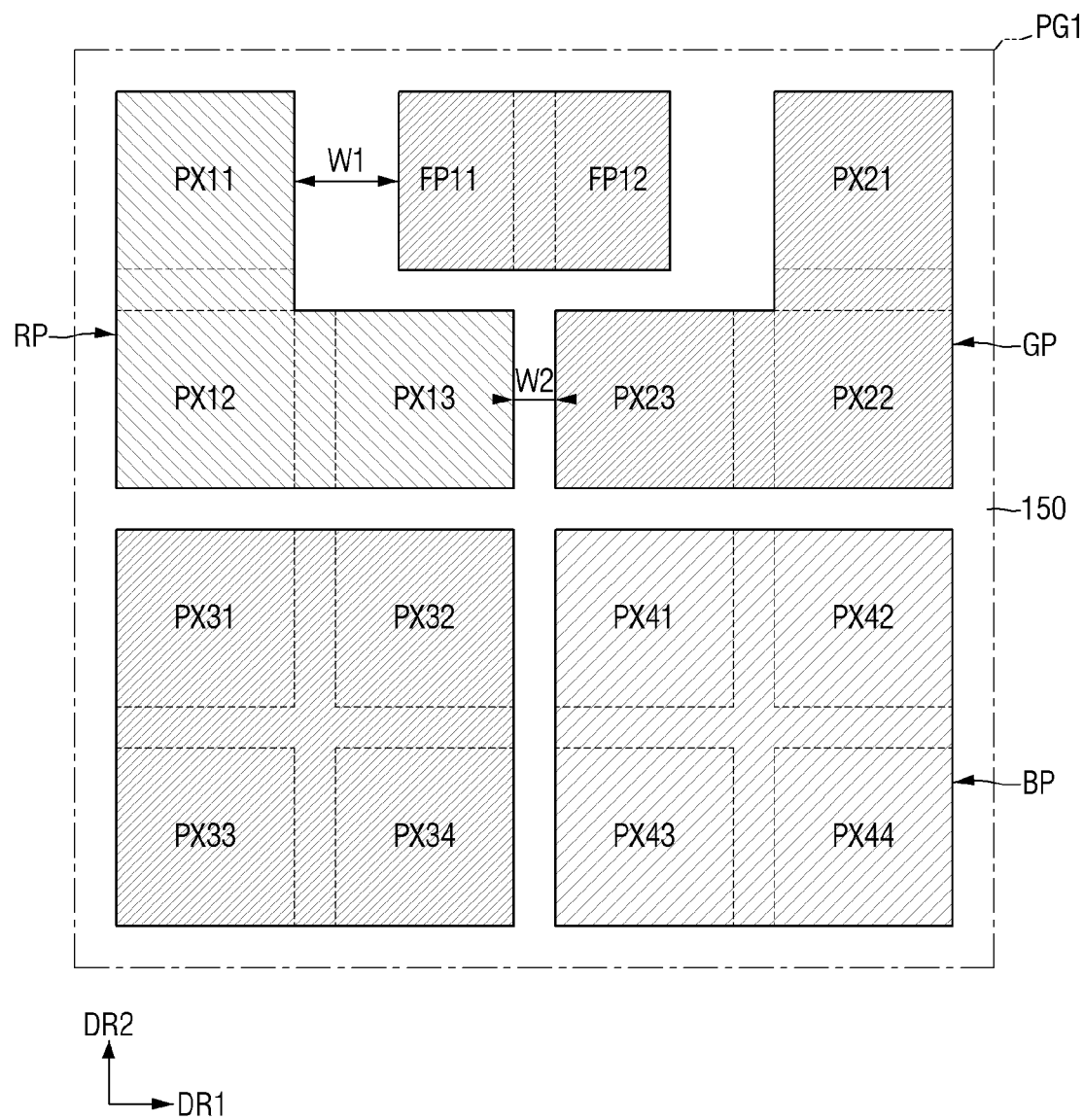
FIGS. 9 to 17 are exemplary partial layout diagrams for describing a first pixel group disposed in a first region of FIG. 3, according to an embodiment.

Referring to FIG. 9, in a first pixel group PG1 according to some exemplary embodiments, the first focus pixels FP11 and FP12 may be disposed between a first merged pixel PX11 to PX13 and a second merged pixel PX21 to PX23 in the first direction DR1.

Specifically, the first merged pixel PX11 to PX13 may include first-second and first-first unit pixels PX12 and PX11 continuously arranged along the second direction DR2 and a first-third unit pixel PX13 arranged continuously to the first-second unit pixel PX12 along the first direction DR1.

The second merged pixel PX21 to PX23 may include second-third and second-second unit pixels PX23 and PX22 continuously arranged along the first direction DR1 and a second-first unit pixel PX21 arranged continuously to the second-second unit pixel PX22 along the second direction DR2.

The first-first unit pixel PX11, the first focus pixels FP11 and FP12, and the second-first unit pixel PX21 may be continuously arranged along the first direction DR1.

In embodiments, the first focus pixels FP11 and FP12 may also be disposed at positions of the first-third and second-third unit pixels PX13 and PX23 in FIG. 9, and the first-third and second-third unit pixels PX13 and PX23 may also be disposed at positions of the first focus pixels FP11 and FP12 in FIG. 9.

Figure 10:
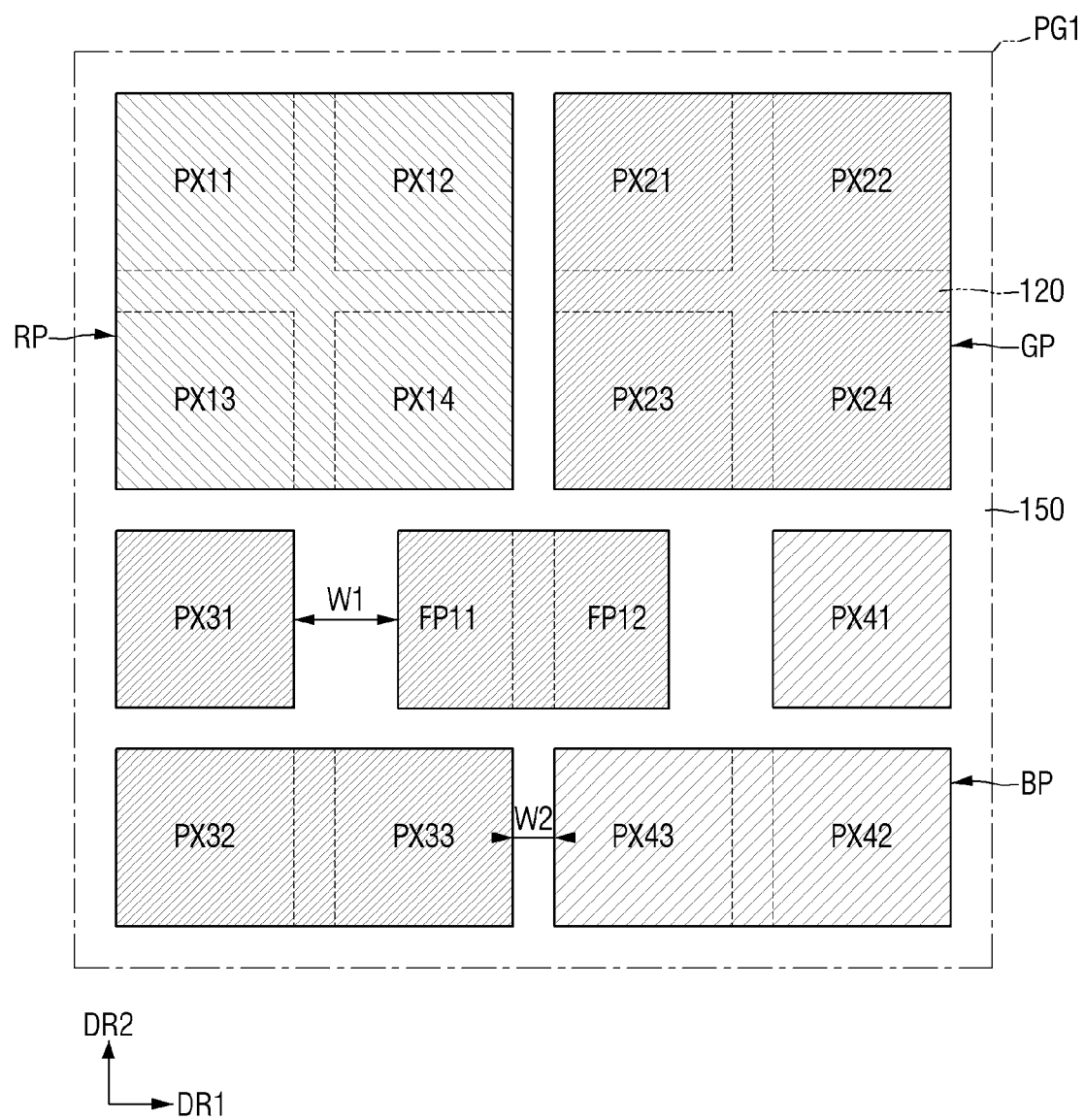

Referring to FIG. 10, in the image sensor 10 according to some exemplary embodiments, the grid pattern 150 may also be disposed inside one of the merged pixels PX11 to PX14, PX21 to PX24, PX31 to PX33, and PX41 to PX43 having the same color filter, in plan view.

For example, the grid pattern 150 may surround a third-first unit pixel PX31 and surround third-second and third-third unit pixels PX32 and PX33, in plan view. The grid pattern 150 may separate a second color filter GP disposed on the third-first unit pixel PX31 and a second color filter GP disposed on the third-second and third-third unit pixels PX32 and PX33.

For example, the grid pattern 150 may surround a fourth-first unit pixel PX41 and surround fourth-second and fourth-third unit pixels PX42 and PX43, in plan view. The grid pattern 150 may separate a third color filter BP disposed on the fourth-first unit pixel PX41 and a third color filter BP disposed on the fourth-second and fourth-third unit pixels PX42 and PX43.

The grid pattern 150 may prevent crosstalk between unit pixels neighboring to each other in one merged pixel PX11 to PX14, PX21 to PX24, PX31 to PX33, and PX41 to PX43.

In the image sensor 10 according to some exemplary embodiments, the grid pattern 150 may also be disposed inside one of the merged pixels PX11 to PX14, PX21 to PX24, PX31 to PX33, and PX41 to PX43 in plan view according to a state of unit pixels in one merged pixel. For example, in plan view, when sensitivity and/or an SNR improved by not disposing the grid pattern 150 inside one merged pixel PX11 to PX14, PX21 to PX24, PX31 to PX33, and PX41 to PX43 are smaller than the crosstalk prevented between the unit pixels neighboring to each other by disposing the grid pattern 150 inside one merged pixel PX11 to PX14, PX21 to PX24, PX31 to PX33, and PX41 to PX43, the grid pattern 150 may be disposed inside one of the merged pixel PX11 to PX14, PX21 to PX24, PX31 to PX33, and PX41 to PX43. For example, it may vary whether or not to dispose the grid pattern 150 inside one merged pixel PX11 to PX14, PX21 to PX24, PX31 to PX33, and PX41 to PX43 in plan view according to positions where unit pixels are disposed in the photo receiving region APS (as shown for example in FIG. 3).

Figure 11:
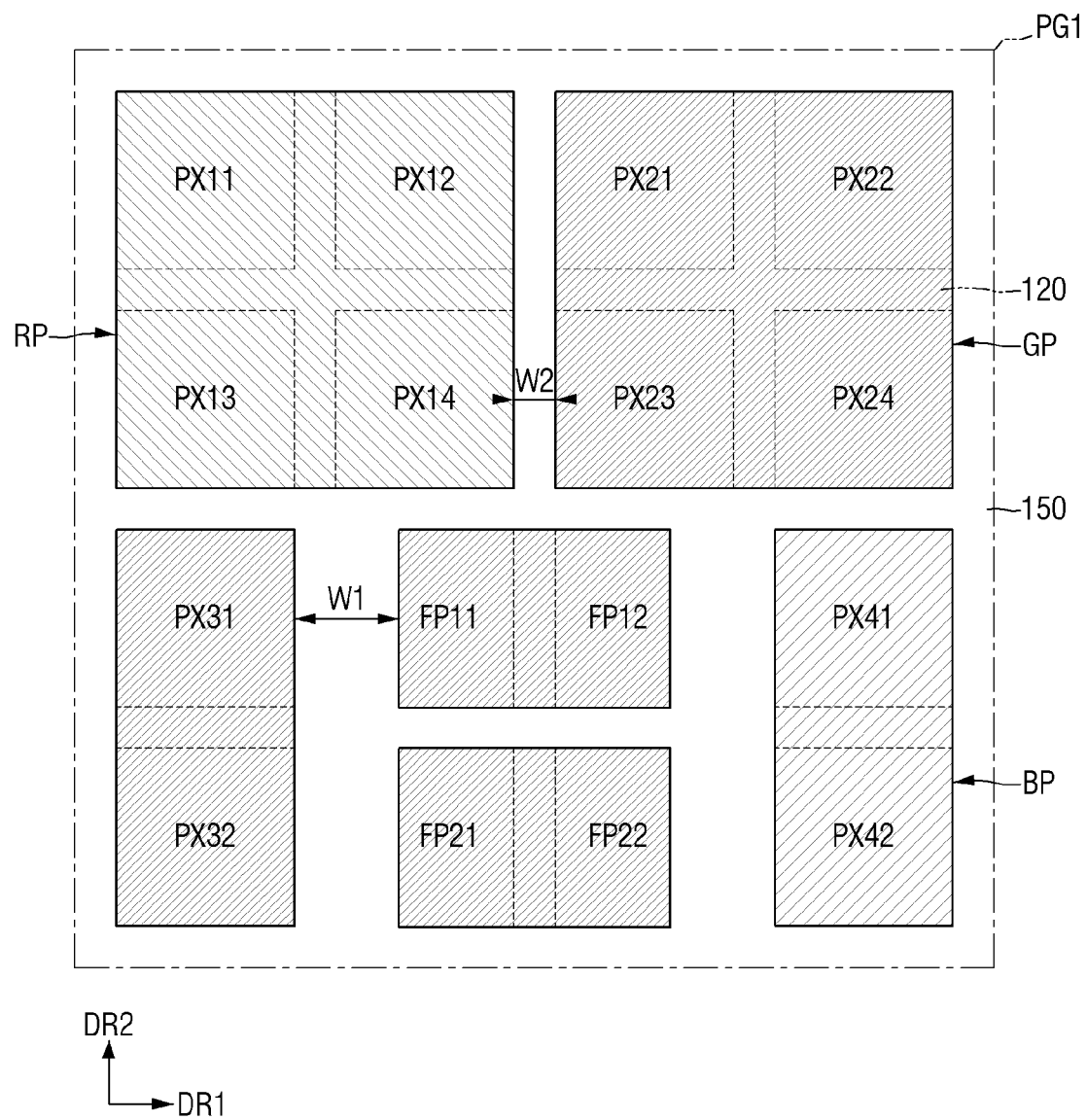

Referring to FIG. 11, the first pixel group PG1 according to some exemplary embodiments may further include second focus pixels FP21 and FP22. The second focus pixels FP21 and FP22 may be disposed at various positions in the first pixel group PG1.

For example, the second focus pixels FP21 and FP22 may be disposed between a third merged pixel PX31 to PX32 and a fourth merged pixel PX41 to PX42 in the first direction DR1. The second focus pixels FP21 and FP22 and the first focus pixels FP11 and FP12 may be continuously arranged along the second direction DR2.

The second focus pixels FP21 and FP22 may perform an auto focus (AF) function. The auto focus function may be performed using phase detection AF (PDAF) using second sub-pixels FP21 and FP22.

The second focus pixels FP21 and FP22 may share a second color filter GP with each other, and receive light passing through the second color filter GP to generate electrical signals.

The grid pattern 150 may surround the first focus pixels FP11 and FP12 and the second focus pixels FP21 and FP22 in plan view. Accordingly, the second color filter GP on the first focus pixels FP11 and FP12 and the second color filter GP on the second focus pixels FP21 and FP22 may be separated by the grid pattern 150.

The grid pattern 150 may surround a third merged pixel PX31 and PX32 and a fourth merged pixel PX41 and PX42 in plan view.

Figure 12:
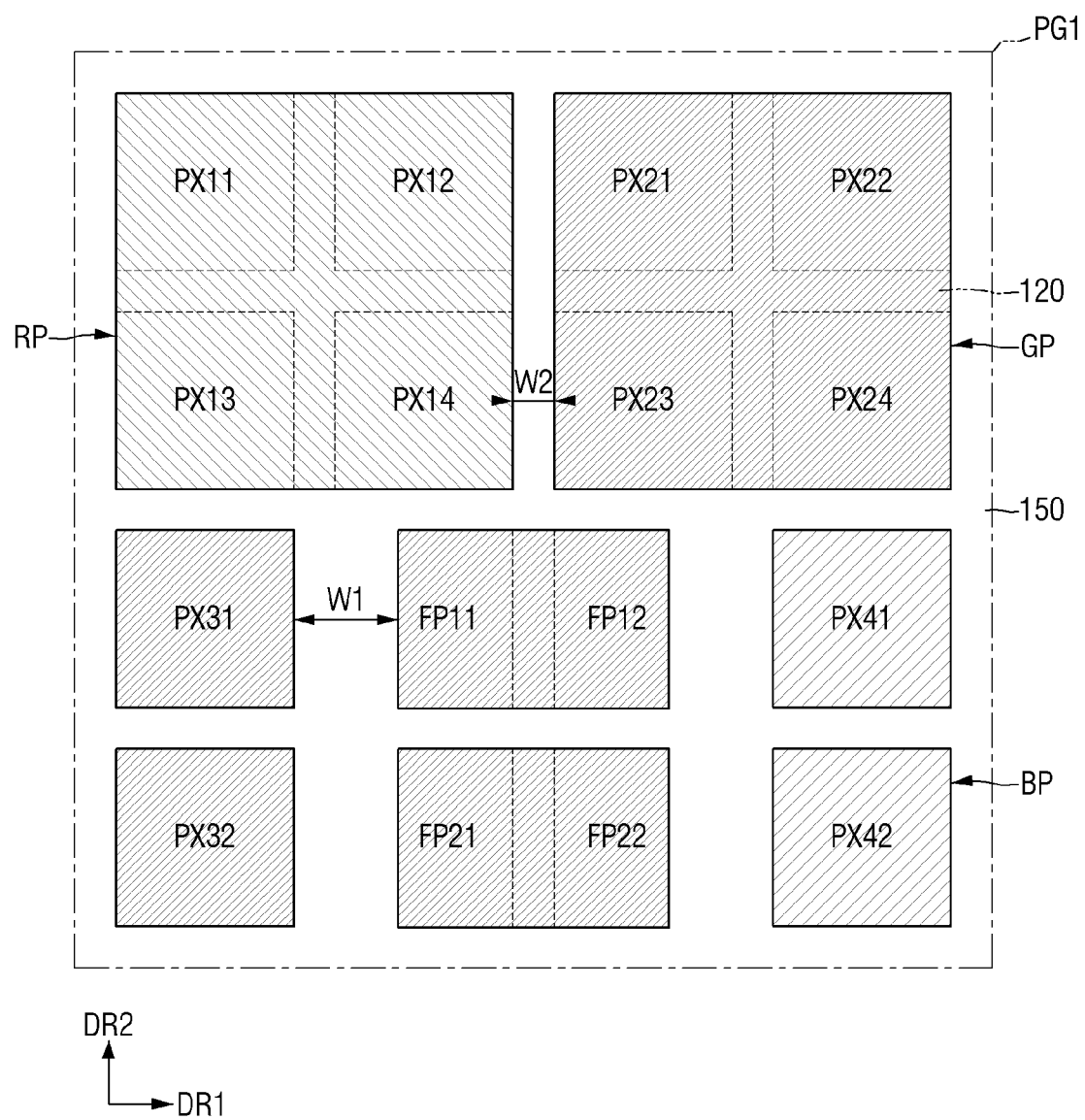

Referring to FIG. 12, in the first pixel group PG1 according to some exemplary embodiments, the grid pattern 150 may surround each of a third-first unit pixel PX31 and a third-second unit pixel PX32 and surround each of a fourth-first unit pixel PX41 and a fourth-second unit pixel PX42, in plan view. Accordingly, a second color filter GP disposed on the third-first unit pixel PX31 and a second color filter GP disposed on the third-second unit pixel PX32 may be separated by the grid pattern 150.

In embodiments, the grid pattern 150 may be disposed only in any one of the third merged pixel PX31 and PX32 and the fourth merged pixel PX41 and PX42 in plan view.

Figure 13:
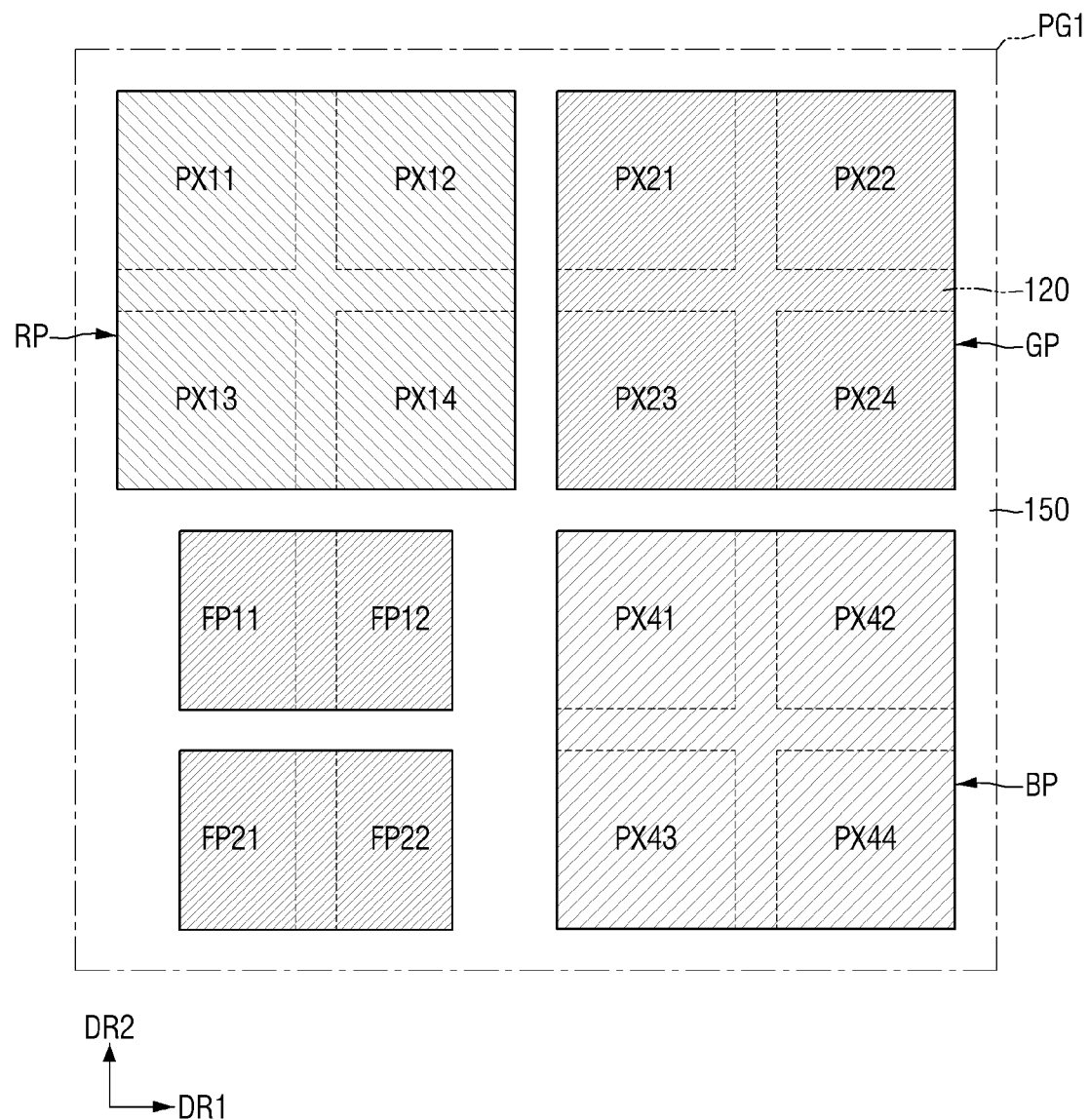

Referring to FIG. 13, the first pixel group PG1 according to some exemplary embodiments may include first focus pixels FP11 and FP12 and second focus pixels FP21 and FP22. The first focus pixels FP11 and FP12 and the second focus pixels FP21 and FP22 may be disposed at various positions in the first pixel group PG1.

For example, the second focus pixels FP21 and FP22 and the first focus pixels FP11 and FP12 may be continuously arranged along the second direction DR2.

The first focus pixels FP11 and FP12 and the second focus pixels FP21 and FP22 may share a second color filter GP with each other, and receive light passing through the second color filter GP to generate electrical signals.

A fourth merged pixel PX41 to PX44 may include fourth unit pixels PX41 to PX44 arranged in two rows and two columns. The first focus pixels FP11 and FP12 and second focus pixels FP21 and FP22, and the fourth merged pixel PX41 to PX44 may be continuously arranged along the first direction DR1.

Figure 14:
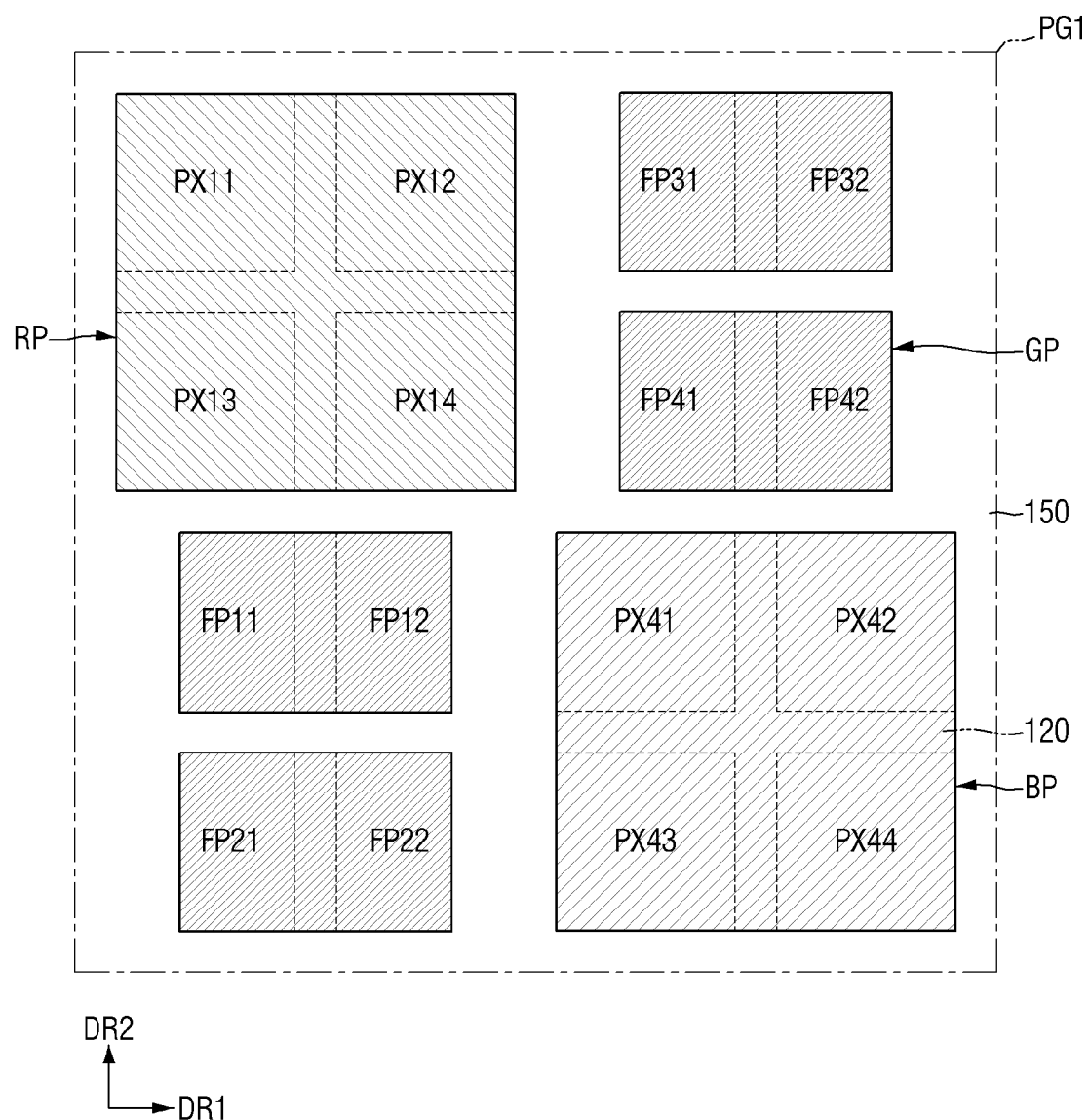

Referring to FIG. 14, the first group pixel PG1 according to some exemplary embodiments may include first focus pixels FP11 and FP12, second focus pixels FP21 and FP22, third focus pixels FP31 and FP32, and fourth focus pixels FP41 and FP42. The first focus pixels FP11 and FP12, the second focus pixels FP21 and FP22, the third focus pixels FP31 and FP32, and the fourth focus pixels FP41 and FP42 may be disposed at various positions in the first pixel group PG1.

For example, the second focus pixels FP21 and FP22 and the first focus pixels FP11 and FP12 may be continuously arranged along the second direction DR2, and the fourth focus pixels FP41 and FP42 and the third focus pixels FP31 and FP32 may be continuously arranged along the second direction DR2.

The second focus pixels FP21 and FP22, the third focus pixels FP31 and FP32, and the fourth focus pixels FP41 and FP42 may perform an auto focus (AF) function.

The first focus pixels FP11 and FP12, the second focus pixels FP21 and FP22, the third focus pixels FP31 and FP32, and the fourth focus pixels FP41 and FP42 may share a second color filter GP with each other, and receive light passing through the second color filter GP to generate electrical signals.

Figure 15:
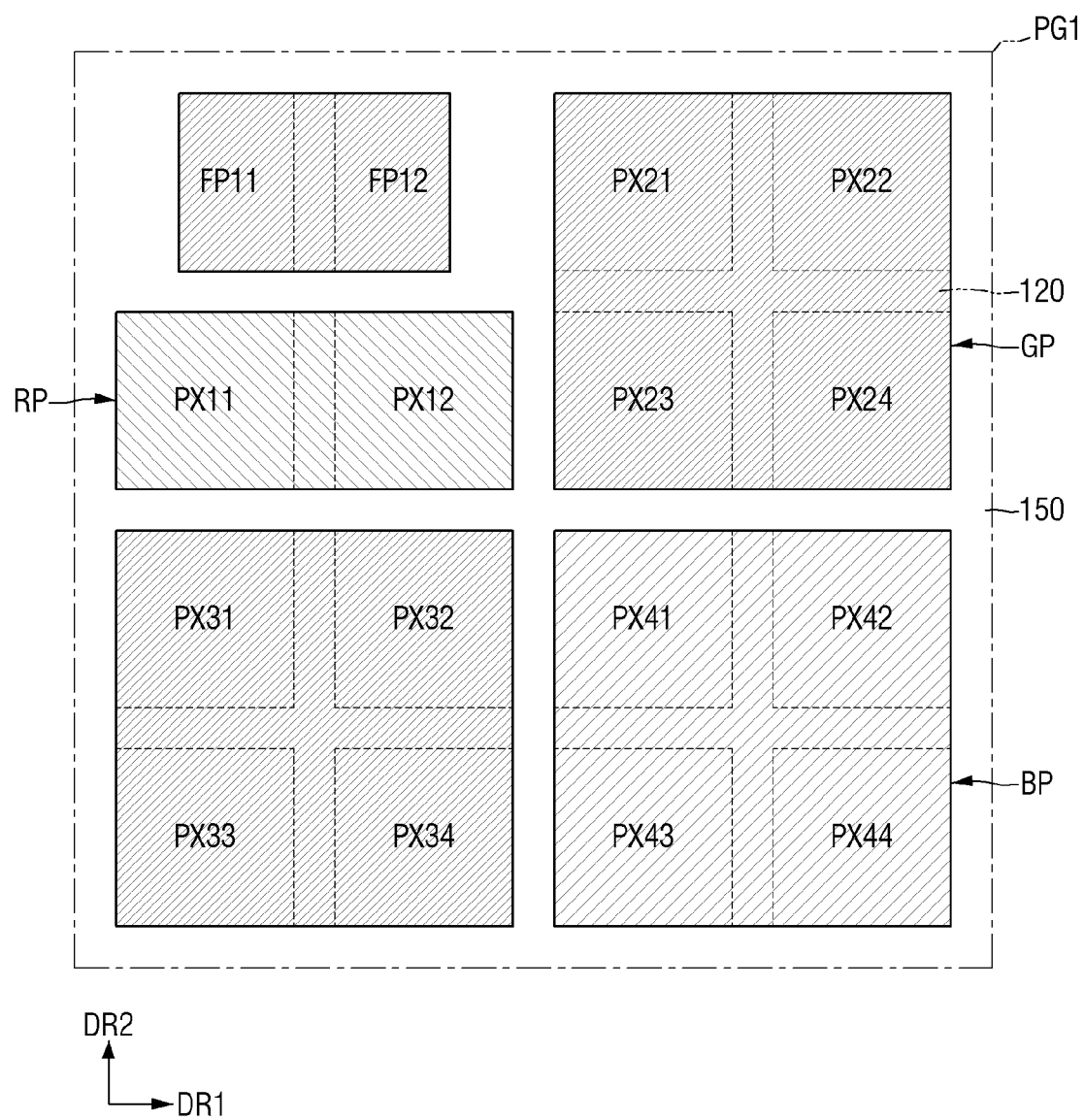

Referring to FIG. 15, in the first pixel group PG1 according to some exemplary embodiments, a third merged pixel PX31 to PX34 may include third unit pixels PX31 to PX34 arranged in two rows and two columns. A first merged pixel PX11 and PX12 may include first unit pixels PX11 and PX12 arranged in one row and two columns. The third merged pixel PX31 to PX34, the first merged pixel PX11 and PX12, and the first focus pixels FP11 and FP12 may be continuously arranged along the second direction DR2. The first focus pixels FP11 and FP12 and the first merged pixel PX11 and PX12, and the second merged pixel PX21 to PX24 may be continuously arranged along the first direction DR1.

A fourth merged pixel PX41 to PX44 may include fourth unit pixels PX41 to PX44 arranged in two rows and two columns.

In embodiments, the first focus pixels FP11 and FP12 may also be disposed at positions of the first merged pixel PX11 and PX12 in FIG. 15, and the first merged pixel PX11 and PX12 may also be disposed at positions of the first focus pixels FP11 and FP12 in FIG. 15.

Figure 16:
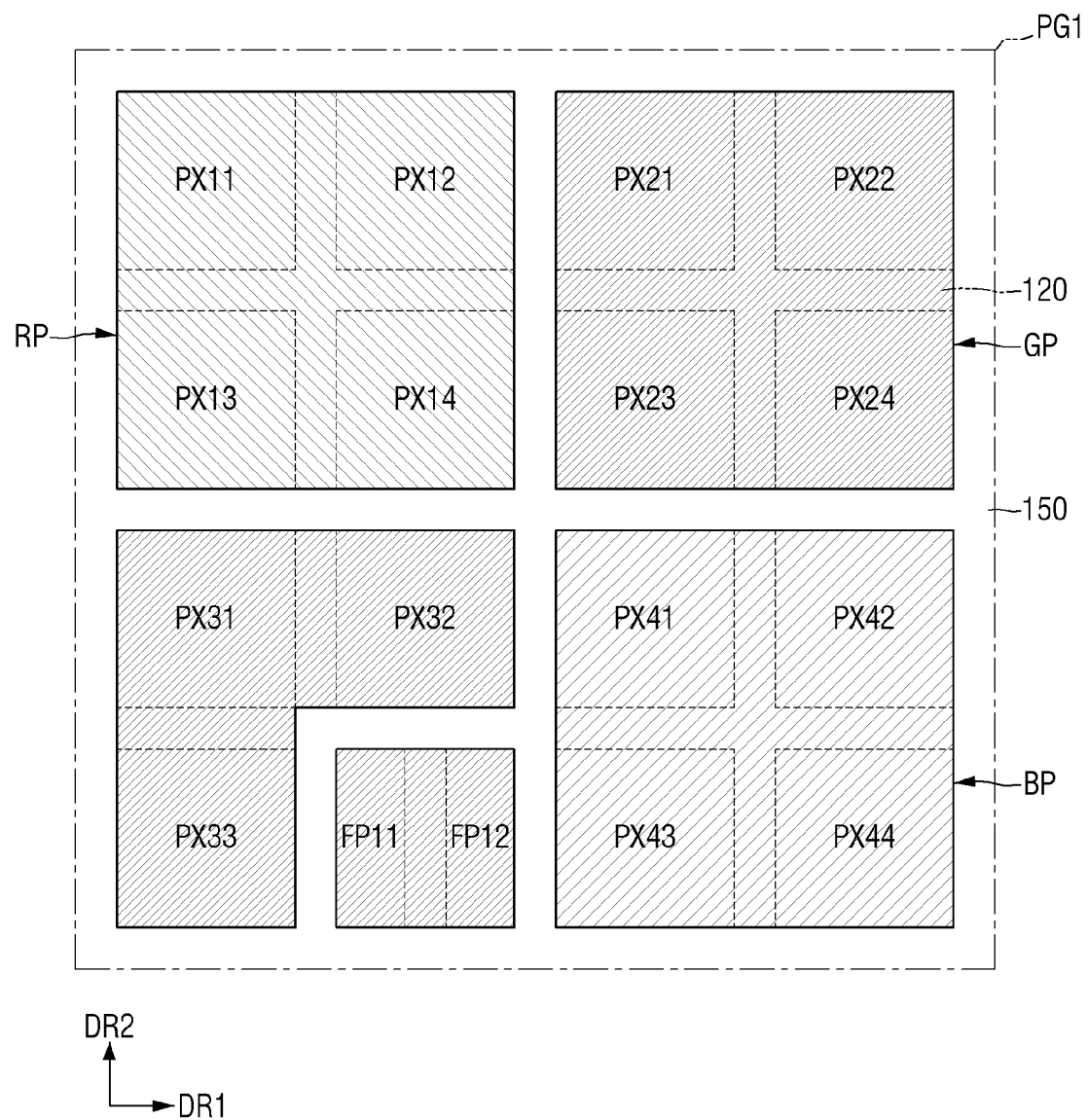

Referring to FIG. 16, in the image sensor 10 according to some exemplary embodiments, the first focus pixels FP11 and FP12 may be disposed at a position corresponding to one unit pixel. For example, the first focus pixels FP11 and FP12 may be disposed at a position corresponding to one unit pixel neighboring to third-second and third-third unit pixels PX32 and PX33.

Figure 17:
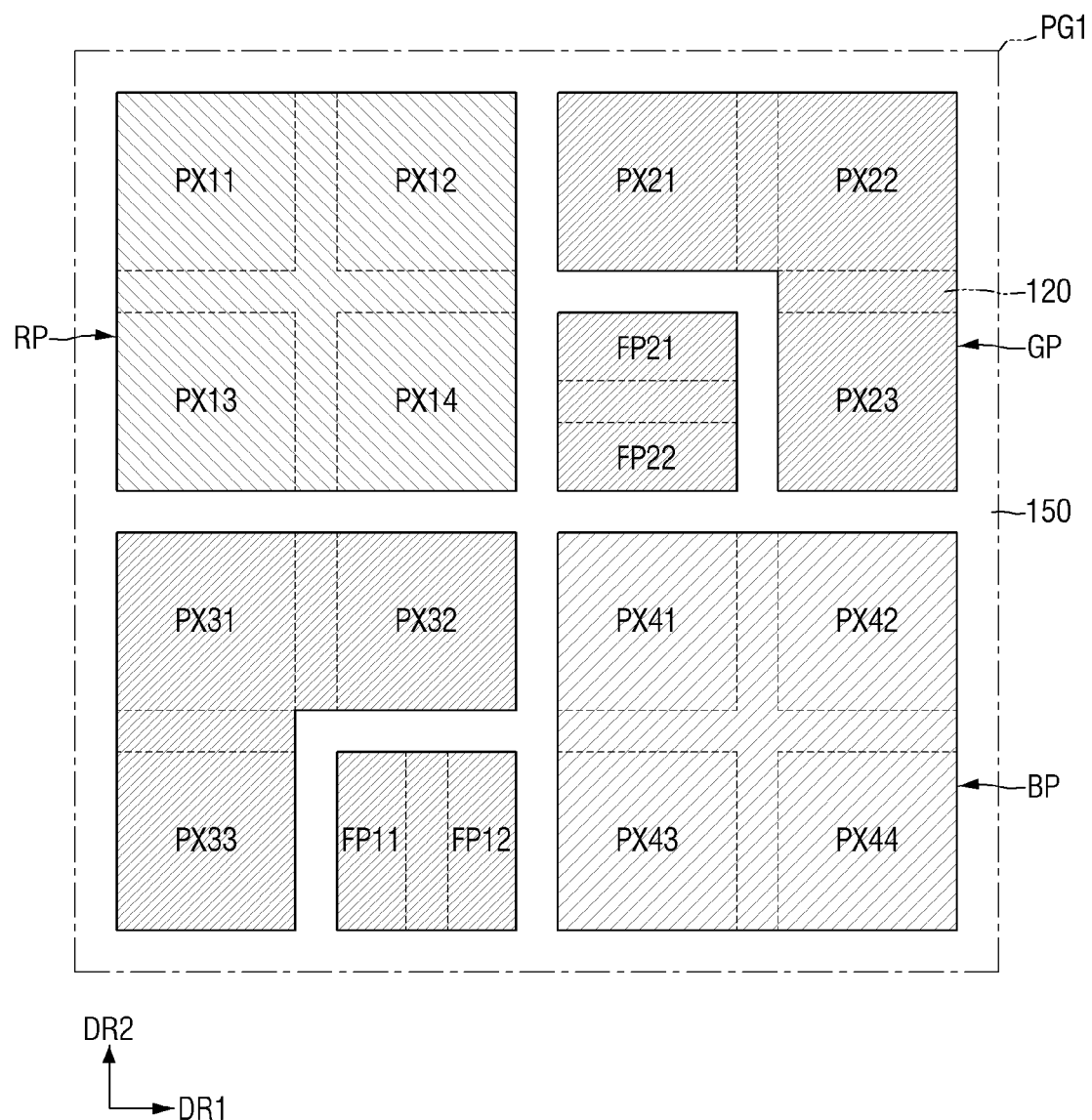

Referring to FIG. 17, in the image sensor 10 according to some exemplary embodiments, each of the first focus pixels FP11 and FP12 and the second focus pixels FP21 and FP22 may be disposed at a position corresponding to one unit pixel. For example, the first focus pixels FP11 and FP12 may be disposed at a position corresponding to one unit pixel neighboring to third-second and third-third unit pixels PX32 and PX33, and the second focus pixels FP21 and FP22 may be disposed at a position corresponding to one unit pixel neighboring to second-first and second-third unit pixels PX21 and PX23.

The first focus pixels FP11 and FP12 may include first-first and first-second sub-pixels FP11 and FP12 continuously arranged along the first direction DR1, and the second focus pixels FP21 and FP22 may include second-second and second-first sub-pixels FP22 and FP21 continuously arranged along the second direction DR2.

Figure 18A:
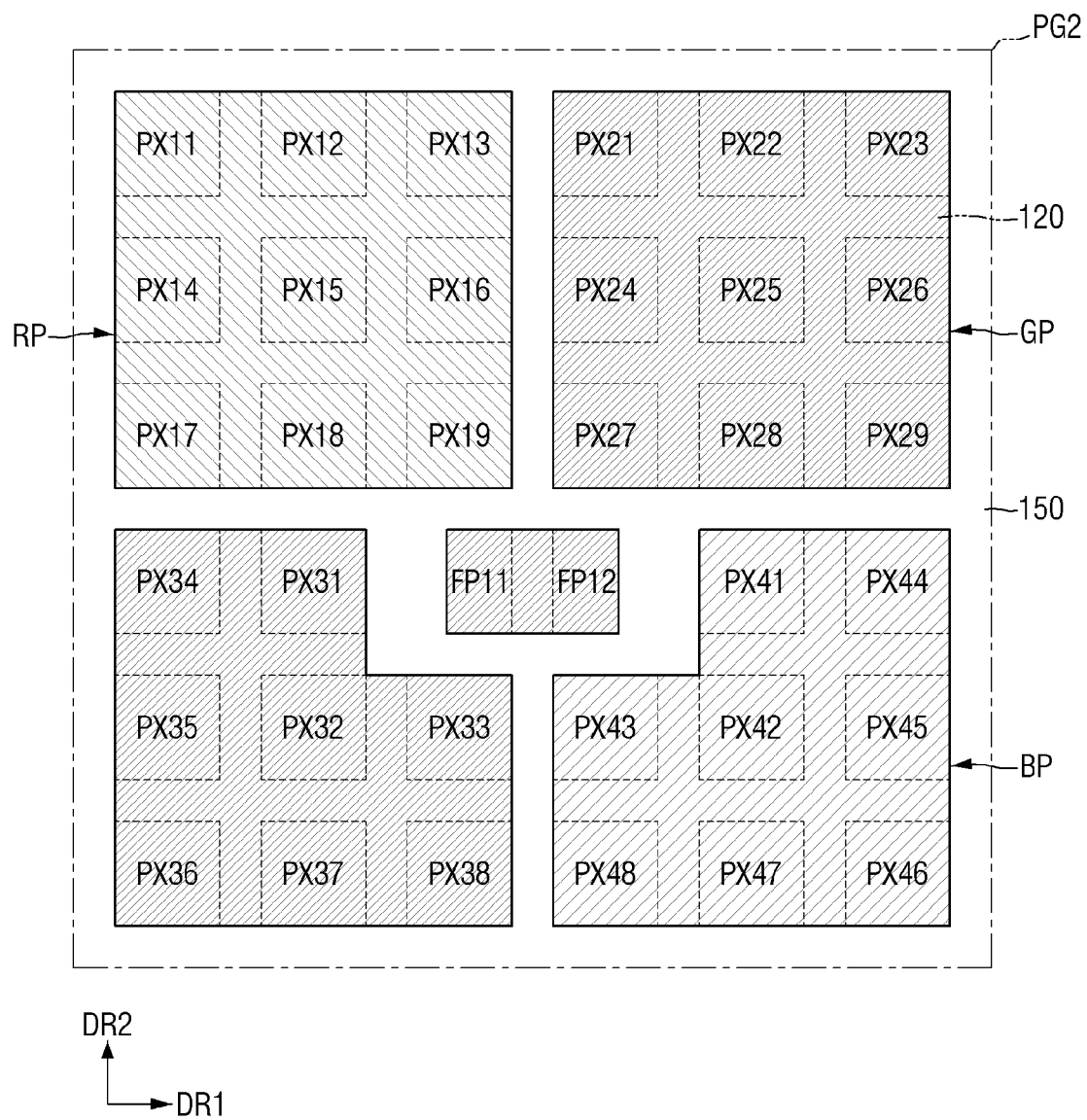
FIG. 18A is an exemplary partial layout diagram for describing a second pixel group disposed in a first region of FIG. 3, according to an embodiment.
Figure 18B:
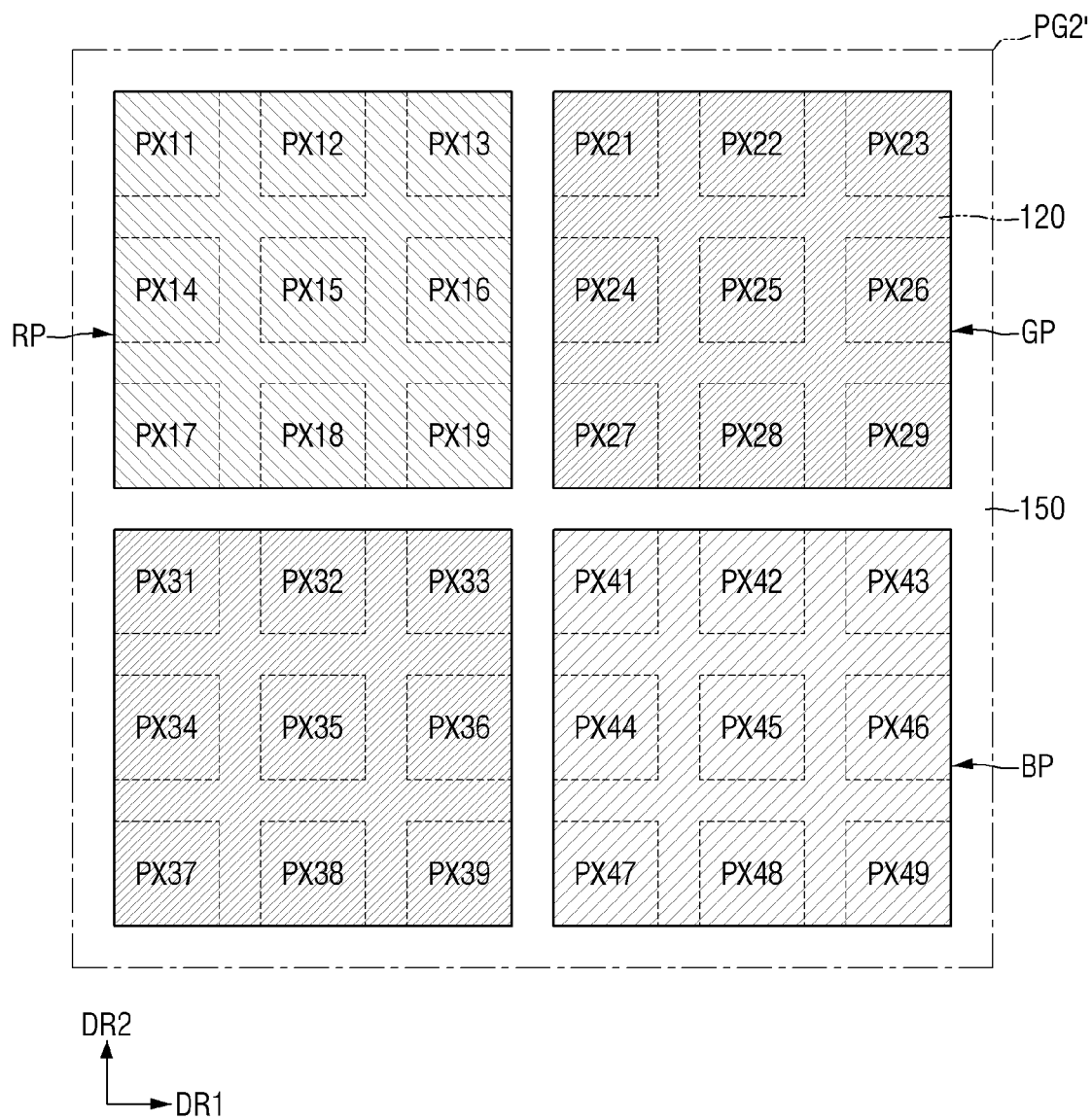
FIG. 18B is an exemplary partial layout diagram for describing a second pixel group disposed in a second region of FIG. 3, according to an embodiment.

FIG. 18A is an exemplary partial layout diagram for describing a second pixel group disposed in a first region of FIG. 3. FIG. 18B is an exemplary partial layout diagram for describing a second pixel group disposed in a second region of FIG. 3. For convenience of explanation, portions overlapping those described above with reference to FIGS. 1 to 5 will be briefly described or a description thereof will be omitted.

Referring to FIG. 18A, a second pixel group PG2 disposed in the first region may include first focus pixels FP11 and FP12 and first to fourth merged pixels PX11 to PX19, PX21 to PX29, PX31 to PX38, and PX41 to PX48.

The first merged pixel PX11 to PX19 may include first unit pixels PX11 to PX19 arranged in three rows and three columns. The second merged pixel PX21 to PX29 may include second unit pixels PX21 to PX29 arranged in three rows and three columns.

The third merged pixel PX31 to PX38 may include third unit pixels PX31 to PX38. Third-first to third-third unit pixels PX31 to PX33 may be the same as those described above with reference to FIG. 4A. Third-sixth, third-fifth, and third-fourth unit pixels PX36, PX35, and PX34 may be continuously arranged along the second direction DR2, and third-sixth, third-seventh, and third-eighth unit pixels PX36, PX37, and PX38 may be continuously arranged along the first direction DR1.

The fourth merged pixel PX41 to PX48 may include fourth unit pixels PX41 to PX48. Fourth-sixth, fourth-fifth, and fourth-fourth unit pixels PX46, PX45, and PX44 may be continuously arranged along the second direction DR2, and fourth-eighth, fourth-seventh, and fourth-sixth unit pixels PX48, PX47, and PX46 may be continuously arranged along the first direction DR1.

The first focus pixels FP11 and FP12 may be disposed, for example, between the third merged pixel PX31 to PX38 and the fourth merged pixel PX41 to PX48 in the first direction DR1.

The grid pattern 150 may surround the first focus pixels FP11 and FP12 and the first to fourth merged pixels PX11 to PX19, PX21 to PX29, PX31 to PX38, and PX41 to PX48 and may not be disposed inside the first focus pixels FP11 and FP12 and the first to fourth merged pixels PX11 to PX19, PX21 to PX29, PX31 to PX38, and PX41 to PX48, in plan view.

Referring to FIG. 18B, a second pixel group PG2' disposed in the second region may include first to fourth merged pixels PX11 to PX19, PX21 to PX29, PX31 to PX39, and PX41 to PX49. The first to fourth merged pixels PX11 to PX19, PX21 to PX29, PX31 to PX39, and PX41 to PX49 may include, respectively, first to fourth unit pixels PX11 to PX19, PX21 to PX29, PX31 to PX39, and PX41 to PX49 arranged in three rows and three columns.

Figure 19A:
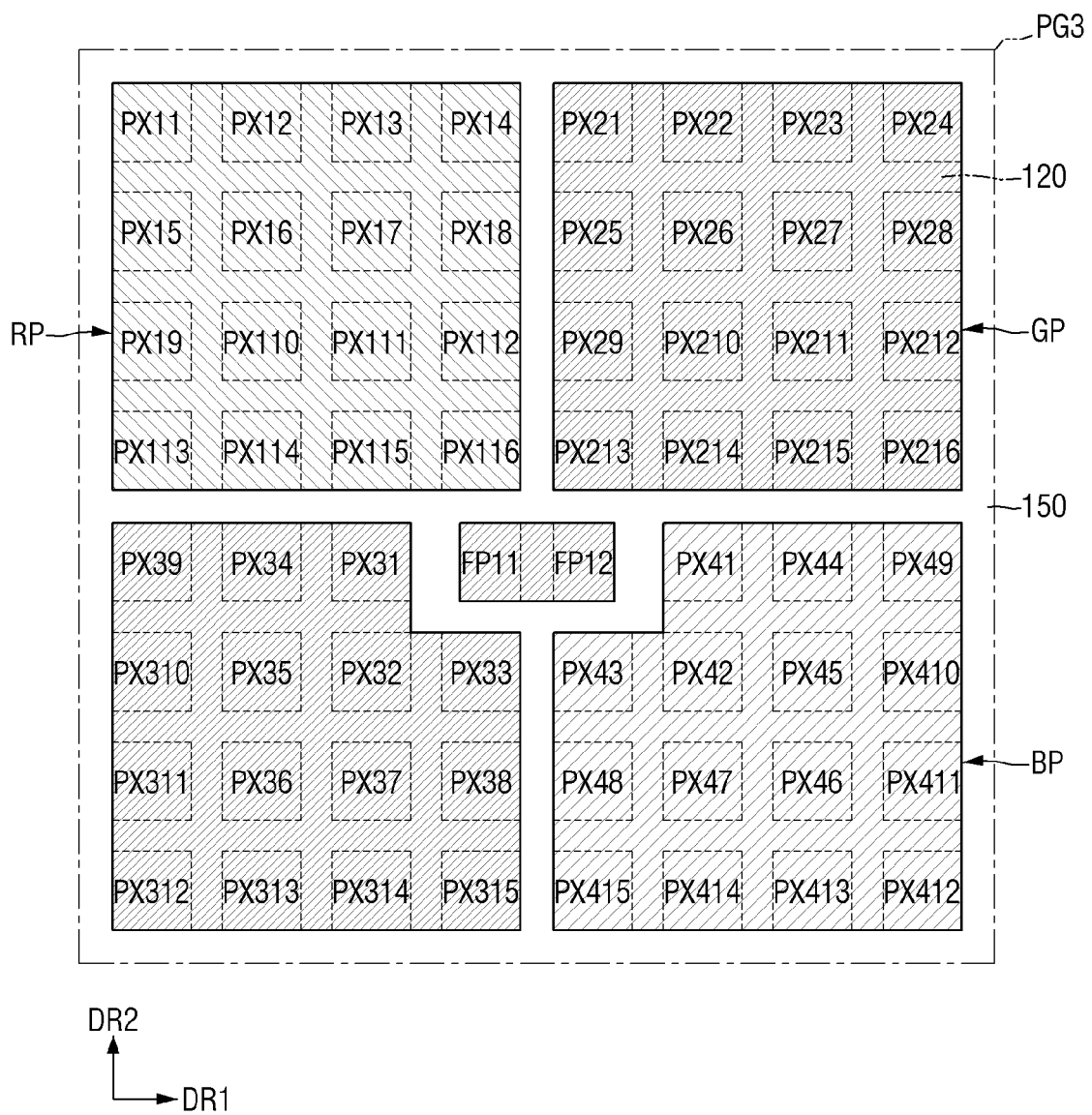
FIG. 19A is an exemplary partial layout diagram for describing a third pixel group disposed in a first region of FIG. 3, according to an embodiment.
Figure 19B:
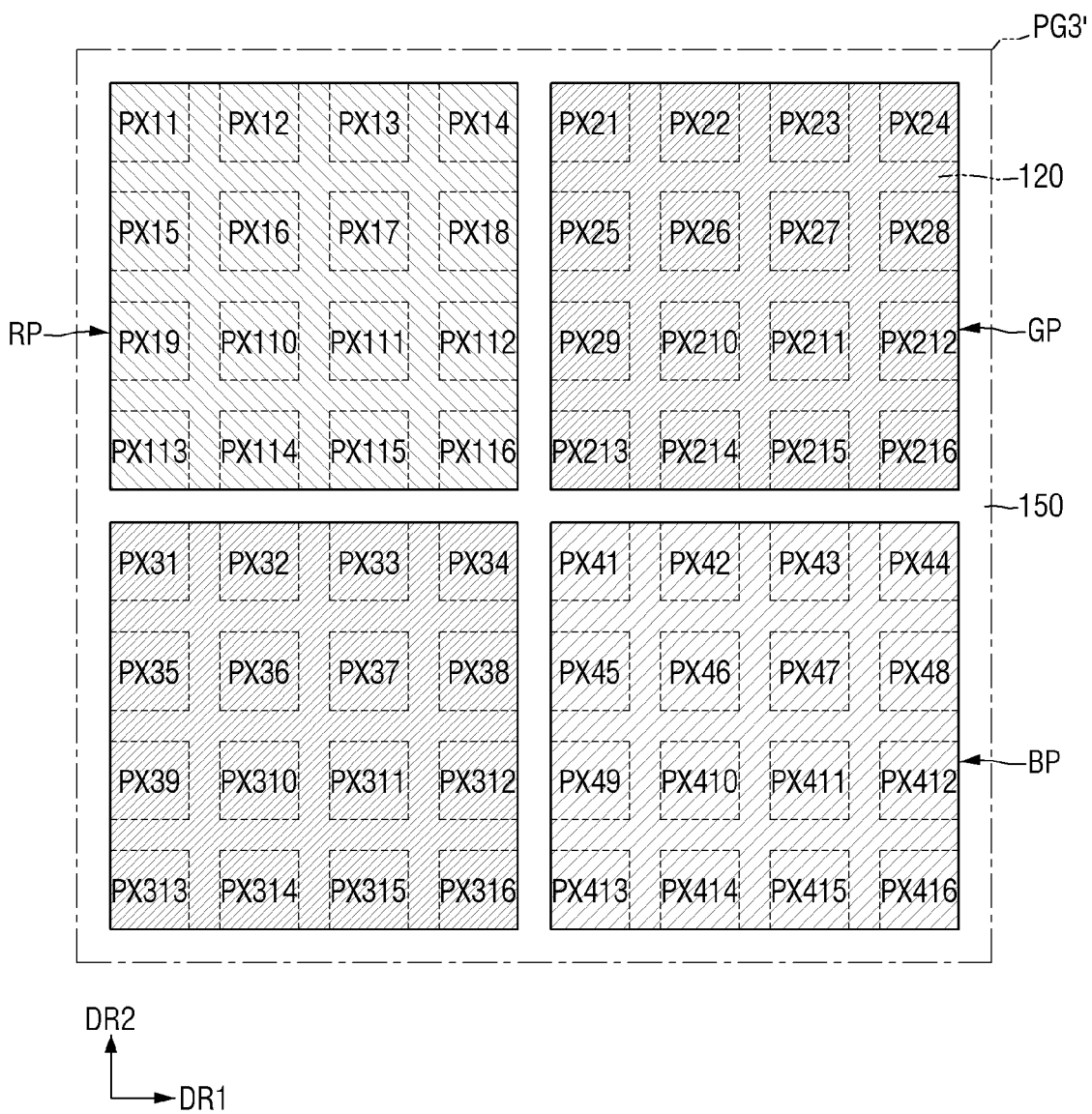
FIG. 19B is an exemplary partial layout diagram for describing a third pixel group disposed in a second region of FIG. 3, according to an embodiment.

FIG. 19A is an exemplary partial layout diagram for describing a third pixel group disposed in a first region of FIG. 3. FIG. 19B is an exemplary partial layout diagram for describing a third pixel group disposed in a second region of FIG. 3. For convenience of explanation, portions overlapping those described above with reference to FIGS. 1 to 5 will be briefly described or a description thereof will be omitted.

Referring to FIG. 19A, a third pixel group PG3 disposed in the first region may include first focus pixels FP11 and FP12 and first to fourth merged pixels PX11 to PX116, PX21 to PX216, PX31 to PX315, and PX41 to PX415.

The first merged pixel PX11 to PX116 may include first unit pixels PX11 to PX116 arranged in four rows and four columns. The second merged pixel PX21 to PX216 may include second unit pixels PX21 to PX216 arranged in four rows and four columns.

The third merged pixel PX31 to PX315 may include third unit pixels PX31 to PX315. Third-first to third-eighth unit pixels PX31 to PX38 may be the same as those described above with reference to FIG. 18A. Third-twelfth, third-eleventh, third-tenth, and third-ninth unit pixels PX312, PX311, PX310, and PX39 may be continuously arranged along the second direction DR2, and third-twelfth, third-thirteenth, third-fourteenth, and third-fifteenth unit pixels PX312, PX313, PX314, and PX315 may be continuously arranged along the first direction DR1.

The fourth merged pixel PX41 to PX415 may include fourth unit pixels PX41 to PX415. Fourth-twelfth, fourth-eleventh, fourth-tenth, and fourth-ninth unit pixels PX412, PX411, PX410, and PX49 may be continuously arranged along the second direction DR2, and fourth-fifteenth, fourth-fourteenth, fourth-thirteenth, and fourth-twelfth unit pixels PX415, PX414, PX413, and PX412 may be continuously arranged along the first direction DR1.

The first focus pixels FP11 and FP12 may be disposed, for example, between the third merged pixel PX31 to PX315 and the fourth merged pixel PX41 to PX415 in the first direction DR1.

The grid pattern 150 may surround the first focus pixels FP11 and FP12 and the first to fourth merged pixel PX11 to PX116, PX21 to PX216, PX31 to PX315, and PX41 to PX415 and may not be disposed inside the first focus pixels FP11 and FP12 and the first to fourth merged pixels PX11 to PX116, PX21 to PX216, PX31 to PX315, and PX41 to PX415, in plan view.

Referring to FIG. 19B, a third pixel group PG3' disposed in the second region may include first to fourth merged pixels PX11 to PX116, PX21 to PX216, PX31 to PX316, and PX41 to PX416. The first to fourth merged pixels PX11 to PX116, PX21 to PX216, PX31 to PX316, and PX41 to PX416 may include, respectively, first to fourth unit pixels PX11 to PX116, PX21 to PX216, PX31 to PX316, and PX41 to PX416 arranged in four rows and four columns.

Figure 20:
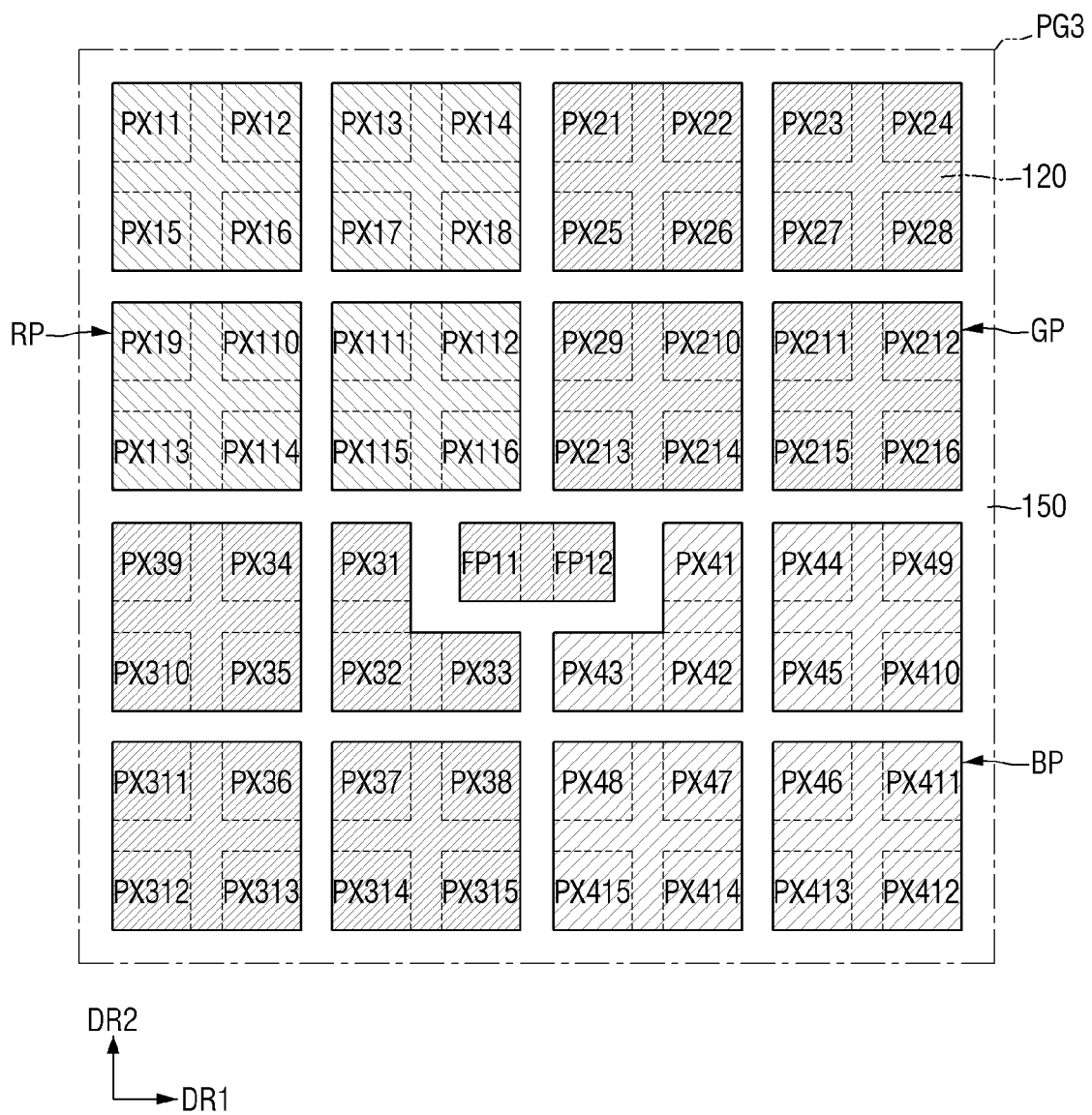
FIG. 20 is an exemplary partial layout diagram for describing a third pixel group disposed in a first region of FIG. 3, according to an embodiment.

FIG. 20 is an exemplary partial layout diagram for describing a third pixel group PG3 disposed in a first region of FIG. 3. For convenience of explanation, portions overlapping those described above with reference to FIG. 19A will be briefly described or a description thereof will be omitted.

Referring to FIG. 20, in some exemplary embodiments, the grid pattern 150 may surround four first unit pixels arranged in two rows and two columns in a first merged pixel PX11 to PX116, four second unit pixels arranged in two rows and two columns in a second merged pixel PX21 to PX216, four third unit pixels arranged in two rows and two columns in a third merged pixel PX31 to PX315, and four fourth unit pixels arranged in two rows and two columns in a fourth merged pixel PX41 to PX415 except for third-first to third-third unit pixels PX31 to PX33 and fourth-first to fourth-third unit pixels PX41 to PX43, in plan view. Accordingly, the first unit pixels arranged in two rows and two columns may share one first color filter RP with each other, the second unit pixels arranged in two rows and two columns may share one second color filter GP with each other, the third unit pixels arranged in two rows and two columns may share one second color filter GP with each other, and the fourth unit pixels arranged in two rows and two columns may share one third color filter BP with each other.

The grid pattern 150 may surround third-first to third-third unit pixels PX31 to PX33 in a plan view and may surround fourth-first to fourth-third unit pixels PX41 to PX43, in plan view. Accordingly, the third-first to third-third unit pixels PX31 to PX33 may share one second color filter GP with each other, and the fourth-first to fourth-third unit pixels PX41 to PX43 may share one third color filter BP with each other.

Figure 21:
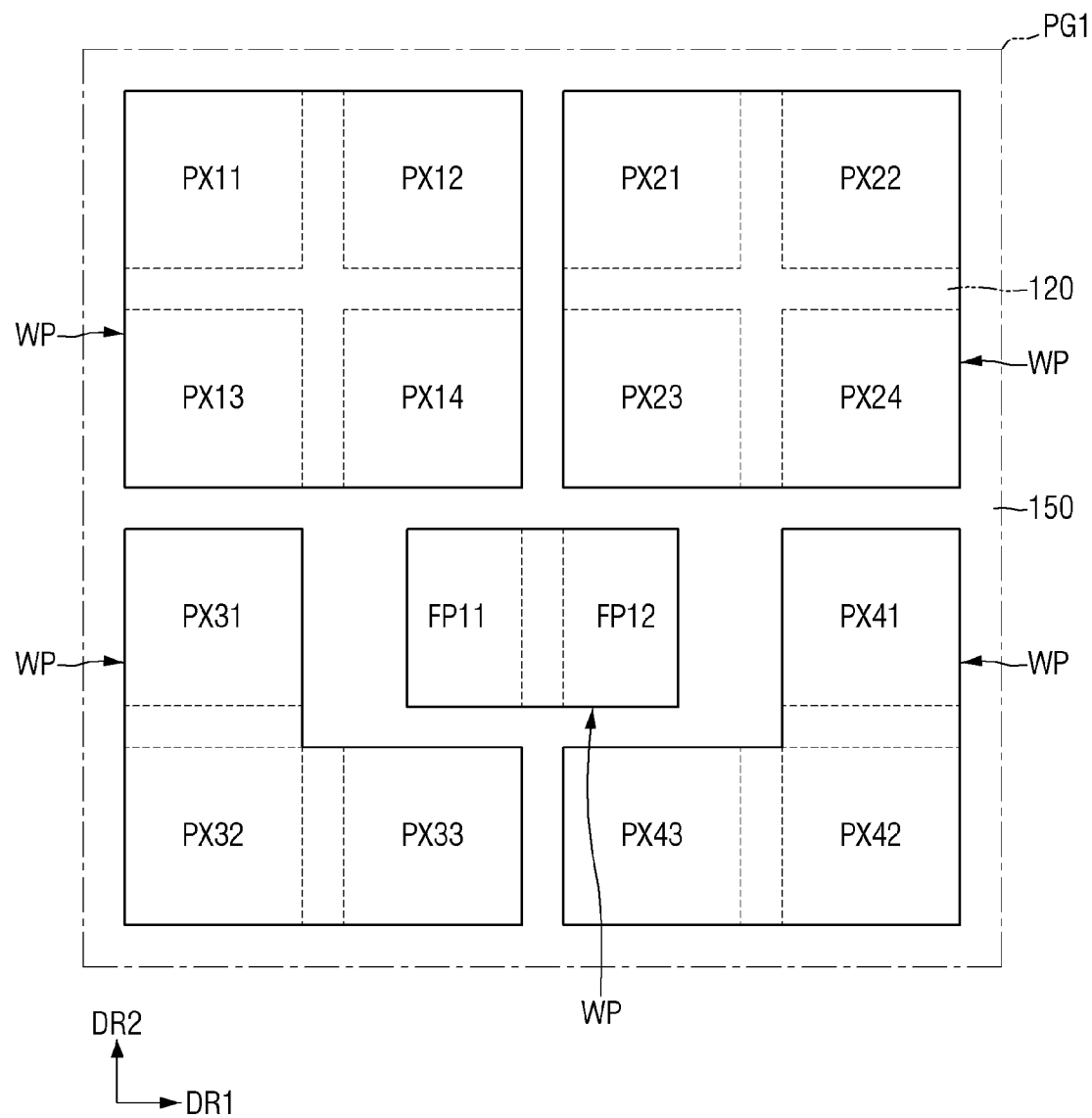
FIGS. 21 and 22 are exemplary partial layout diagrams for describing a first pixel group disposed in a first region of FIG. 3, according to an embodiment.
Figure 22:
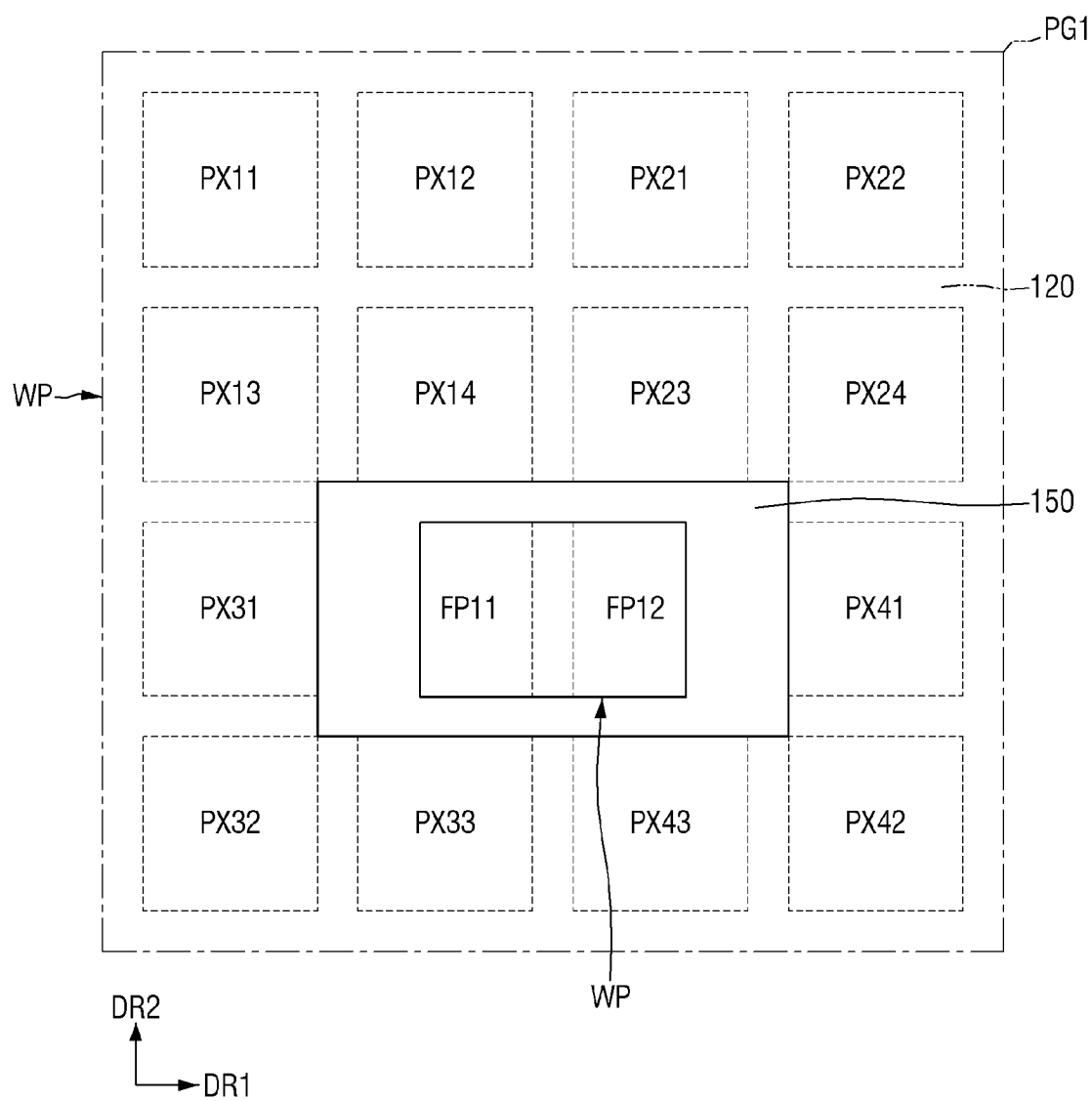

FIGS. 21 and 22 are exemplary partial layout diagrams for describing a first pixel group PG1 disposed in a first region of FIG. 3. For convenience of explanation, portions overlapping those described above with reference to FIGS. 1 to 5 will be briefly described or a description thereof will be omitted.

Referring to FIG. 21, in some exemplary embodiments, a white color filter WP may be disposed on first focus pixels FP11 and FP12 and first to fourth merged pixels PX11 to PX14, PX21 to PX24, PX31 to PX33, and PX41 to PX43. The respective first focus pixels FP11 and FP12 and first to fourth merged pixels PX11 to PX14, PX21 to PX24, PX31 to PX33, and PX41 to PX43 may share one white color filter WP with each other.

Referring to FIG. 22, in some exemplary embodiments, a white color filter WP may be disposed on the first focus pixels FP11 and FP12 and the first to fourth merged pixels PX11 to PX14, PX21 to PX24, PX31 to PX33, and PX41 to PX43. The grid pattern 150 may surround the first focus pixels FP11 and FP12 and may not surround the first to fourth merged pixels PX11 to PX14, PX21 to PX24, PX31 to PX33, and PX41 to PX43, in plan view. Accordingly, the first focus pixels FP11 and FP12 may share one white color filter WP with each other, and the first to fourth merged pixels PX11 to PX14, PX21 to PX24, PX31 to PX33, and PX41 to PX43 may share one white color filter WP with each other. The white color filter WP on the first focus pixels FP11 and FP12 and the first to fourth merged pixels PX11 to PX14, PX21 to PX24, PX31 to PX33, and PX41 to PX43 may be separated by the grid pattern 150.

Figure 23:
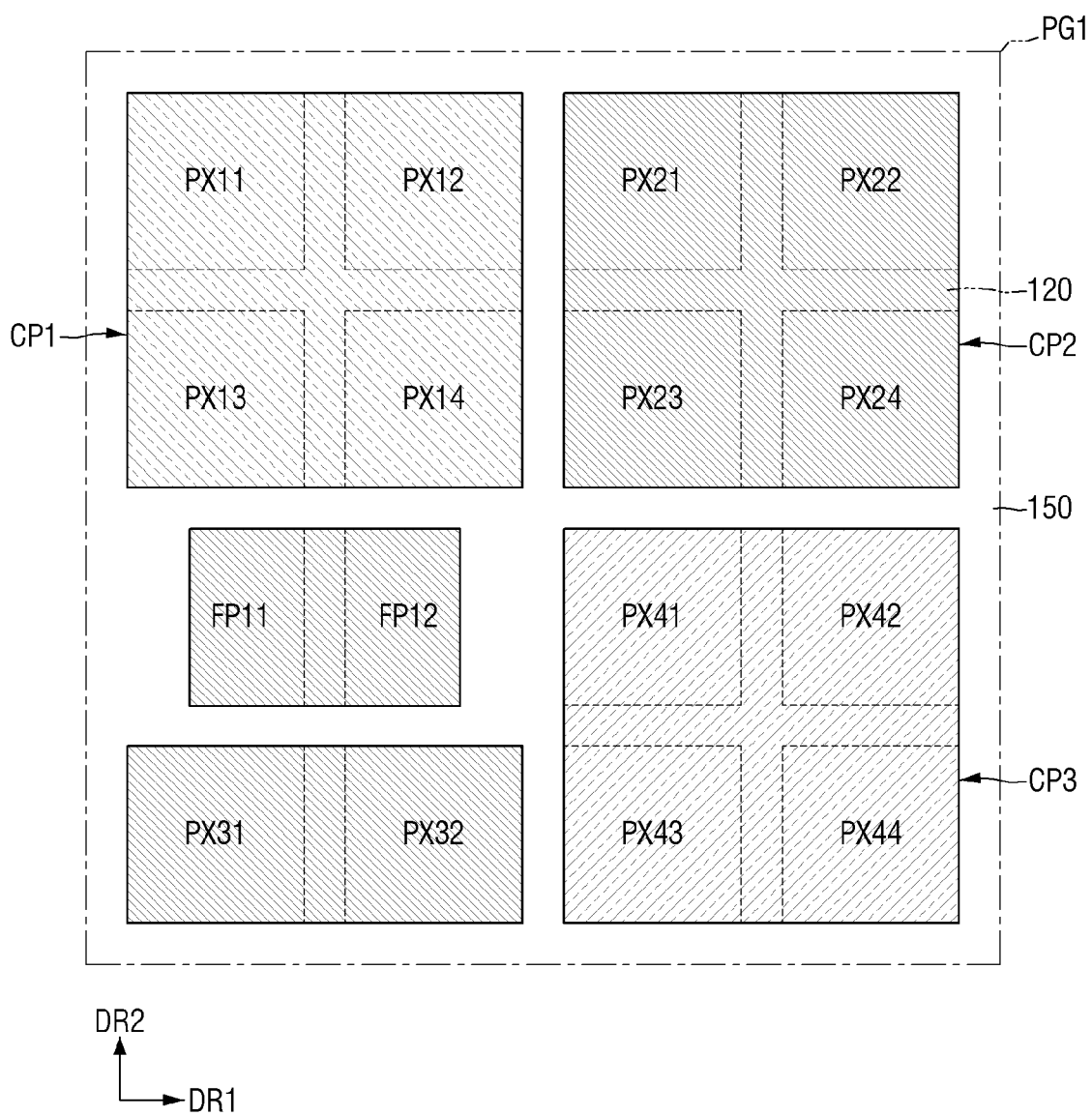
FIG. 23 is an exemplary partial layout diagram for describing a third pixel group disposed in a first region of FIG. 3, according to an embodiment.

FIG. 23 is an exemplary partial layout diagram for describing a first pixel group PG1 disposed in a first region of FIG. 3.

Referring to FIG. 23, a third merged pixel PX31 and PX32 may include third unit pixels PX31 and PX32 arranged in one row and two columns. The third merged pixel PX31 and PX32, first focus pixels FP11 and FP12, and a first merged pixel PX11 to PX14 may be continuously arranged along the second direction DR2.

A fourth merged pixel PX41 to PX44 may include fourth unit pixels PX41 to PX44 arranged in two rows and two columns. The first focus pixels FP11 and FP12 and the third merged pixel PX31 and PX32, and the fourth merged pixel PX41 to PX44 may be continuously arranged along the first direction DR1.

In embodiments, the first focus pixels FP11 and FP12 may also be disposed at positions of the third merged pixel PX31 and PX32 in FIG. 23, and the third merged pixel PX31 and PX32 may also be disposed at positions of the first focus pixels FP11 and FP12 in FIG. 23.

In some exemplary embodiments, a first color filter CP1, a second color filter CP2, and a third color filter CP3 may filter different colors. As an example, the first color filter CP1 may include a red color filter, the second color filter CP2 may include a yellow color filter, and the third color filter CP3 may include a blue color filter.

As another example, the first color filter CP1 may include a red color filter, the second color filter CP2 may include a yellow color filter, and the third color filter CP3 may include a cyan color filter.

As another example, the first color filter CP1 may include a magenta color filter, the second color filter CP2 may include a yellow color filter, and the third color filter CP3 may include a cyan color filter.

In some exemplary embodiments, the first focus pixels FP11 and FP12 may share one color filter with each other, and the color filter may depend on positions where the first focus pixels FP11 and FP12 are disposed. As an example, the first focus pixels FP11 and FP12 may be disposed at a position overlapping the second color filter CP2. As another example, the first focus pixels FP11 and FP12 may be disposed a position overlapping the second color filter CP2 or the third color filter CP3.

Figure 24:
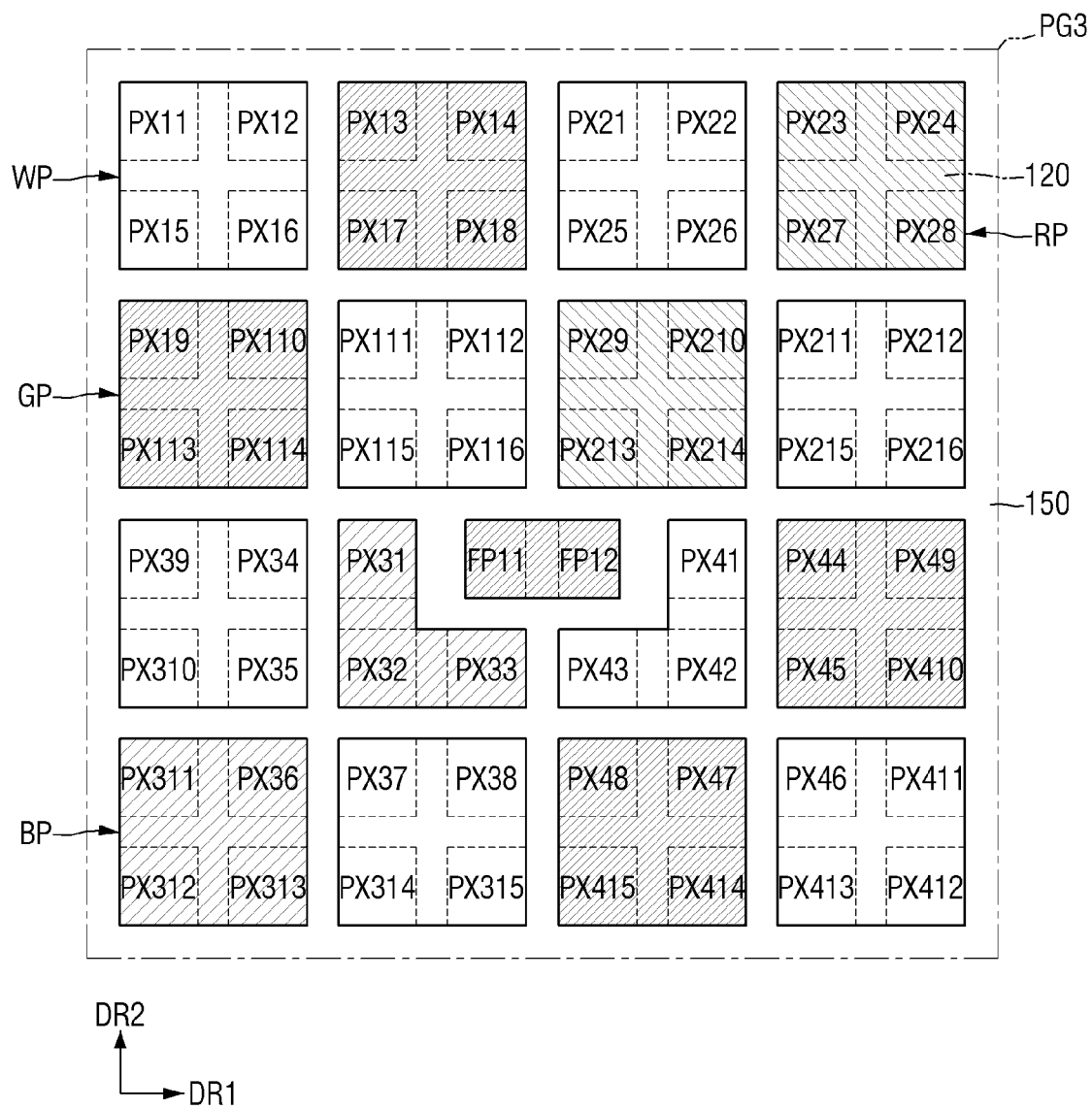
FIGS. 24 and 25 are exemplary partial layout diagrams for describing a third pixel group disposed in a first region of FIG. 3, according to an embodiment.
Figure 25:
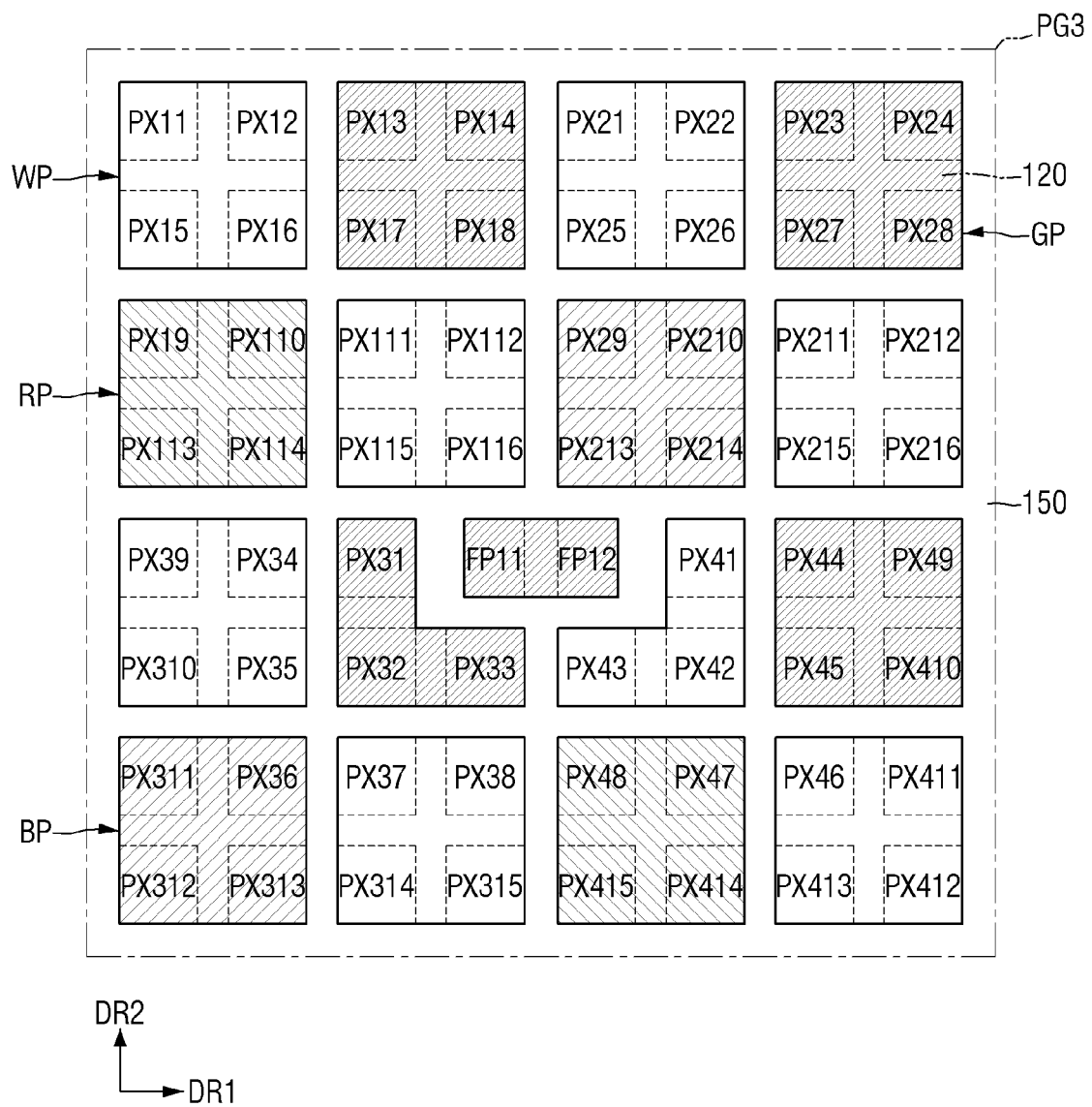

FIGS. 24 and 25 are exemplary partial layout diagrams for describing a third pixel group disposed in a first region of FIG. 3. For convenience of explanation, portions overlapping those described above with reference to FIG. 20 will be briefly described or a description thereof will be omitted.

Referring to FIG. 24, in some exemplary embodiments, the grid pattern 150 may separate a color filter on first focus pixels FP11 and FP12 from neighboring color filters, may not be disposed between the same color filters, and may be disposed between different color filters.

For example, on first unit pixels PX11 to PX116 and fourth unit pixels PX41 to PX415, second color filters GP may be disposed in a diagonal direction between the first direction DR1 and the second direction DR2 and white color filters WP may be disposed in an opposite diagonal direction to the diagonal direction in the second direction DR2. On second unit pixels PX21 to PX216, first color filters RP may be disposed in the diagonal direction and white color filters WP may be disposed in the opposite diagonal direction. On third unit pixels PX31 to PX315, third color filters BP may be disposed in the diagonal direction and white color filters WP may be disposed in the opposite diagonal direction.

Referring to FIG. 25, on first unit pixels PX11 to PX116 and fourth unit pixels PX41 to PX415, white color filters WP may be disposed on the opposite diagonal direction and first color filters RP and second color filters GP may be disposed in the diagonal direction, respectively. On second unit pixels PX21 to PX216 and third unit pixels PX31 to PX315, white color filters WP may be disposed on the opposite diagonal direction and third color filters BP and second color filters GP may be disposed in the diagonal direction, respectively.

Figure 26:
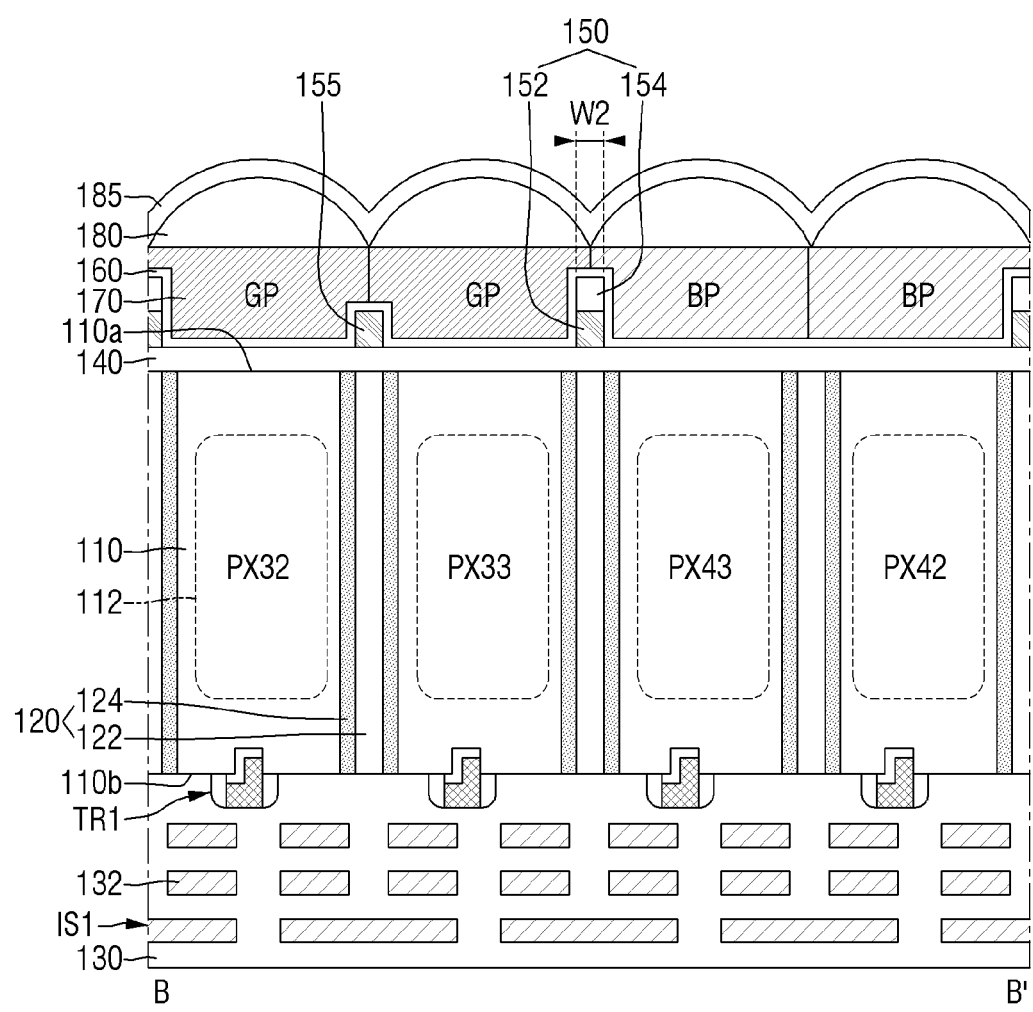
FIGS. 26 and 27 are cross-sectional views for describing an image sensor according to an embodiment.
Figure 27:
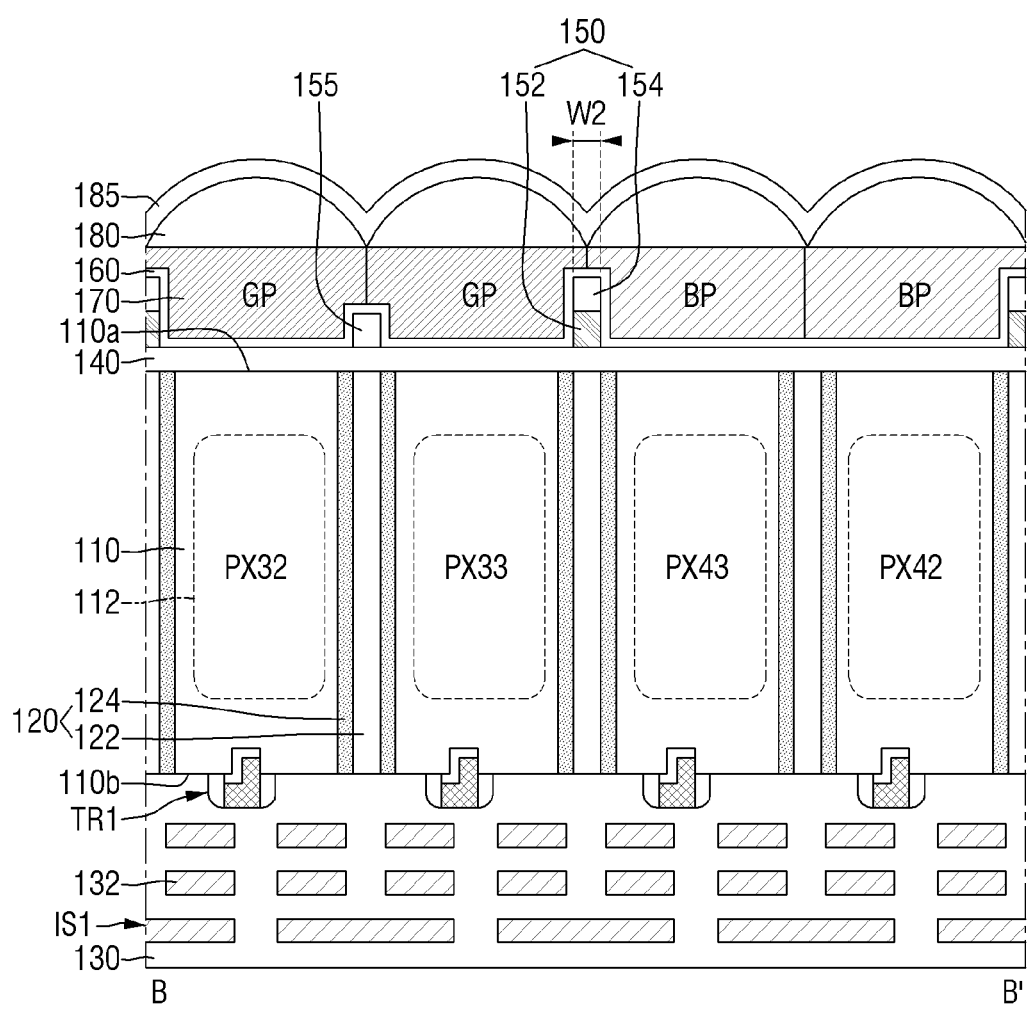

FIGS. 26 and 27 are cross-sectional views for describing an image sensor according to some exemplary embodiments. For reference, FIGS. 26 and 27 are cross-sectional views taken along line B-B' of FIG. 4A. For convenience of explanation, portions overlapping those described above with reference to FIGS. 1 to 5 will be briefly described or a description thereof will be omitted.

Referring to FIGS. 26 and 27, the image sensor according to some exemplary embodiments may further include a sub-grid pattern 155. The sub-grid pattern 155 may be disposed on at least a portion of one merged pixel sharing one color filter.

For example, the sub-grid pattern 155 may be disposed on the first pixel separation pattern 120 between the third-second unit pixel PX32 and the third-third unit pixel PX33. A lower portion of the color filter 170 on the third-second unit pixel PX32 and a lower portion of the color filter 170 on the third-third unit pixel PX33 may be separated by the sub-grid pattern 155.

In some exemplary embodiments, the sub-grid pattern 155 may have a height smaller than that of the grid pattern 150. An upper surface of the sub-grid pattern 155 may be disposed on a level below an upper surface of the grid pattern 150.

Referring to FIG. 26, in some exemplary embodiments, the sub-grid pattern 155 may include the same material as the metal pattern 152.

Referring to FIG. 27, in some exemplary embodiments, the sub-grid pattern 155 may include the same material as the low refractive index pattern 154.

Figure 28:
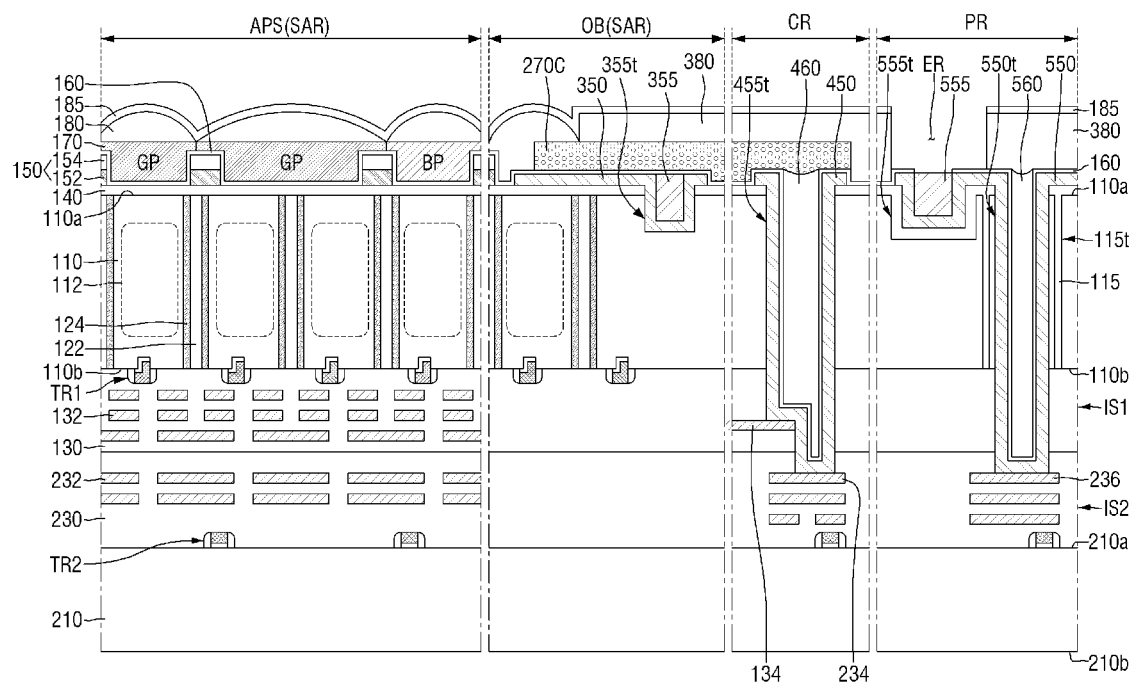
FIG. 28 is a schematic cross-sectional view for describing an image sensor according to an embodiment.

FIG. 28 is a schematic cross-sectional view for describing an image sensor according to some exemplary embodiments. For convenience of explanation, portions overlapping those described above with reference to FIGS. 1 to 5 will be briefly described or a description thereof will be omitted.

Referring to FIG. 28, the image sensor according to some exemplary embodiments may include a sensor array region SAR, a connection region CR, and a pad region PR. The sensor array region SAR, the connection region CR, and the pad region PR may be the sensor array region SAR, the connection region CR, and the pad region PR of FIG. 2, respectively. FIG. 27 illustrates an example cross-sectional view of FIG. 5A as a cross-sectional view of the sensor array region SAR.

In some exemplary embodiments, the first interconnection structure IS1 may include first wirings 132 in the sensor array region SAR and second wirings 134 in the connection region CR. The first wirings 132 may be electrically connected to pixels of the sensor array region SAR. For example, the first wirings 132 may be connected to the first electronic elements TR1. At least some of the second wirings 134 may be electrically connected to at least some of the first wirings 132. For example, at least some of the second wirings 134 may extend from the sensor array region SAR. Accordingly, the second wirings 134 may be electrically connected to the pixels of the sensor array region SAR.

The image sensor according to some exemplary embodiments may further include a second substrate 210, a second interconnection structure IS2, a first connection structure 350, a second connection structure 450, a third connection structure 550, an element isolation pattern 115, a light blocking filter 270C, and a third passivation film 380.

The second substrate 210 may be bulk silicon or silicon-on-insulator (SOI). The second substrate 210 may be a silicon substrate or may include other materials, for example, silicon germanium, indium antimonide, lead tellurium compound, indium arsenide, indium phosphide, gallium arsenide, or gallium antimonide. In embodiments, the second substrate 210 may be a substrate in which an epitaxial layer is formed on a base substrate.

The second substrate 210 may have a third surface 210a and a fourth surface 210b that are opposite to each other. In some exemplary embodiments, the third surface 210a of the second substrate 210 may face the second surface 110b of the first substrate 110.

In some exemplary embodiments, second electronic elements TR2 may be formed on the third surface 210a of the second substrate 210. The second electronic elements TR2 may be electrically connected to the sensor array region SAR to transmit/receive electrical signals to/from the respective pixels of the sensor array region SAR. For example, the second electronic element TR2 may include electronic elements included in the control register block 11, the timing generator 12, the ramp signal generator 13, the row driver 14, the readout circuit 16, and the like, of FIG. 1.

The second interconnection structure IS2 may be formed on the third surface 210a of the second substrate 210. The second interconnection structure IS2 may be attached to the first interconnection structure IS1. For example, as illustrated in FIG. 28, an upper surface of the second interconnection structure IS2 may be attached to a lower surface of the first interconnection structure IS1.

The second interconnection structure IS2 may include one or a plurality of wirings. For example, the second interconnection structure IS2 may include a second inter-wiring insulating film 230 and a plurality of wirings 232, 234, and 236 in the second inter-wiring insulating film 230. In FIG. 28, the number of layers, a disposition, and the like, of the wirings included in the second interconnection structure IS2 are only an example, and are not limited thereto.

At least some of the wirings 232, 234, and 236 of the second interconnection structure IS2 may be connected to the second electronic elements TR2. In some exemplary embodiments, the second interconnection structure IS2 may include third wirings 232 in the sensor array region SAR, fourth wirings 234 in the connection region CR, and fifth wirings 236 in the pad region PR. In some exemplary embodiments, the fourth wiring 234 may be the uppermost wiring of a plurality of wirings in the connection region CR, and the fifth wiring 236 may be the uppermost wiring of the plurality of wrings in the pad region PR.

The first connection structure 350 may be formed in the light blocking region OB. The first connection structure 350 may be formed on the surface insulating film 140 of the light blocking region OB. In some exemplary embodiments, the first connection structure 350 may be in contact with the first pixel separation pattern 120. For example, a first trench 355t exposing the first pixel separation pattern 120 may be formed in the first substrate 110 and the surface insulating film 140 of the light blocking region OB. The first connection structure 350 may be formed in the first trench 355t to be in contact with the first pixel separation pattern 120 in the light blocking region OB. In some exemplary embodiments, the first connection structure 350 may extend along profiles of side surfaces and a lower surface of the first trench 355t.

In some exemplary embodiments, the first connection structure 350 may be electrically connected to the conductive filling pattern 122 to apply a ground voltage or a negative voltage to the conductive filling pattern 122. Accordingly, electric charges generated by ESD or the like may be discharged to the first connection structure 350 through the conductive filling pattern 122, and an ESD bruise defect may be effectively prevented.

The second connection structure 450 may be formed in the connection region CR. The second connection structure 450 may be formed on the surface insulating film 140 of the connection region CR. The second connection structure 450 may electrically connect the first substrate 110 and the second substrate 210 to each other. For example, a second trench 455t exposing the second wiring 134 and the fourth wiring 234 may be formed in the first substrate 110, the first interconnection structure IS1, and the second interconnection structure IS2 of the connection region CR. The second connection structure 450 may be formed in the second trench 455t to connect the second wiring 134 and the fourth wiring 234 to each other. In some exemplary embodiments, the second connection structure 450 may extend along profiles of side surfaces and a lower surface of the second trench 455t.

The third connection structure 550 may be formed in the pad region PR. The third connection structure 550 may be formed on the surface insulating film 140 of the pad region PR. The third connection structure 550 may electrically connect the second substrate 210 to an external device or the like.

For example, a third trench 550t exposing the fifth wiring 236 may be formed in the first substrate 110, the first interconnection structure IS1, and the second interconnection structure IS2 of the pad region PR. The third connection structure 550 may be formed in the third trench 550t to be in contact with the fifth wiring 236. In addition, a fourth trench 555t may be formed in the first substrate 110 of the pad region PR. The third connection structure 550 may be formed and exposed in the fourth trench 555t. In some exemplary embodiments, the third connection structure 550 may extend along profiles of side surfaces and lower surfaces of the third trench 550t and the fourth trench 555t.

Each of the first connection structure 350, the second connection structure 450, and the third connection structure 550 may include, for example, at least one of titanium (Ti), titanium nitride (TiN), tantalum (Ta), tantalum nitride (TaN), tungsten (W), aluminum (Al), copper (Cu), and combinations thereof, but is not limited thereto. In some exemplary embodiments, the first connection structure 350, the second connection structure 450, and the third connection structure 550 may be formed on the same level as each other. In embodiments, the term "same level" may refer to formation by the same manufacturing process.

In some exemplary embodiments, a first pad 355 filling the first trench 355t may be formed on the first connection structure 350. In some exemplary embodiments, a second pad 555 filling the fourth trench 555t may be formed on the third connection structure 550. Each of the first pad 355 and the second pad 555 may include, for example, at least one of tungsten (W), copper (Cu), aluminum (Al), gold (Au), silver (Ag), and alloys thereof, but is not limited thereto. In some exemplary embodiments, the first pad 355 and the second pad 555 may be formed on the same level as each other.

In some exemplary embodiments, a first filling insulating film 460 filling the second trench 455t may be formed on the second connection structure 450. In some exemplary embodiments, a second filling insulating film 560 filling the third trench 550t may be formed on the third connection structure 550. Each of the first filling insulating film 460 and the second filling insulating film 560 may include, for example, at least one of silicon oxide, aluminum oxide, tantalum oxide, and combinations thereof, but is not limited thereto. In some exemplary embodiments, the first filling insulating film 460 and the second filling insulating film 560 may be formed on the same level as each other.

In some exemplary embodiments, the first passivation film 160 may cover the first connection structure 350, the first pad 355, the second connection structure 450, and the third connection structure 550. For example, the first passivation film 160 may conformally extend along profiles of the first connection structure 350, the first pad 355, the second connection structure 450, and the third connection structure 550. In some exemplary embodiments, the first passivation film 160 may expose the second pad 555.

The element isolation pattern 115 may be formed in the first substrate 110. For example, an element isolation trench 115t may be formed in the first substrate 110. The element isolation pattern 115 may be formed in the element isolation trench 115t. In some exemplary embodiments, the element isolation pattern 115 may extend from the first surface 110a of the first substrate 110 to the second surface 110b of the first substrate 110. In some exemplary embodiments, the element isolation pattern 115 may be spaced apart from the second surface 110b of the first substrate 110.

Figure 29:
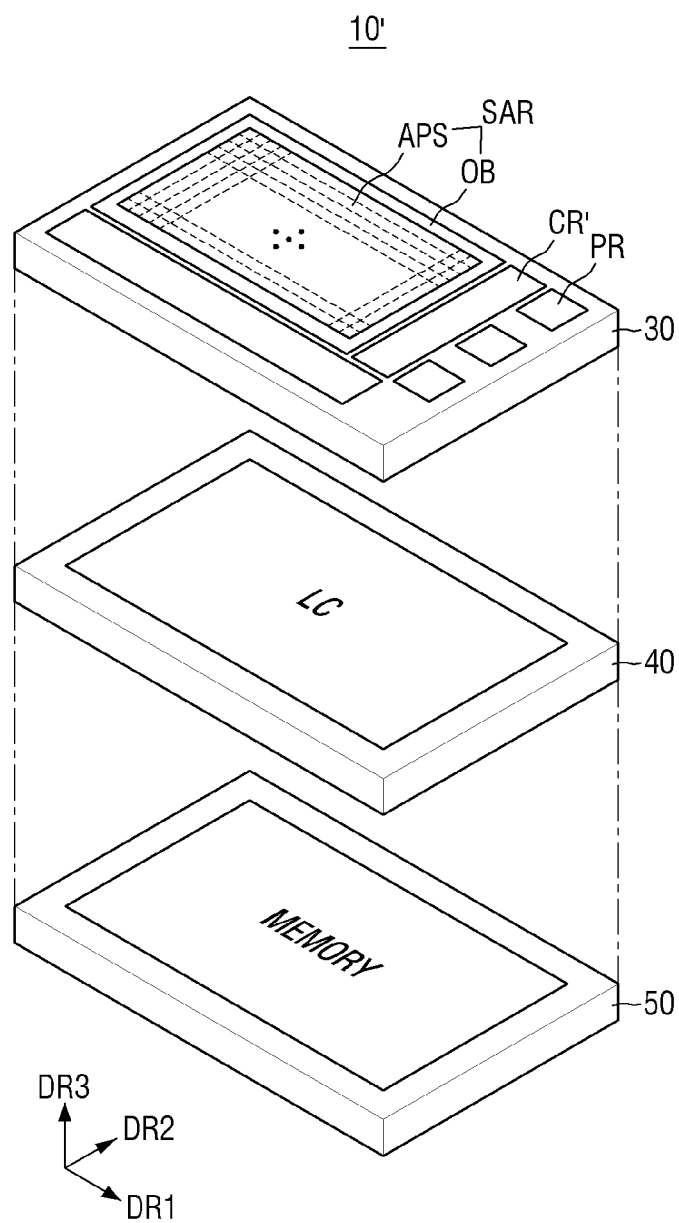
FIG. 29 is a block diagram for describing an image sensor according to an embodiment.

FIG. 29 is a block diagram for describing an image sensor according to some exemplary embodiments. For convenience of explanation, portions different from those described with reference to FIG. 2 will be mainly described.

Referring to FIG. 29, an image sensor 10' may further include a memory chip 50. The memory chip 50, the second chip 40, and the first chip 30 may be sequentially stacked in the third direction DR3. The memory chip 50 may include a memory device. For example, the memory chip 50 may include a volatile memory device such as a dynamic random access memory (DRAM) or a static random access memory (SRAM). The memory chip 50 may receive signals from the first chip 30 and the second chip 40 and process the signals through the memory device.

Figure 30:
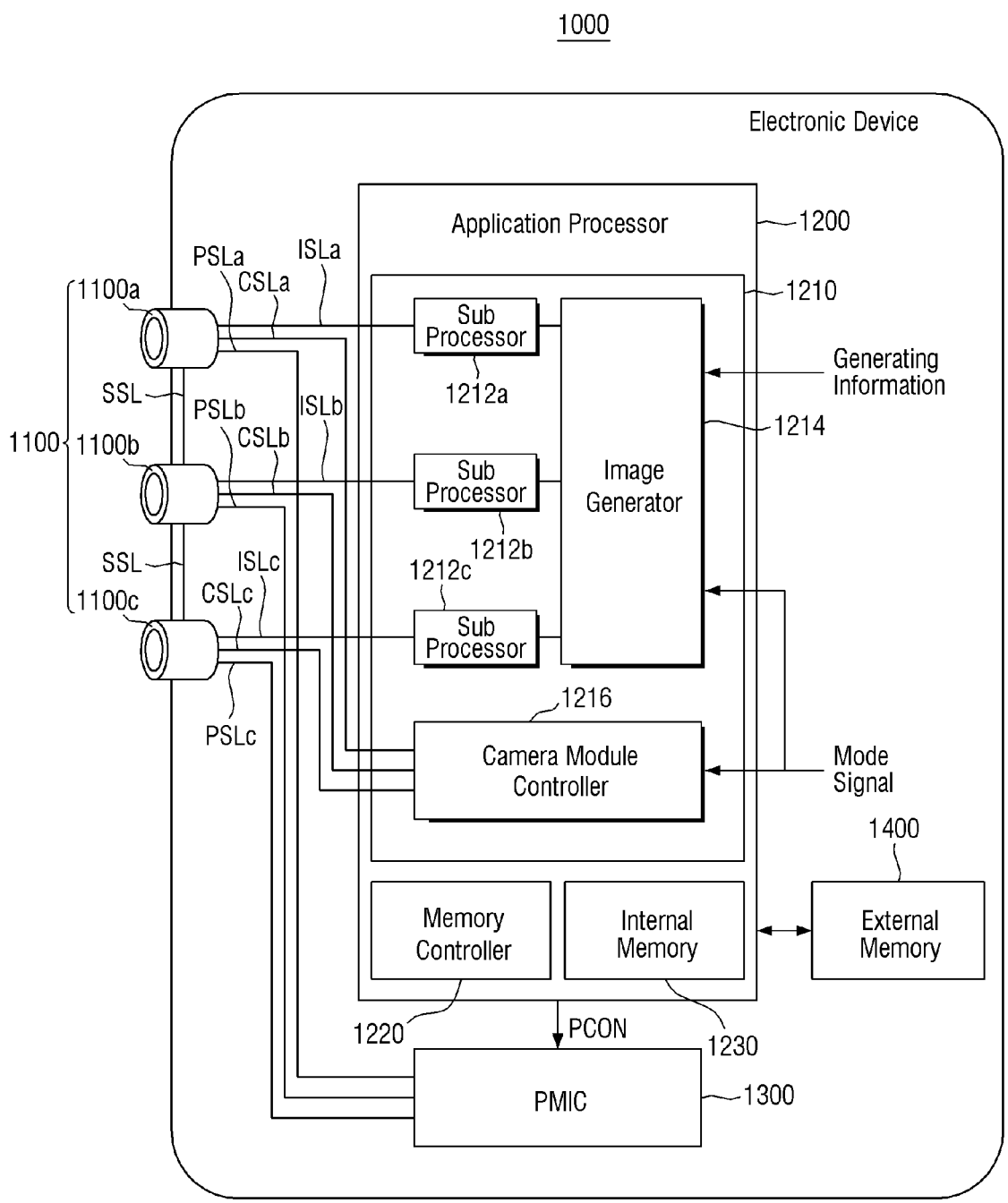
FIG. 30 is a block diagram of an electronic device including a multi-camera module, according to an embodiment.
Figure 31:
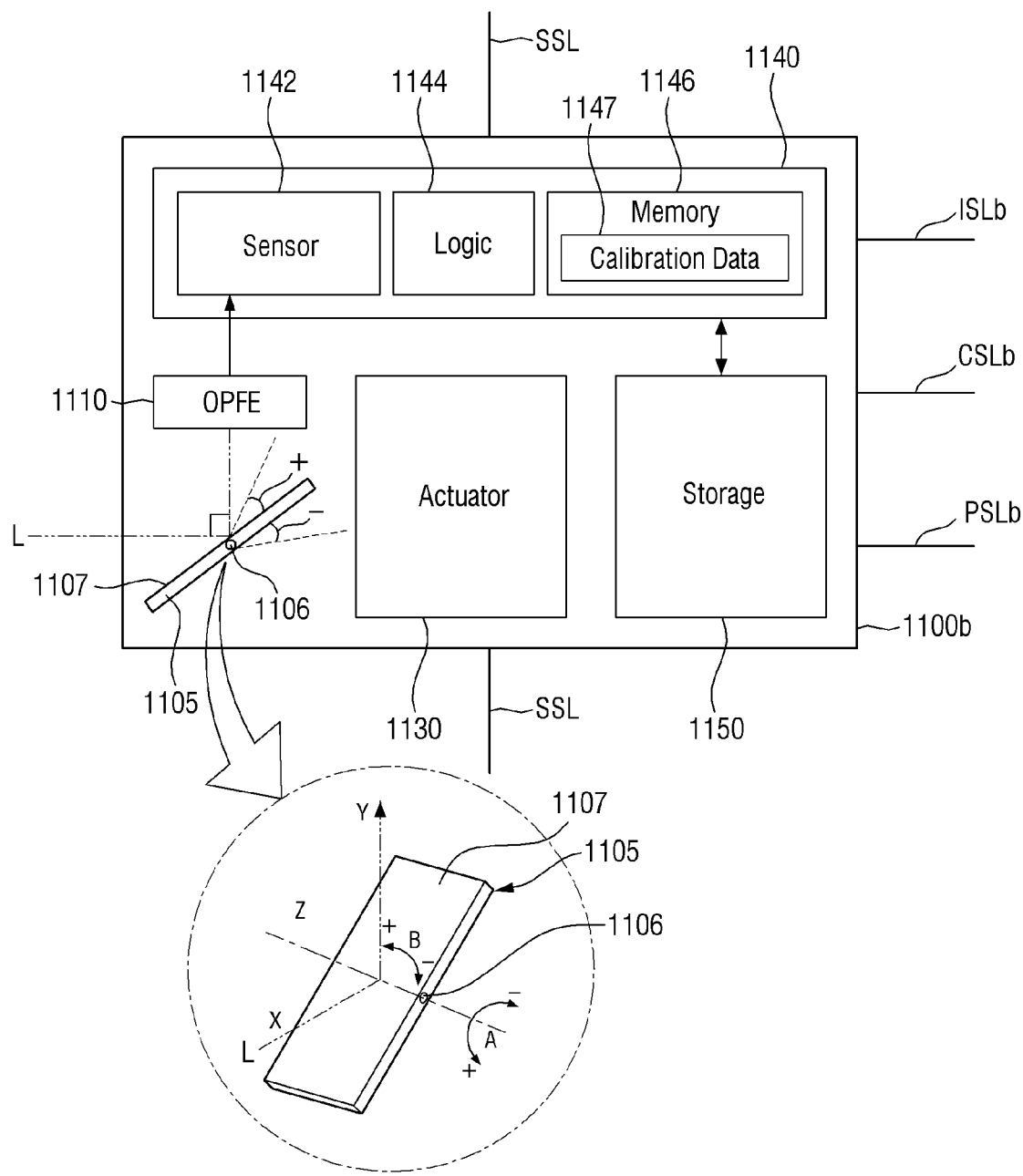
FIG. 31 is a detailed block diagram of the camera module of FIG. 30, according to an embodiment.

FIG. 30 is a block diagram of an electronic device including a multi-camera module. FIG. 31 is a detailed block diagram of the camera module of FIG. 30.

Referring to FIG. 30, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although an exemplary embodiment in which three camera modules 1100a, 1100b, and 1100c are disposed has been illustrated in FIG. 30, exemplary embodiments are not limited thereto. In some exemplary embodiments, the camera module group 1100 may be modified to include only two camera modules. In addition, in some exemplary embodiments, the camera module group 1100 may be modified to include n (where n may be a natural number of 4 or more) camera modules.

Hereinafter, a detailed configuration of the camera module 1100b will be described in more detail with reference to FIG. 31, but the following description may be similarly applied to the other camera modules 1100a and 1100c according to an exemplary embodiment.

Referring to FIG. 31, the camera module 1100b may include a prism 1105, an optical path folding element (hereinafter, referred to as an "OPFE") 1110, an actuator 1130, an image sensing device 1140, and a storage 1150.

The prism 1105 may include a reflective surface 1107 made of a light reflective material to change a path of light L incident from the outside.

In some exemplary embodiments, the prism 1105 may change a path of the light L incident in a first direction X to a second direction Y perpendicular to the first direction X. In addition, the prism 1105 may rotate the reflective surface 1107 made of the light reflective material in an A direction about a central shaft 1106 or rotate the central shaft 1106 in a B direction to change the path of the light L incident in the first direction X to the second vertical direction Y. In this case, the OPFE 1110 may also move in a third direction Z perpendicular to the first direction X and the second direction Y.

In some exemplary embodiments, as illustrated in FIG. 31, a maximum rotation angle of the prism 1105 in the A direction may be 15 degrees or less in a positive (+) A direction and greater than 15 degrees in a negative (−) A direction, but exemplary embodiments are not limited thereto.

In some exemplary embodiments, the prism 1105 may move by about 20 degrees, between 10 degrees and 20 degrees, or between 15 degrees and 20 degrees in a positive (+) or negative (−) B direction. Here, the prism 1105 may move by the same angle in the positive (+) or negative (−) B direction or may move by a substantially similar angle in the range of about 1 degree.

In some exemplary embodiments, the prism 1105 may move the reflective surface 1107 made of the light reflective material in the third direction (e.g., the Z direction) parallel to an extension direction of the central shaft 1106.

The OPFE 1110 may include, for example, optical lenses consisting of m (here, m is a natural number) groups. The m optical lenses may move in the second direction Y to change an optical zoom ratio of the camera module 1100b. For example, when a basic optical zoom ratio of the camera module 1100b is Z, in a case where the m optical lenses included in the OPFE 1110 are moved, the optical zoom ratio of the camera module 1100b may be changed to an optical zoom ratio of 3Z, 5Z, or 5Z or more.

The actuator 1130 may move the OPFE 1110 or the optical lenses (hereinafter, referred to as an optical lens) to a specific position. For example, the actuator 1130 may adjust a position of the optical lens so that an image sensor 1142 is positioned at a focal length of the optical lens for accurate sensing.

The image sensing device 1140 may include the image sensor 1142, a control logic 1144, and a memory 1146. The image sensor 1142 may sense an image of a target to be sensed using the light L provided through the optical lens. The control logic 1144 may control a general operation of the camera module 1100b. For example, the control logic 1144 may control an operation of the camera module 1100b according to a control signal provided through a control signal line CSLb.

The memory 1146 may store information necessary for the operation of the camera module 1100b, such as calibration data 1147. The calibration data 1147 may include information necessary for the camera module 1100b to generate image data using the light L provided from the outside. The calibration data 1147 may include, for example, information on the degree of rotation, information on the focal length, and information on the optical axis, described above. When the camera module 1100b is implemented in the form of a multi-state camera of which a focal length is changed according to the position of the optical lens, the calibration data 1147 may include focal length values and information related to auto focusing for each position (or state) of the optical lens.

The storage 1150 may store image data sensed by the image sensor 1142. The storage 1150 may be disposed outside the image sensing device 1140, and may be implemented in a form in which it is stacked with a sensor chip included in the image sensing device 1140. In some exemplary embodiments, the storage 1150 may be implemented as an electrically erasable programmable read-only memory (EEPROM), but exemplary embodiments are not limited thereto.

Referring to FIGS. 30 and 31 together, in some exemplary embodiments, each of the plurality of camera modules 1100a, 1100b, and 1100c may include an actuator 1130. Accordingly, each of the plurality of camera modules 1100a, 1100b, and 1100c may include the same or different calibration data 1147 according to an operation of the actuator 1130 included therein.

In some exemplary embodiments, one camera module (e.g., camera module 1100b) of the plurality of camera modules 1100a, 1100b, and 1100c may be a folded lens-type camera module including the prism 1105 and the OPFE 1110 described above, and the other camera modules (e.g., camera modules 1100a and 1100c) of the plurality of camera modules 1100a, 1100b, and 1100c may be a vertical type camera module that does not include the prism 1105 and the OPFE 1110, but exemplary embodiments are limited thereto.

In some exemplary embodiments, one camera module (e.g., camera module 1100c) of the plurality of camera modules 1100a, 1100b, and 1100c may be, for example, a vertical type depth camera extracting depth information using an infrared ray (IR). In this case, the application processor 1200 may merge image data provided from such a depth camera and image data provided from another camera module (e.g., camera module 1100a or 1100b) with each other to generate a 3D depth image.

In some exemplary embodiments, at least two camera modules (e.g., camera modules 1100a and 1100b) of the plurality of camera modules 1100a, 1100b, and 1100c may have different fields of view. In this case, for example, optical lenses of at least two camera modules (e.g., two camera modules 1100a and 1100b) of the plurality of camera modules 1100a, 1100b, and 1100c may be different from each other, but the present disclosure is not limited thereto.

In addition, in some exemplary embodiments, fields of view of each of the plurality of camera modules 1100a, 1100b, and 1100c may be different from each other. In this case, the optical lenses included in each of the plurality of camera modules 1100a, 1100b, and 1100c may also be different, but the present disclosure is not limited thereto.

In some exemplary embodiments, the plurality of camera modules 1100a, 1100b, and 1100c may be disposed to be physically separated from each other. That is, a sensing region of one image sensor 1142 is not used in a divided manner by the plurality of camera modules 1100a, 1100b, and 1100c, and an independent image sensor 1142 may be disposed inside each of the plurality of camera modules 1100a, 1100b, and 1100c.

Referring to FIG. 30 again, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented as separate semiconductor chips so as to be separated from each other.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c corresponding to the number of the plurality of camera modules 1100a, 1100b, and 1100c.

The image data generated from the respective camera modules 1100a, 1100b, and 1100c may be provided to the corresponding sub image processors 1212a, 1212b, and 1212c through image signal lines ISLa, ISLb, and ISLc separated from each other. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. Transmission of such image data may be performed using, for example, a camera serial interface (CSI) based on a mobile industry processor interface (MIPI), but exemplary embodiments are not limited thereto.

In embodiments, in some exemplary embodiments, one sub image processor may be arranged to correspond to a plurality of camera modules. For example, the sub image processor 1212a and the sub image processor 1212c are not implemented to be separated from each other as illustrated in FIG. 30, but may be implemented to be integrated into one sub image processor, and the image data provided from the camera module 1100a and the camera module 1100c may be selected through a selection element (e.g., a multiplexer) and then provided to the integrated sub image processor.

The image data provided to the respective sub image processors 1212a, 1212b, and 1212c may be provided to the image generator 1214. The image generator 1214 may generate an output image using the image data provided from the respective sub image processors 1212a, 1212b, and 1212c according to image generating information illustrated as "Generating Information") or a mode signal (illustrated as "Mode Signal").

Specifically, the image generator 1214 may merge at least some of the image data generated from the camera modules 1100a, 1100b, and 1100c having different fields of view with each other according to the image generating information or the mode signal to generate an output image. In addition, the image generator 1214 may select any one of the image data generated from the camera modules 1100a, 1100b, and 1100c having different fields of view according to the image generating information or the mode signal to generate an output image.

In some exemplary embodiments, the image generating information may include a zoom signal or a zoom factor. In addition, in some exemplary embodiments, the mode signal may be, for example, a signal based on a mode selected by a user.

When the image generating information is the zoom signal (zoom factor) and the camera modules 1100a, 1100b, and 1100c has different fields of view, the image generator 1214 may perform different operations according to a type of the zoom signal. For example, when the zoom signal is a first signal, the image generator 1214 may merge the image data output from the camera module 1100a and the image data output from the camera module 1100c with each other, and then generate an output image by using a merged image signal and the image data output from the camera module 1100b that is not used for the merging. When the zoom signal is a second signal different from the first signal, the image generator 1214 does not perform such merging of the image data, and may select any one of the image data output from the respective camera modules 1100a, 1100b, and 1100c to generate an output image. However, exemplary embodiments are not limited thereto, and a method of processing the image data may be modified, if necessary.

In some exemplary embodiments, the image generator 1214 may receive a plurality of pieces of image data having different exposure times from at least one of the plurality of sub image processors 1212a, 1212b, and 1212c and perform high dynamic range (HDR) processing on the plurality of pieces of image data to generate merged image data having an increased dynamic range.

The camera module controller 1216 may provide control signals to the respective camera modules 1100a, 1100b, and 1100c. The control signals generated from the camera module controller 1216 may be provided to the corresponding camera modules 1100a, 1100b, and 1100c through control signal lines CSLa, CSLb, and CSLc separated from each other.

Any one of the plurality of camera modules 1100a, 1100b, and 1100c may be designated as a master camera (e.g., camera module 1100b) according to the image generating information including the zoom signal or the mode signal, and the other camera modules (e.g., camera modules 1100a and 1100c) may be designated as slave cameras. Such information may be included in the control signals and provided to the corresponding camera modules 1100a, 1100b, and 1100c through the control signal lines CSLa, CSLb, and CSLc separated from each other.

The camera modules operating as a master camera and a slave camera may be changed according to the zoom factor or the mode signal. For example, when a field of view of the camera module 1100a is wider than a field of view of the camera module 1100b and the zoom factor indicates a low zoom ratio, the camera module 1100b may operate as a master camera, and the camera module 1100a may operate as a slave camera. On the contrary, when the zoom factor indicates a high zoom ratio, the camera module 1100a may operate as a master camera and the camera module 1100b may operate as a slave camera.

In some exemplary embodiments, the control signals provided from the camera module controller 1216 to the respective camera modules 1100a, 1100b, and 1100c may include a sync enable signal. For example, when the camera module 1100b is the master camera and the camera modules 1100a and 1100c are the slave cameras, the camera module controller 1216 may transmit the sync enable signal to the camera module 1100b. The camera module 1100b receiving such a sync enable signal may generate a sync signal based on the received sync enable signal, and transmit the generated sync signal to the camera modules 1100a and 1100c through sync signal lines SSL. The camera module 1100b and the camera modules 1100a and 1100c may transmit the image data to the application processor 1200 in synchronization with such a sync signal.

In some exemplary embodiments, the control signals provided from the camera module controller 1216 to the respective camera modules 1100a, 1100b, and 1100c may include mode information according to the mode signal The plurality of camera modules 1100a, 1100b, and 1100c may operate in a first operation mode and a second operation mode in relation to a sensing speed, based on such mode information.

The plurality of camera modules 1100a, 1100b, and 1100c may generate an image signal at a first speed (e.g., generate an image signal of a first frame rate), encode the image signal at a second speed higher than the first speed (e.g., encode an image signal of a second frame rate higher than the first frame rate), and transmit the encoded image signal to the application processor 1200, in the first operation mode. In this case, the second speed may be less than or equal to 30 times the first speed.

The application processor 1200 may store the received image signal, that is, the encoded image signal, in the internal memory 1230 or the external memory 1400 outside the application processor 1200, then read and decode the encoded image signal from the internal memory 1230 or the external memory 1400, and display image data generated based on the decoded image signal. For example, a corresponding sub image processor of the plurality of sub image processors 1212a, 1212b, and 1212c of the image processing device 1210 may perform the decoding, and may also perform image processing on the decoded image signal.

The plurality of camera modules 1100a, 1100b, and 1100c may generate an image signal at a third speed lower than the first speed (for example, generate an image signal of a third frame rate lower than the first frame rate) and transmit the image signal to the application processor 1200, in the second operation mode. The image signal provided to the application processor 1200 may be a signal that is not encoded. The application processor 1200 may perform image processing on the received image signal or store the image signal in the internal memory 1230 or the external memory 1400.

The PMIC 1300 may supply power, for example, a source voltage, to each of the plurality of camera modules 1100a, 1100b, and 1100c. For example, the PMIC 1300 may supply first power to the camera module 1100a through a power signal line PSLa, supply second power to the camera module 1100b through a power signal line PSLb, and supply third power to the camera module 1100c through a power signal line PSLc, under the control of the application processor 1200.

The PMIC 1300 may generate power corresponding to each of the plurality of camera modules 1100a, 1100b, and 1100c in response to a power control signal PCON from the application processor 1200, and adjust levels of the power. The power control signal PCON may include a power adjustment signal for each operation mode of the plurality of camera modules 1100a, 1100b, and 1100c. For example, the operation mode may include a low power mode, and in this case, the power control signal PCON may include information on a camera module operating in the low power mode and a set power level. Levels of the power provided to each of the plurality of camera modules 1100a, 1100b, and 1100c may be the same as or different from each other. In addition, the level of power may be dynamically changed.

Exemplary embodiments the present disclosure have been described hereinabove with reference to the accompanying drawings, but the present disclosure is not limited to the above-described exemplary embodiments, and may be implemented in various different forms, and one of ordinary skill in the art to which the present disclosure pertains may understand that the present disclosure may be implemented in other specific forms without changing the technical spirit or essential features of the present disclosure. Therefore, it is to be understood that the exemplary embodiments described above are illustrative rather than being restrictive in all aspects.

What is claimed is:

1. An image sensor comprising:
   a substrate having a first surface, and a second surface opposite to the first surface;
   a first focus pixel including a first-first sub-pixel and a first-second sub-pixel arranged continuously with the first-first sub-pixel along a first direction in the substrate;
   a first merged pixel including a first-first unit pixel, a first-second unit pixel arranged continuously with the first-first unit pixel along the first direction, and a first-third unit pixel arranged continuously with the first-first unit pixel along a second direction perpendicular to the first direction, in the substrate;
   a second merged pixel including a second-first unit pixel arranged continuously with the first-second unit pixel along the first direction, a second-second unit pixel arranged continuously to the second-first unit pixel along the first direction, and a second-third unit pixel arranged continuously to the second-second unit pixel along the second direction, in the substrate;

a first color filter disposed on the first surface of the substrate and overlapping the first focus pixel;

a second color filter disposed on the first surface of the substrate and overlapping the first-first unit pixel, the first-second unit pixel, and the first-third unit pixel;

a third color filter disposed on the first surface of the substrate and overlapping the second-first unit pixel, the second-second unit pixel, and the second-third unit pixel;

a grid pattern disposed on the first surface of the substrate and separating the first to third color filters, but not overlapped by the first to third color filters;

a first micro-lens disposed on the first color filter, and covering the first-first sub-pixel and the first-second sub-pixel; and a second micro-lens disposed on the second and third color filters, and covering the first-first unit pixel, the first-second unit pixel, the first-third unit pixel, the second-first unit pixel, the second-second unit pixel, and the second-third unit pixel, wherein the first-third unit pixel, the first focus pixel, and the second-third unit pixel are continuously arranged along the first direction, and wherein a width of the grid pattern between the first color filter and the second color filter is greater than a width of the grid pattern between the second color filter and the third color filter.

2. The image sensor of claim 1, wherein a color of the first color filter is same as a color of the second color filter, and is different from a color of the third color filter.

3. The image sensor of claim 1, wherein the first to third color filters have a same color.

4. The image sensor of claim 1, further comprising:

a third merged pixel including a third-first unit pixel arranged continuously with the first-third unit pixel along the second direction, a third-second unit pixel arranged continuously with the third-first unit pixel along the second direction, a third-third unit pixel arranged continuously with the third-first unit pixel along the first direction, and a third-fourth unit pixel arranged continuously with the third-third unit pixel along the second direction, in the substrate;

a fourth merged pixel including fourth-first pixel arranged continuously with the second-third unit pixel along the second direction, a fourth-second unit pixel arranged continuously to the fourth-first unit pixel along the second direction, a fourth-third unit pixel arranged continuously with the fourth-second unit pixel along the first direction, and a fourth-fourth unit pixel arranged continuously with the fourth-third unit pixel along the second direction, in the substrate;

a fourth color filter disposed on the first surface of the substrate and overlapping the third merged pixel;

a fifth color filter disposed on the first surface of the substrate and overlapping the fourth merged pixel; and a third micro-lens disposed on the fourth and fifth color filters and covering the third-first unit pixel, the third-second unit pixel, the third-third unit pixel, the third-fourth unit pixel, the fourth-first unit pixel, the fourth-second unit pixel, the fourth-third unit pixel, and the fourth-fourth unit pixels, wherein the grid pattern separates the first to fifth color filters, but is not overlapped by the fourth and fifth color filters.

5. The image sensor of claim 4, wherein a color of the first color filter is same as a color of the second and a color of the fifth color filter, and wherein a color of the third color filter is different from a color of the first color filter and a color of the fourth color filter.

6. The image sensor of claim 4, wherein the first to fifth color filters have a same color.

7. The image sensor of claim 4, wherein a color of the first color filter is different from a color of the second color filter, and wherein the second to fifth color filters have a same color.

8. The image sensor of claim 4, further comprising:

a fifth merged pixel including fifth unit pixels arranged in an arrangement pattern having four rows and four columns, and arranged continuously with the second merged pixel and the fourth merged pixel along the first direction, in the substrate;

a sixth merged pixel including sixth unit pixels arranged in the arrangement pattern, and arranged continuously with the third merged pixel and the fourth merged pixel along the second direction, in the substrate;

a seventh merged pixel including seventh unit pixels arranged in the arrangement pattern, and arranged continuously with the sixth merged pixel along the first direction, in the substrate;

a sixth color filter disposed on the first surface of the substrate and overlapping the fifth merged pixel;

a seventh color filter disposed on the first surface of the substrate and overlapping the sixth merged pixel;

an eighth color filter disposed on the first surface of the substrate and overlapping the seventh merged pixel; and a fourth micro-lens disposed on the sixth to eighth color filters and covering each of the fifth to seventh unit pixels, wherein the grid pattern separates the first to eighth color filters, but is not overlapped by the sixth to eighth color filters.

9. The image sensor of claim 8, wherein a color of the first to fifth color filters is same as a color of the eighth color filter, and wherein a color of the seventh color filter is different from a color of the sixth color filter and the color of the eighth color filter.

10. The image sensor of claim 8, wherein a color of the first color filter is same as a color of the sixth and seventh color filters, wherein the second to fifth color filters have a same color, and wherein a color of the eighth color filter is different from the color of the second to fifth color filters and the color of the sixth and seventh color filters.

11. The image sensor of claim 1, further comprising a pixel separation pattern penetrating through the substrate, and separating the first-first sub-pixel, the first-second sub-pixel, the first-first unit pixel, the first-second unit pixel, the first-third unit pixel, the second-first unit pixel, the second-second unit pixel, and the second-third unit pixel, wherein the pixel separation pattern includes a conductive filling pattern penetrating through the substrate, and an insulating spacer film disposed between the conductive filling pattern and the substrate.

12. The image sensor of claim 1, further comprising a first pixel separation pattern penetrating through a portion of the substrate from the first surface of the substrate, and separating the first-first sub-pixel, the first-second sub-pixels, the first-first unit pixel, the first-second unit pixel, the first-third unit pixel, the second-first unit pixel, the second-second unit pixel, and the second-third unit pixels, and including an insulating material.

13. The image sensor of claim 12, further comprising a second pixel separation pattern penetrating through a portion of the substrate from the second surface of the substrate, and separating the first-first sub-pixel, the first-second sub-pixel, the first-first unit pixel, the first-second unit pixel, the first-third unit pixels, the second-first unit pixel, the second-second unit pixel, and the second-third unit pixel, wherein the second pixel separation pattern includes a conductive filling pattern penetrating through a portion of the substrate, and an insulating spacer film disposed between the conductive filling pattern and the substrate.

14. The image sensor of claim 13, wherein the first pixel separation pattern is spaced apart from the second pixel separation pattern.

15. The image sensor of claim 13, wherein the first pixel separation pattern is in contact with the second pixel separation pattern.

16. An image sensor comprising:
    a substrate having a first surface, and a second surface opposite to the first surface;
    a first focus pixel including a plurality of first sub-pixels;
    a first merged pixel included in the substrate, the first merged pixel including a plurality of first unit pixels;
    a second merged pixel included in the substrate, the second merged pixel including a plurality of second unit pixels;
    a first color filter disposed on the first surface of the substrate and overlapping the plurality of first unit pixels;
    a second color filter disposed on the first surface of the substrate and overlapping the plurality of second unit pixels;
    a third color filter disposed on the first surface of the substrate and overlapping the second merged pixel;
    a grid pattern disposed on the first surface of the substrate, wherein the grid pattern separates the first color filter from the second color filter, separates the first color filter from the third color filter, and separates the second color filter from the third color filter, and wherein the grid pattern is not overlapped by the first color filter, the second color filter, or the third color filters;
    a first plurality of micro-lenses disposed on the first color filter, and covering the plurality of first sub-pixels;
    a second plurality of micro-lenses disposed on the second color filter, and covering the plurality of first unit pixels; and
    a third plurality of micro-lenses disposed on the third color filter, and covering the plurality of second unit pixels,
    wherein a width of the grid pattern between the first color filter and the second color filter is greater than a width of the grid pattern between the second color filter and the third color filter.

17. The image sensor of claim 16, further comprising an interconnection structure formed on the second surface,
    wherein the interconnection structure comprises a plurality of wirings connected to at least one from among the first focus pixel, the first merged pixel, and the second merged pixel.

18. The image sensor of claim 17, wherein the plurality of wirings are configured to transmit and receive electronic signals from the at least one from among the first focus pixel, the first merged pixel, and the second merged pixel.

* * * * *